(12) United States Patent
Huang et al.

(10) Patent No.: US 12,046,676 B2
(45) Date of Patent: Jul. 23, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Yu-Lien Huang, Jhubei (TW); Yi-Shan Chen, Tainan (TW); Kuan-Da Huang, Hsinchu County (TW); Han-Yu Lin, Nantou County (TW); Li-Te Lin, Hsinchu (TW); Ming-Huan Tsai, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 317 days.

(21) Appl. No.: 17/461,779

(22) Filed: Aug. 30, 2021

(65) Prior Publication Data

US 2023/0067696 A1 Mar. 2, 2023

(51) Int. Cl.
*H01L 29/78* (2006.01)
*H01L 29/40* (2006.01)
*H01L 29/417* (2006.01)

(52) U.S. Cl.
CPC .......... *H01L 29/785* (2013.01); *H01L 29/401* (2013.01); *H01L 29/41791* (2013.01)

(58) Field of Classification Search
CPC .............. H01L 29/785; H01L 29/401; H01L 29/41791; H01L 21/823475; H01L 27/088; H01L 27/0886; H01L 21/823431
See application file for complete search history.

(56) References Cited

U.S. PATENT DOCUMENTS

| | | | |
|---|---|---|---|
| 9,607,898 B1 * | 3/2017 | Cheng | H01L 21/823431 |
| 2016/0013185 A1 * | 1/2016 | Greene | H01L 29/7853 438/157 |
| 2016/0365348 A1 * | 12/2016 | Cho | H01L 27/0922 |
| 2017/0256444 A1 * | 9/2017 | Chang | H01L 29/42372 |
| 2020/0105577 A1 * | 4/2020 | Liang | H01L 21/76843 |
| 2023/0008496 A1 * | 1/2023 | Khaderbad | H01L 29/41791 |

* cited by examiner

*Primary Examiner* — Yasser A Abdelaziz
(74) *Attorney, Agent, or Firm* — FOLEY & LARDNER LLP

(57) ABSTRACT

A semiconductor device comprising a semiconductor channel, an epitaxial structure coupled to the semiconductor channel, and a gate structure electrically coupled to the semiconductor channel. The semiconductor device further comprises a first interconnect structure electrically coupled to the epitaxial structure and a dielectric layer that contains nitrogen. The dielectric layer comprises a first portion protruding from a nitrogen-containing dielectric capping layer that overlays either the gate structure or the first interconnect structure.

20 Claims, 56 Drawing Sheets

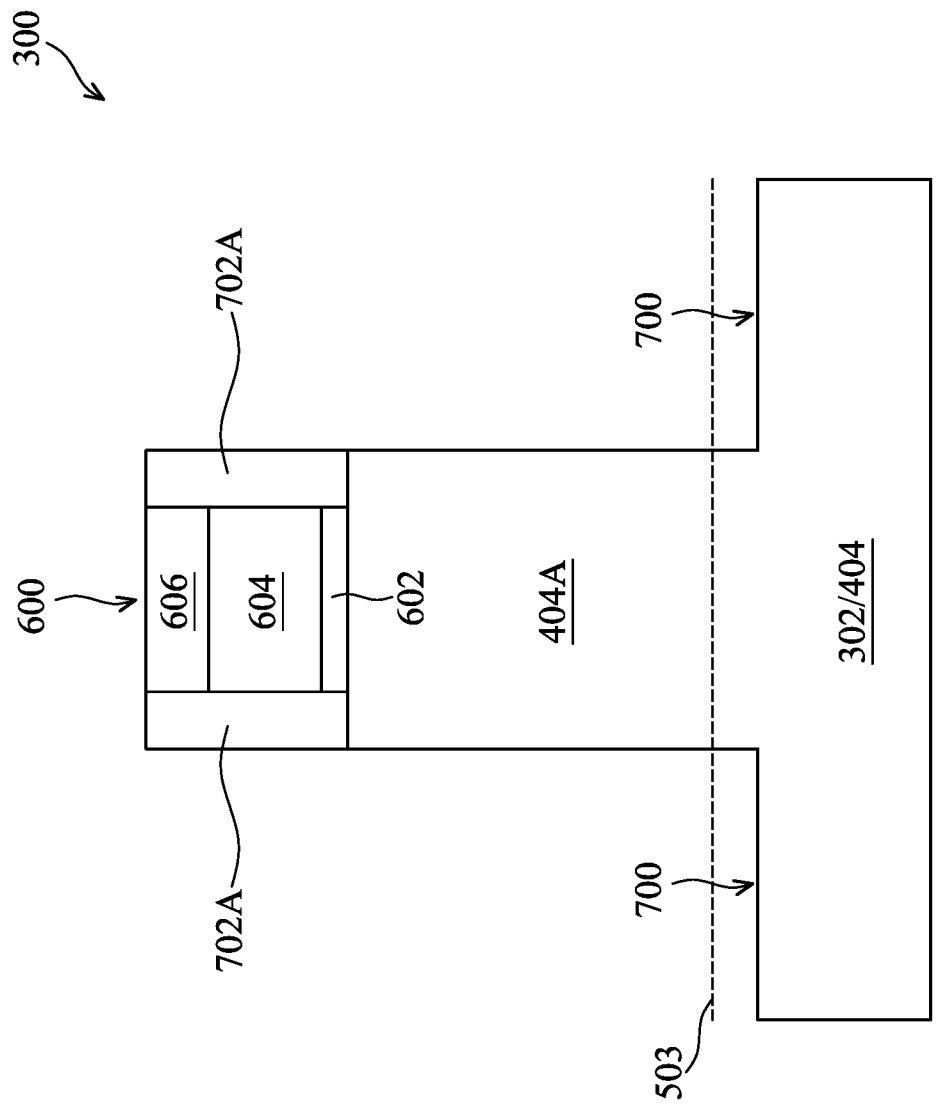

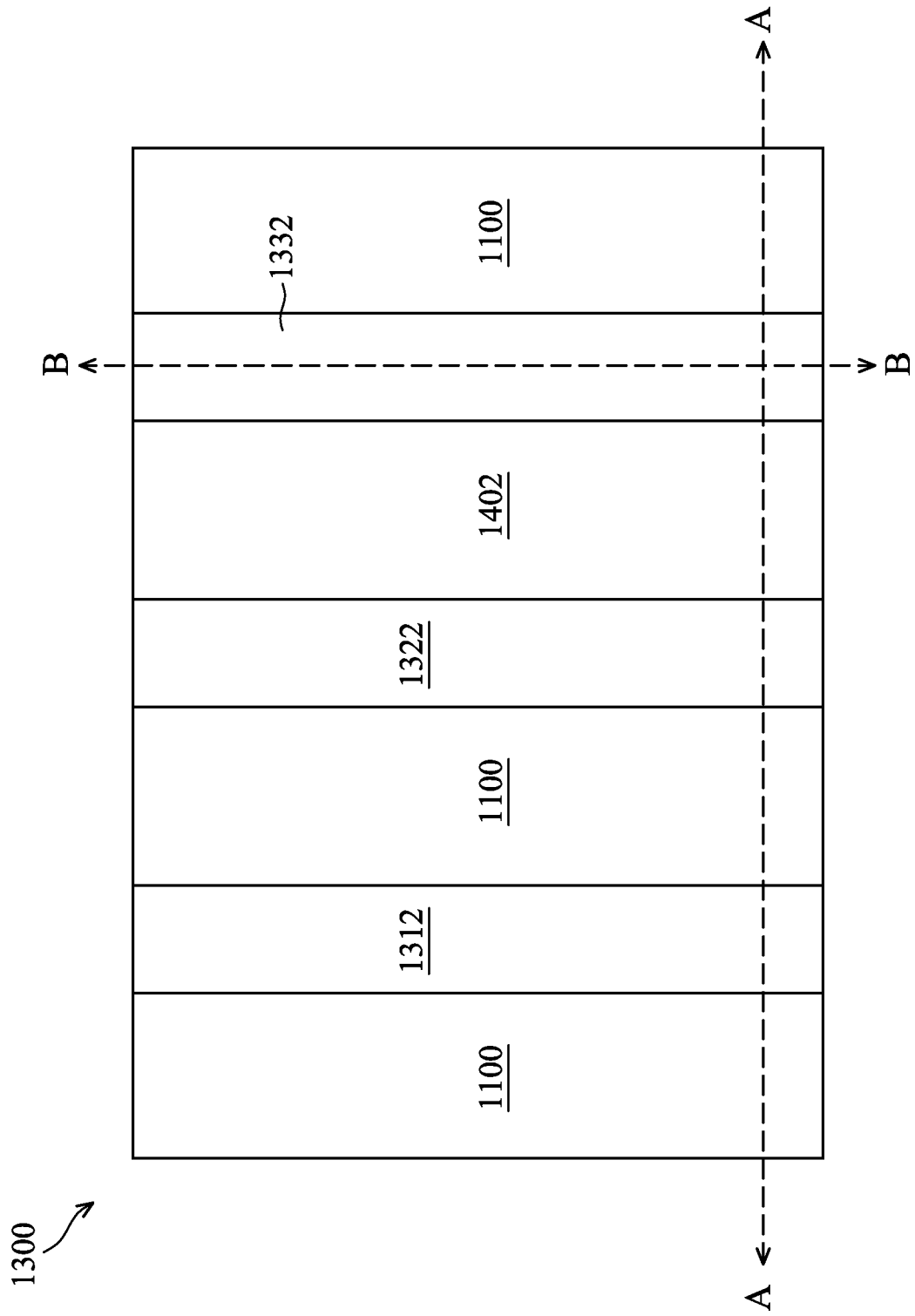

SEMICONDUCTOR DEVICES AND METHODS OF MANUFACTURING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A, 14A, 15A, 16A, 17A, 18A, and 18D illustrate corresponding top views of the example FinFET device (or a portion of the example FinFET device) during various fabrication stages, made by the method of FIG. 2, in accordance with some embodiments.

FIGS. 6B, 7B, 8B 9B, 10B, 11B, 12B, 13C, 14C, 15C, 16C, 17C, and 18C illustrate cross-sectional views of the example FinFET device, cut along a second cross-section (e.g., along line B-B), that correspond to FIGS. 6A, 7A, 8A, 9A, 10A, 11A, 12A, 13A, 14A, 15A, 16A, 17A, and 18A, respectively, in accordance with some embodiments.

DETAILED DESCRIPTION

Figure 1:
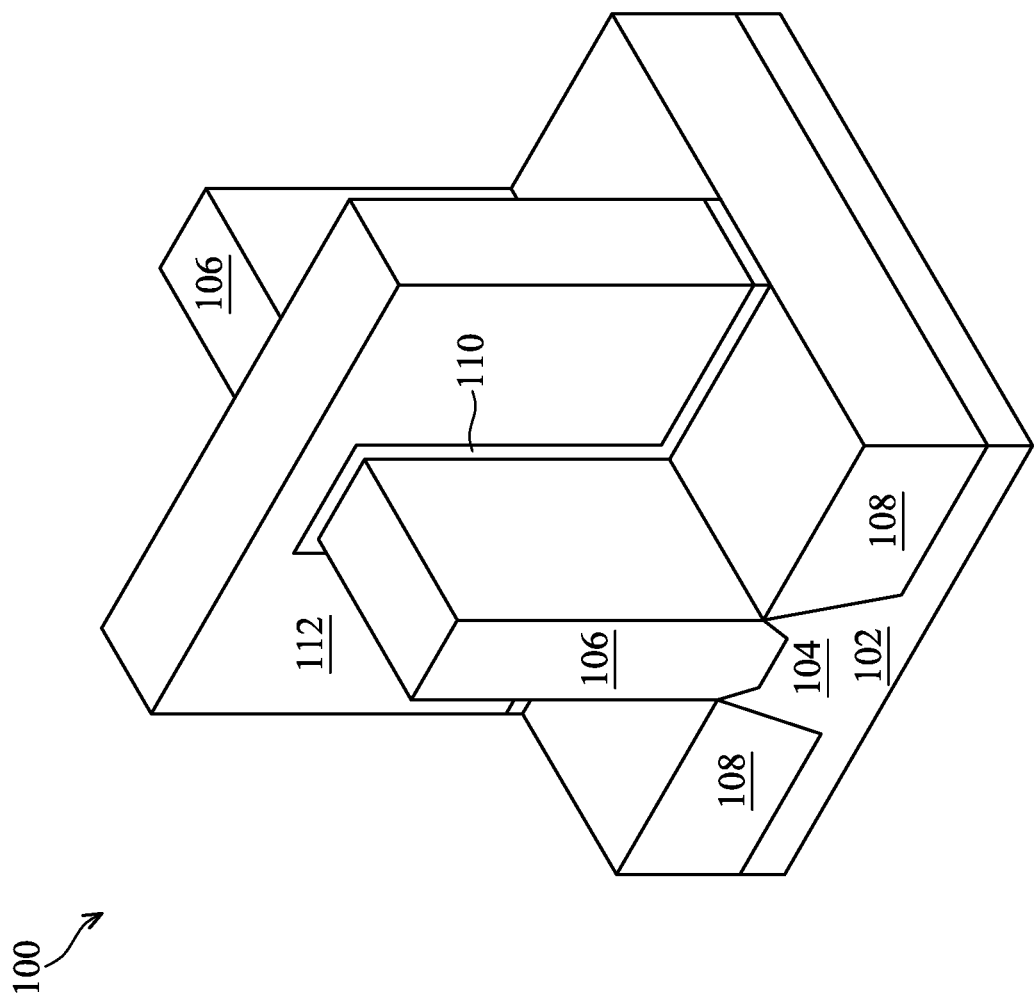
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

IC processing often utilizes a series of patterning processes to produce a number of IC features. For example, existing processing utilizes a patterned structure to define a dielectric spacing between respective interconnect structures for adjacent IC features (e.g., source/drain structures). It is generally desired to have such interconnect structure present a relative greater length or width (in a direction along which the interconnect structures are aligned), as their respective contact resistances (typically referred to as "Rc") can be accordingly reduced.

The present disclosure provides various embodiments of selectively forming a thicker portion of a dielectric layer between a first interconnect structure and a second interconnect structure or between a gate structure and a third interconnect structure on a transistor device. In some embodiments, the relatively thicker dielectric layer made from boron nitride (BN) can be selectively formed over a nitrogen-containing material such as a first dielectric capping layer on top of the gate structure or a second dielectric capping layer on top of the first interconnect structure. The relatively thicker dielectric layer provides an extra dielectric buffer when making metal contacts to the gate structure or the first interconnect structure. In such embodiments, a relatively thinner dielectric layer made from BN is formed over other surfaces of the transistor device, such as an interlayer dielectric (ILD), the first interconnect structure, or the first dielectric capping layer. In some embodiments, the relatively thinner dielectric layer is formed over a material that does not contain nitrogen. In some embodiments, the first interconnect structure, the second interconnect structure, and the third interconnect structure include metal. In some embodiments, the relatively thicker dielectric layer and the relatively thinner dielectric layer can include boron carbide ($B_xC_y$), boron oxide ($B_2O_3$), $C_xF_y$ polymer, or the like. In some embodiments, a corresponding selective growth technique can be used to grow the relatively thicker dielectric layer while leaving other surfaces covered with the relatively thinner dielectric layer.

The present disclosure is directed to, but not otherwise limited to, a fin-like field-effect transistor (FinFET) device. Such a FinFET device has a three-dimensional structure that includes a fin protruding from a substrate. A gate structure, configured to control the flow of charge carriers within a conduction channel of the FinFET device, wraps around the fin. For example, in a tri-gate FinFET device, the gate structure wraps around three sides of the fin, thereby forming conduction channels on three sides of the fin. It should be noted that other configurations of semiconductor devices that may benefit from aspects of the present disclosure. For example, some embodiments as described herein may also be applied to gate-all-around (GAA) devices, Omega-gate ($\Omega$-gate) devices, or Pi-gate ($\Pi$-gate) devices. The following disclosure will continue with a FinFET example to illustrate various embodiments of the present invention. It is understood, however, that the application should not be limited to a particular type of semiconductor device.

FIG. 1 illustrates a perspective view of an example FinFET device 100, in accordance with various embodiments. The FinFET device 100 includes a substrate 102 and a fin 104 protruding above the substrate 102. Epitaxial structures 106 are formed in (or extended from) from the fin. The epitaxial structures 106 may comprise a source region or a drain region. Isolation regions 108 are formed on opposing sides of the fin 104. In some embodiments, the fin 104 may protrude above the isolation regions 108. A gate dielectric 110 is along sidewalls and over a top surface of the fin 104, and a gate 112 is over the gate dielectric 110, which can sometimes be collectively referred to as a gate structure.

Figure 2:
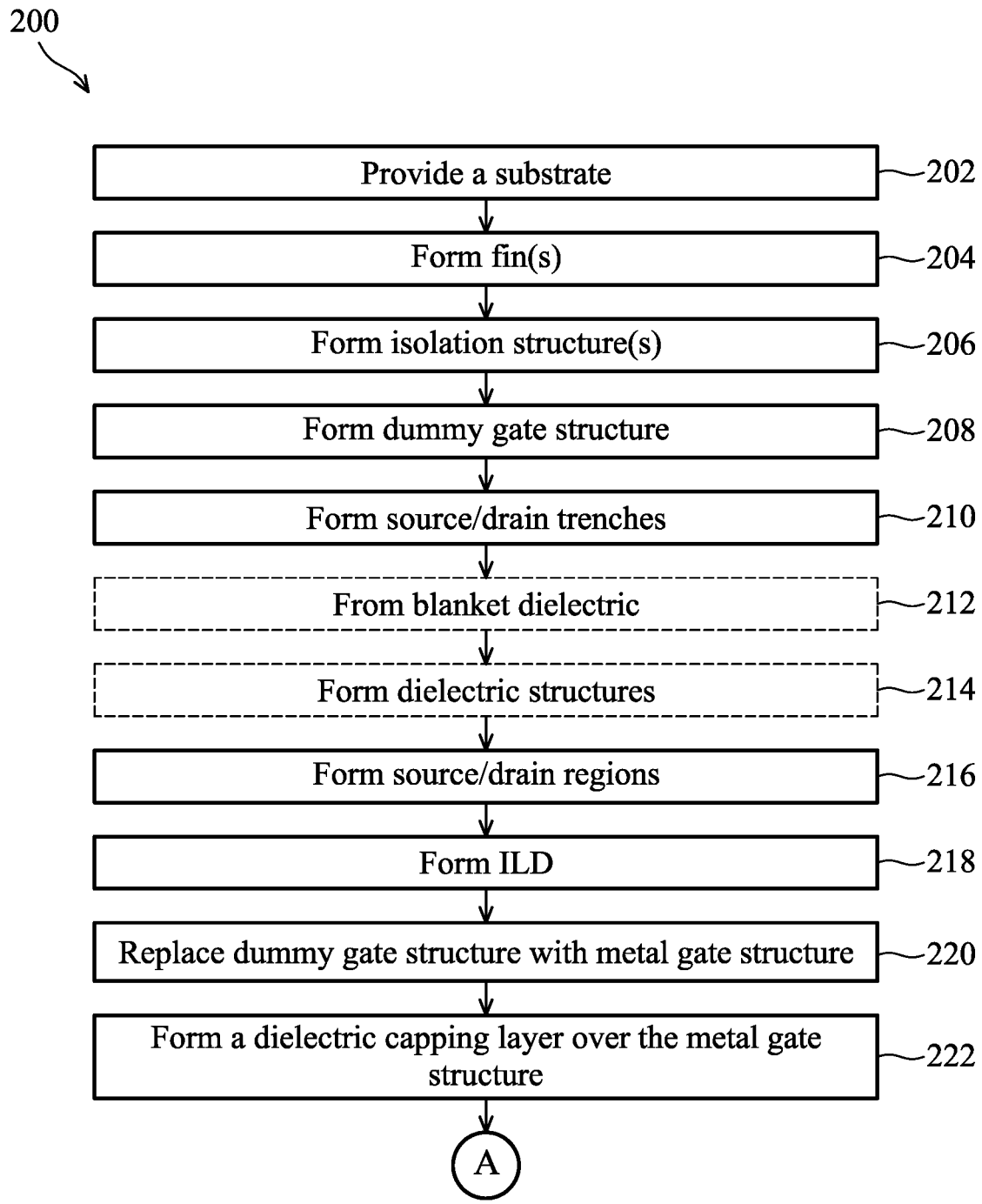
FIG. 2 illustrates a flow chart of an example method for making interconnect structures for a transistor device, in accordance with some embodiments.
Figure 2:
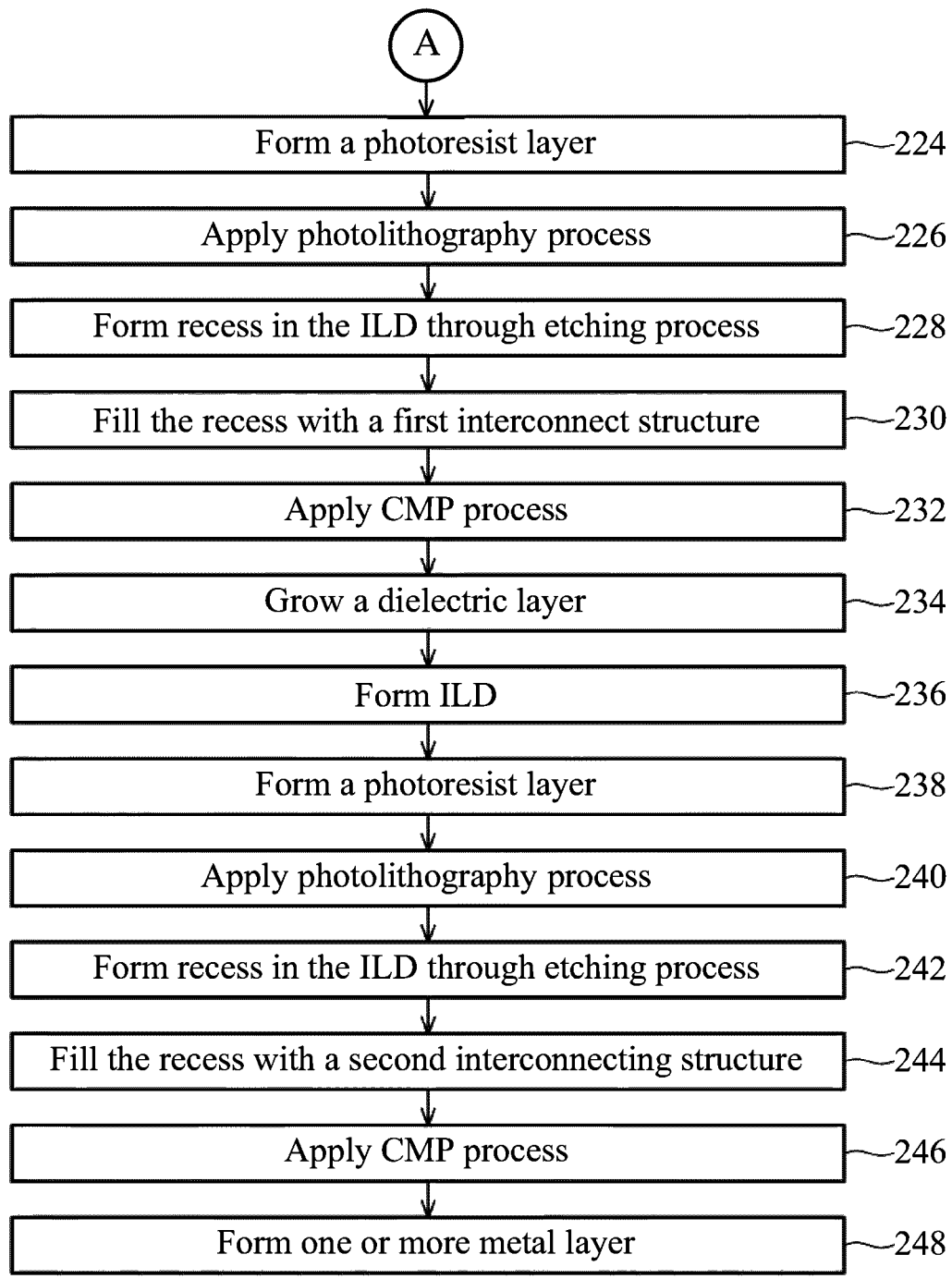

FIG. 2 illustrates a flowchart of a method 200 to form interconnect structures for a transistor device, according to one or more embodiments of the present disclosure. For example, at least some of the operations of the method 200 can be used to form a FinFET device (e.g., FinFET device 300). It is noted that the method 200 is merely an example, and is not intended to limit the present disclosure. It is understood the IC may comprise a number of other devices comprising resistors, capacitors, inductors, fuses, etc., which are not shown for purposes of clarity. Accordingly, it is understood that additional operations may be provided before, during, and after the method 200 of FIG. 2, and that some operations may only be briefly described herein.

In some embodiments, operations of the method 200 may be associated with perspective views of an example FinFET device 300 at one of the various fabrication stages as shown in FIGS. 3A, 4A 5A, 6A, 7A, 8A, 9A, 10A, 11A, and 12A; the top views of an example FinFET device 300 at one of the various fabrication stages as shown in 13A, 14A 15A, 16A, 17A, 18A and 18D; and the cross-sectional views of the example FinFET device 300 at various fabrication stages as shown in FIGS. 3B, 4B, 5B, 6B, 7B, 8B, 9B, 10B, 11B, 12B, 13B, 13C, 14B, 14C, 15B, 15C, 16B, 16C, 17B, 17C, 18B, 18C, and 18E, respectively, which will be discussed in further detail below.

In brief overview, the method 200 starts with the operation 202 in which a semiconductor substrate is provided. The method 200 continues to operation 204 in which one or more fins are formed extending beyond a major surface of the semiconductor substrate. The method 200 continues to operation 206 in which one or more isolation structures are formed around a lower portion of each fin. The method 200 continues to operation 208 in which a dummy gate structure is formed over a central portion of each fin. The method 200 continues to operation 210 in which end portions of each fin are removed to form source/drain trenches. The method 200 continues to operation 212 in which a blanket dielectric is formed over the semiconductor substrate. In some embodiments, the operation 212 is optional. The method 200 continues to operation 214 in which a dielectric structure is formed in each of the source/drain trenches. In some embodiments, the operation 214 is optional. The method 200 continues to operation 216 in which source/drain regions are formed over the dielectric structures in the source/drain trenches, respectively. The method 200 continues to operation 218 in which an interlayer dielectric (ILD) is formed. The method 200 continues to operation 220 in which the dummy gate structure is replaced with a gate structure (sometimes referred to as a first metal structure). The method 200 continues to operation 222 in which a first dielectric capping layer (sometimes referred to as a nitrogen-containing capping layer) is formed over the gate structure. The first dielectric capping layer contains nitrogen.

The method 200 continues to operation 224 in which at least one photoresist layer is formed on a top surface of the transistor device. The method 200 continues to operation 226 in which a photolithography process and/or processes are applied to the photoresist layer(s). The method 200 continues to operation 228 in which a recess in the ILD formed from operation 218 is formed through an etching process. The method 200 continues to operation 230 in which the recess formed form operation 228 is filled with a first interconnect structure (sometimes referred to as a second metal structure). The method 200 continues to operation 232 in which a chemical mechanical polish (CMP) process may remove any excess insulation material.

The method 200 continues to operation 234 in which a dielectric layer is grown on the existing transistor device. The method 200 continues to operation 236 in which a second ILD is formed. The method 200 continues to operation 238 in which at least one photoresist layer is formed on a top surface of the existing transistor device. The method continues to operation 240 in which a photolithography process and/or processes is applied to the photoresist layer(s). The method 200 continues to operation 242 in which a recess in the second ILD is formed through an etching process. The method 200 continues to operation 244 in which the recess from operation 242 is filled with a second interconnect structure electrically coupled to the first interconnect structure. The method 200 continues to operation 246 in which a CMP process may remove any excess insulation material. The method 200 continues to operation 248 in which one or more metal layers are formed on the top surface of the existing transistor device.

Figure 3A:
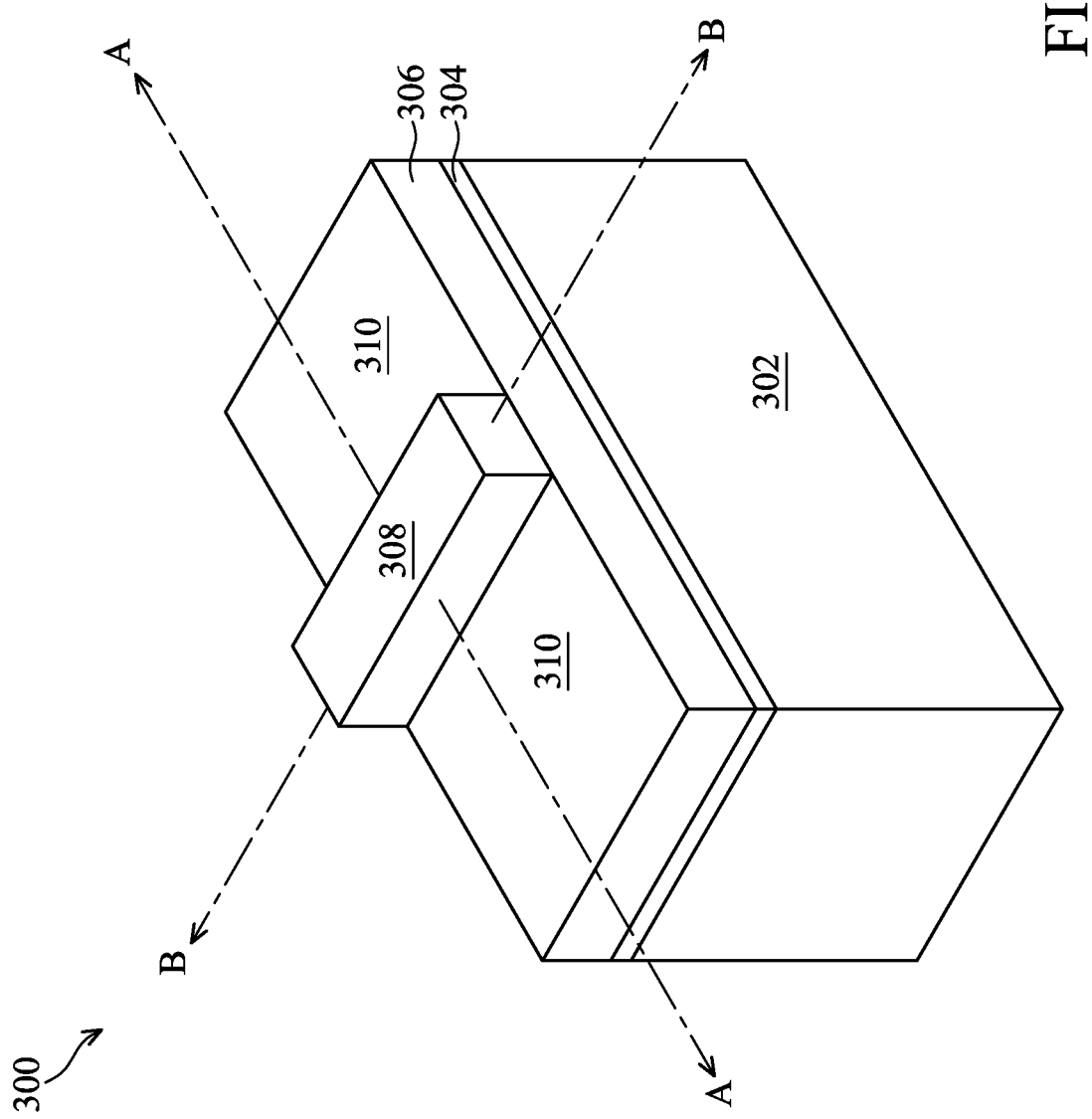
FIGS. 3A, 4A 5A, 6A, 7A, 8A, 9A, 10A, 11A, and 12A illustrate perspective views of an example FinFET device (or a portion of the example FinFET device) during various fabrication stages, made by the method of FIG. 2, in accordance with some embodiments.
Figure 3B:
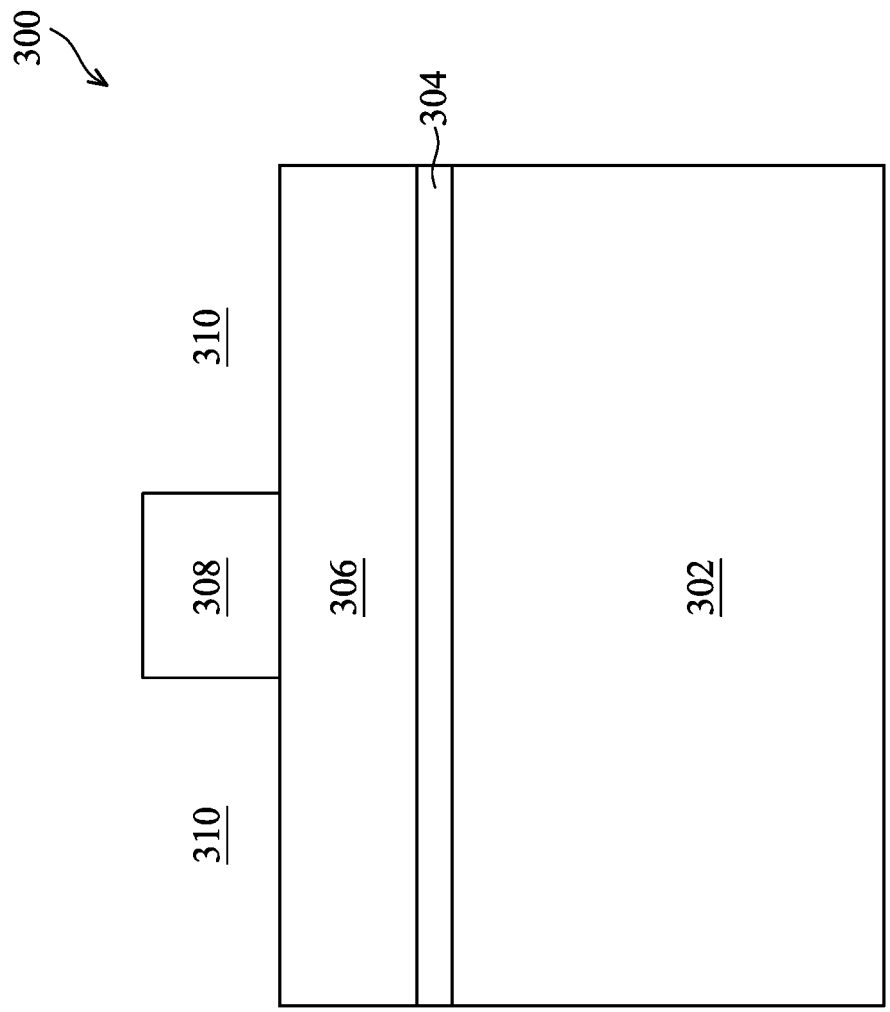
FIGS. 3B, 4B, 5B, 13B, 14B, 15B, 16B, 17B, 18B, and 18E illustrate cross-sectional views of the example FinFET device, cut along a first cross-section (e.g., along line A-A), that correspond to FIGS. 3A, 4A, 5A, 13A, 14A, 15A, 16A, 17A, 18A, and 18D, respectively, in accordance with some embodiments.

Corresponding to operation 202 of FIG. 2, FIG. 3A is a perspective view of a FinFET 300 including a substrate 302 at one of the various stages of fabrication, according to some embodiments. FIG. 3B is a cross-sectional view of the FinFET 300 taken along A-A of FIG. 3A. In some embodiments, the substrate 302 is covered by a pad layer 304, a mask layer, 306, and a photo-sensitive layer 308 that is patterned with one or more openings 310.

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The pad layer 304 may be a thin film comprising silicon oxide formed, for example, using a thermal oxidation process. The pad layer 304 may act as an adhesion layer between the semiconductor substrate 302 and the mask layer 306. The pad layer 304 may also act as an etch stop layer while etching the mask layer 306. In some embodiments, the mask layer 306 is formed of silicon nitride, for example, using low-pressure chemical vapor deposition (LPCVD) or plasma enhanced chemical vapor deposition (PECVD). The mask layer 306 is used as a hard mask during subsequent photolithography processes. The photo-sensitive layer 308 is formed on the mask layer 306, and then patterned thereby forming the openings 310 in the photo-sensitive layer 308.

Figure 4A:
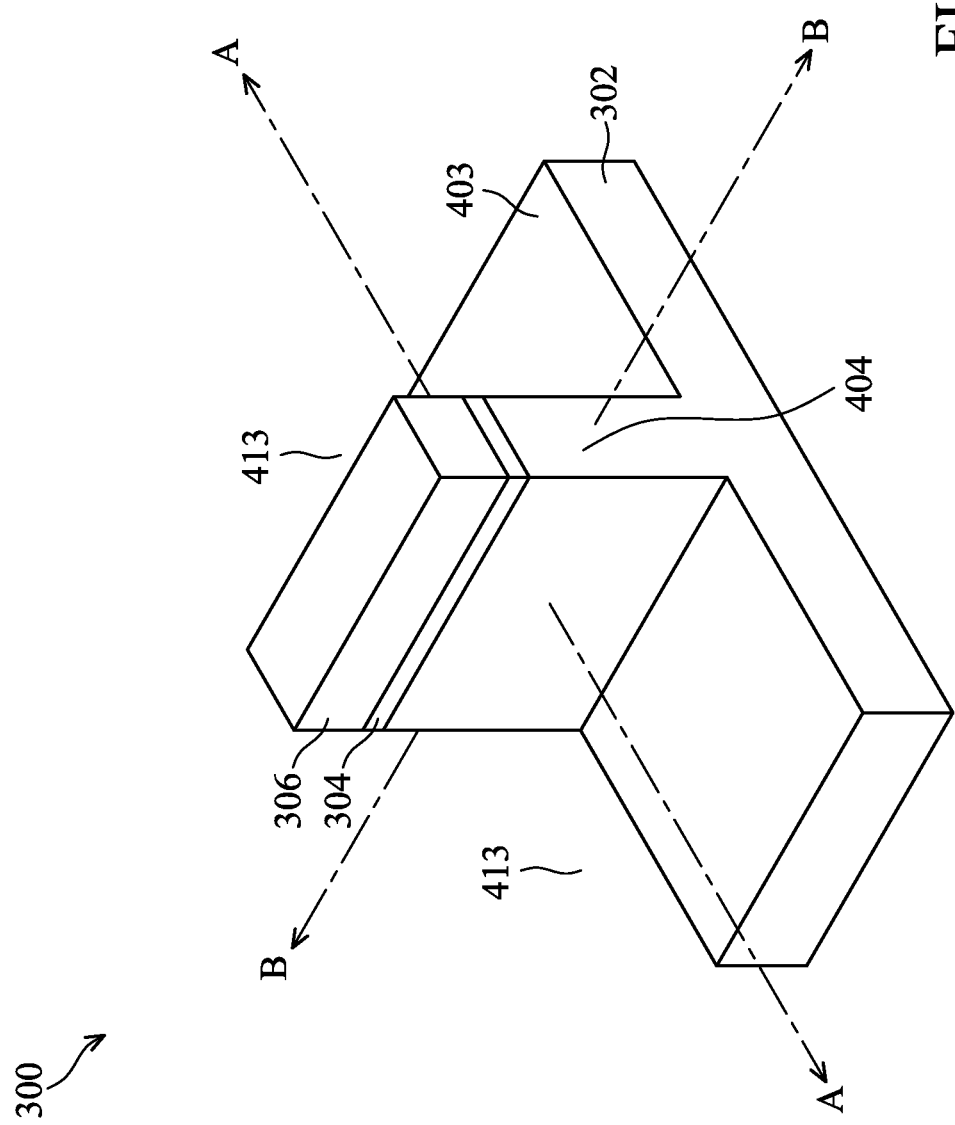
Figure 4B:
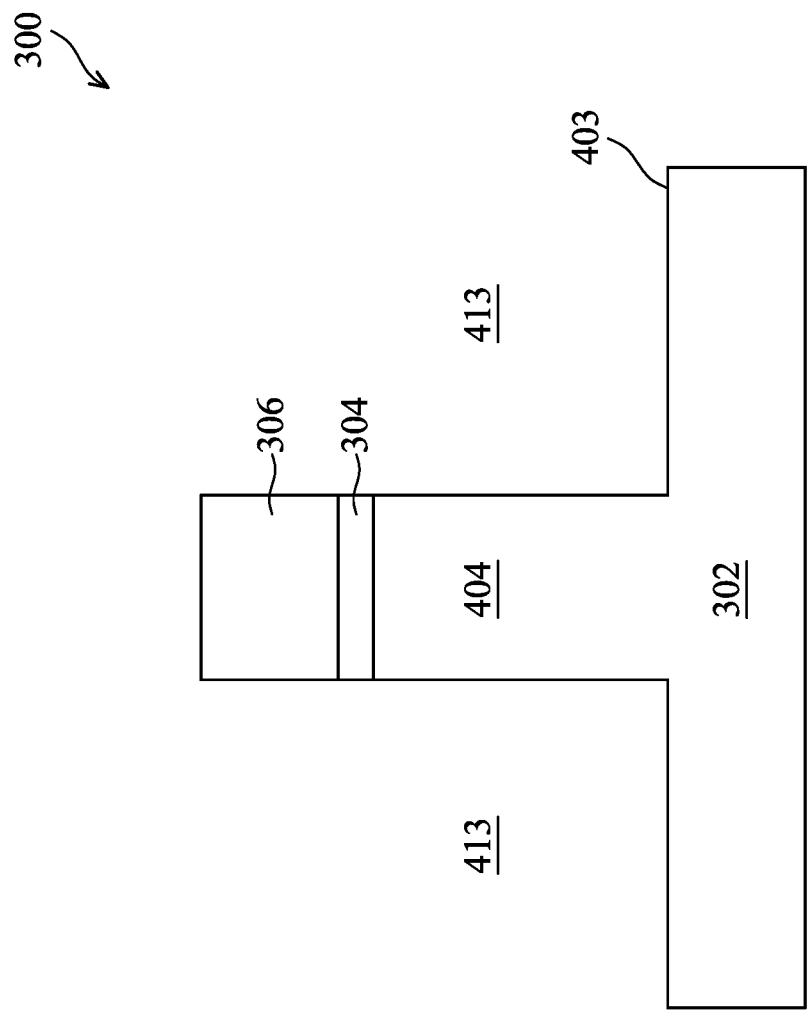

Corresponding to operation 204 of FIG. 2, FIG. 4A is a perspective view of the FinFET 300 including at least a fin 404 at one of the various stages of fabrication, according to some embodiments, and FIG. 4B is a cross-sectional view of the FinFET 300 taken along line A-A of FIG. 4A.

As shown, the fin 404 has a longitudinal (or lengthwise) axis extended along line B-B, which is perpendicular to line A-A, and is sandwiched between trenches 413. It is noted that although one fin 404 is shown in the illustrated embodiments of FIGS. 3A-B (and the following figures), any desired number of fins may be formed on the semiconductor substrate 302 using the photo-sensitive layer 308 (FIGS. 3A-B) with a corresponding pattern. As such, when multiple fins are formed on the substrate 302 that are in parallel with one another, the fins can be spaced apart from one another by a corresponding trench 413.

The fin 404 is formed by at least some of the following processes. The mask layer 306 and pad layer 304 are etched through openings 310 (FIGS. 3A-B) to expose underlying semiconductor substrate 302. By using remaining pad layer 304 and the mask layer 306, as shown in FIGS. 4A and 4B, the exposed semiconductor substrate 302 is then etched to form the trenches 413 so as to cause a surface 403 of the semiconductor substrate 302 to be exposed. Portions of the semiconductor substrate 302 sandwiched between the trenches 413 are thus formed as the fin 404. The fin 404 each extends upward from the surface 403. The trenches 413 may be strips (viewed from the top of the FinFET 300) parallel to each other, and closely spaced with respect to each other. After the fin 404 is formed, the photo-sensitive layer 308 (not shown in FIGS. 4A-B for purposes of clarity) is removed. Subsequently, a cleaning process may be performed to remove a native oxide of the semiconductor substrate 302. The cleaning may be performed using diluted hydrofluoric (DHF) acid, or the like.

Figure 5A:
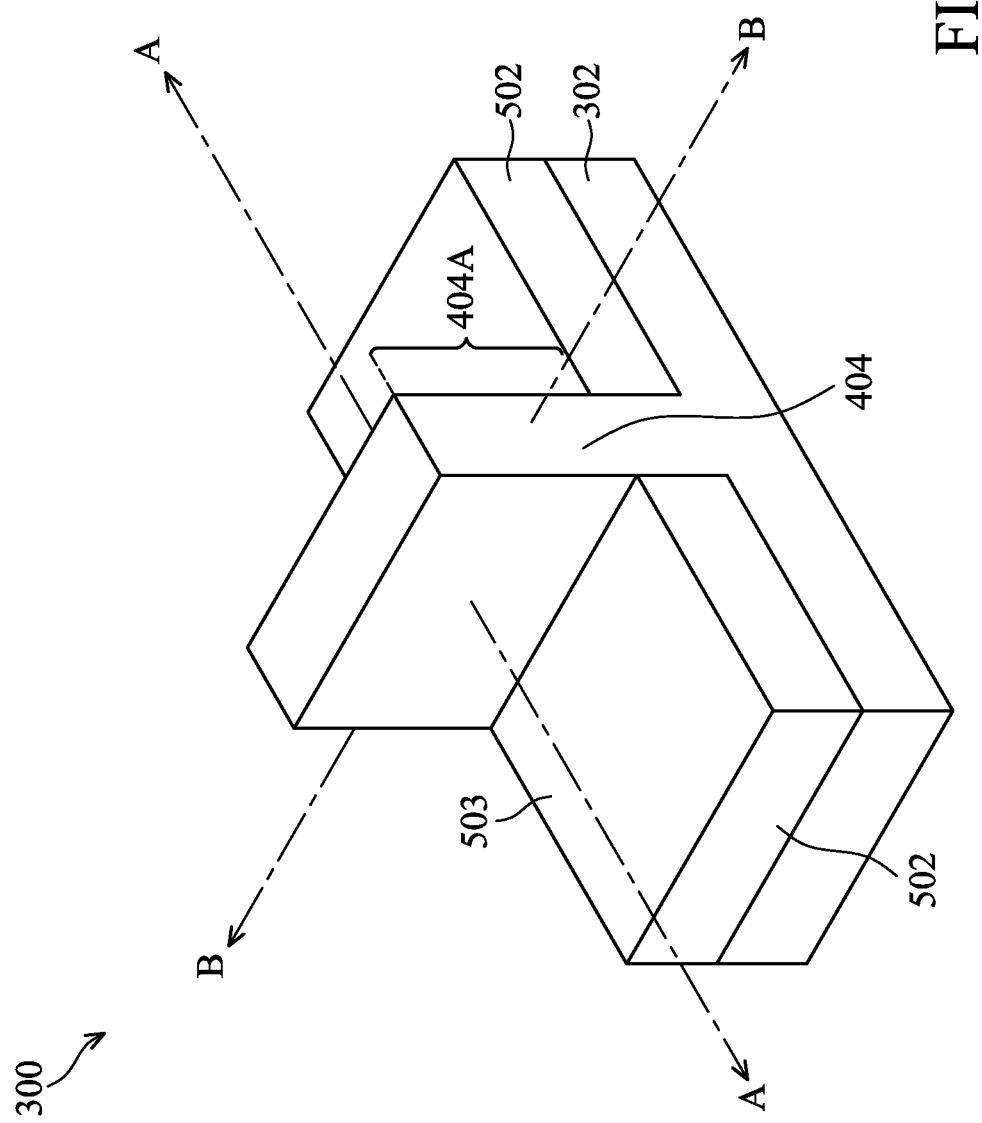
Figure 5B:
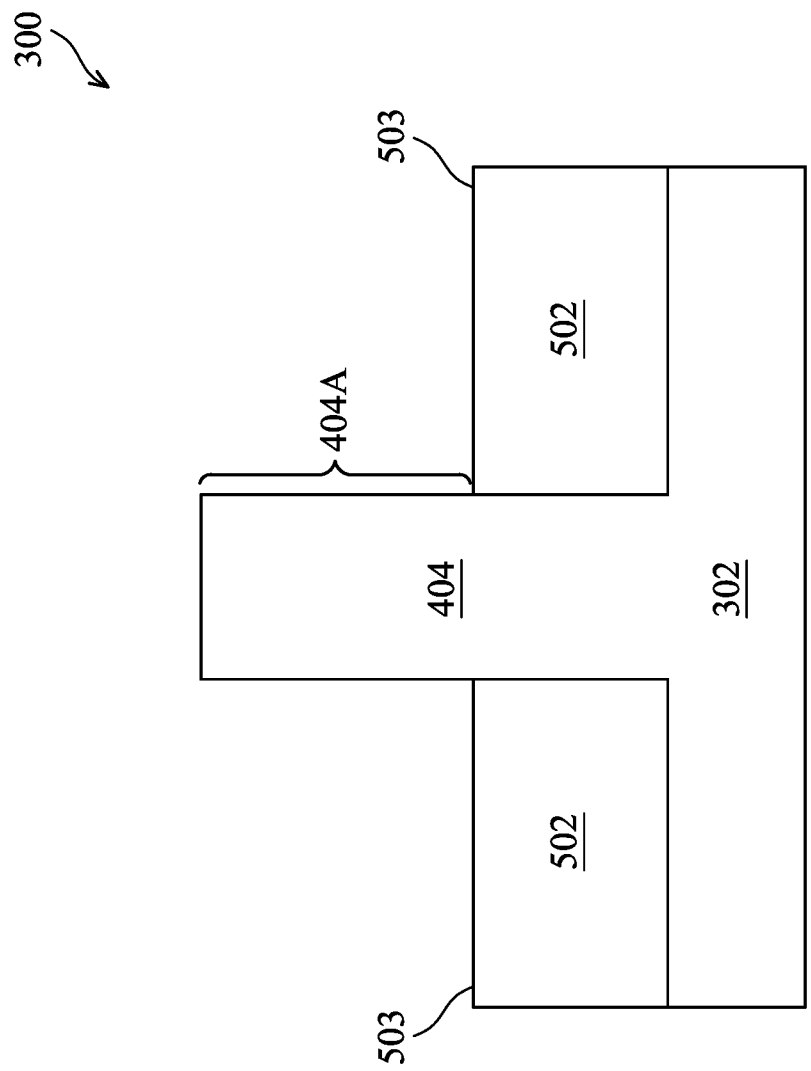

Corresponding to operation 206 of FIG. 2, FIG. 5A is a perspective view of the FinFET 300 including isolation structures 502 at one of the various stages of fabrication, according to some embodiments, and FIG. 5B is a cross-sectional view of the FinFET 300 taken along line A-A of FIG. 5A.

The isolation structures 502, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 502 and a top surface of the fin 404 that are coplanar (not shown). The remaining pad layer 304 and the mask layer 306 (FIGS. 4A-B) may also be removed by the planarization process.

In some embodiments, the isolation structures 502 include a liner, e.g., a liner oxide (not shown), at the interface between each of the isolation structures 502 and the substrate 302. In some embodiments, the liner oxide is formed to reduce crystalline defects at the interface between the substrate 302 and the isolation structure 502. Similarly, the liner oxide may also be used to reduce crystalline defects at the interface between the fin 404 and the isolation structure 502. The liner oxide (e.g., silicon oxide) may be a thermal oxide formed through a thermal oxidation of a surface layer of the substrate 302, although other suitable method may also be used to form the liner oxide.

Next, the isolation structures 502 are recessed to form shallow trench isolation (STI) regions 502, as shown in FIGS. 5A-B. The isolation structures 502 are recessed such that the upper portion of the fin 404 (hereinafter "fin 404A") protrude from between neighboring STI regions 502. In other words, the fin 404A is protruded from a top surface 503 of the STI regions 502. The protruded fin 404A can function as the conduction channels of a first set of transistors and a second set of transistors, respectively. The top surface 503 of the STI regions 502 may have a flat surface (as illustrated), a convex surface, a concave surface (such as dishing), or combinations thereof. The top surface 503 of the STI regions 502 may be formed flat, convex, and/or concave by an appropriate etch. The isolation structures 502 may be recessed using an acceptable etching process, such as one that is selective to the material of the isolation regions 502. For example, a dry etch or a wet etch using dilute hydrofluoric (DHF) acid may be performed to recess the isolation structures 502.

Figure 6A:
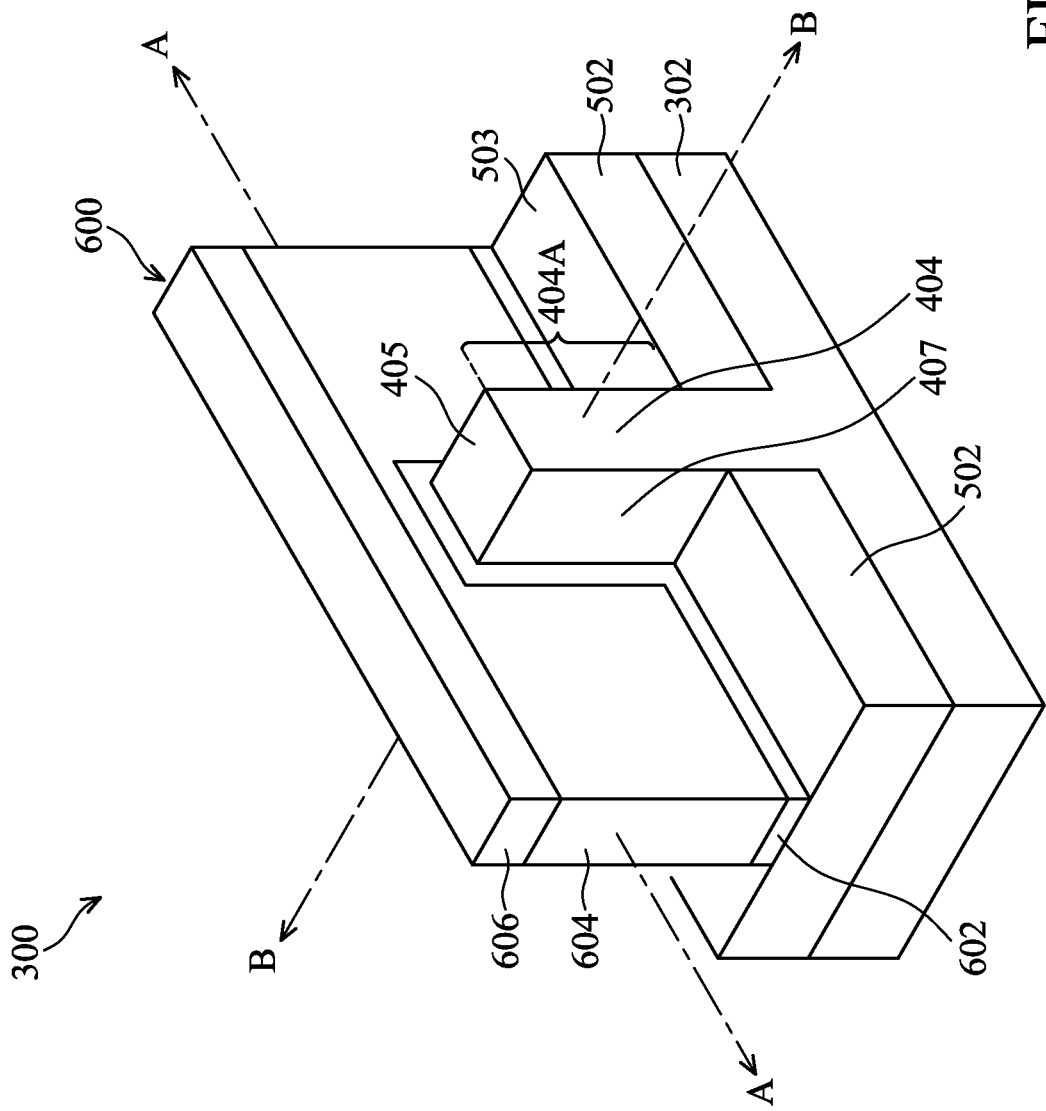
Figure 6B:
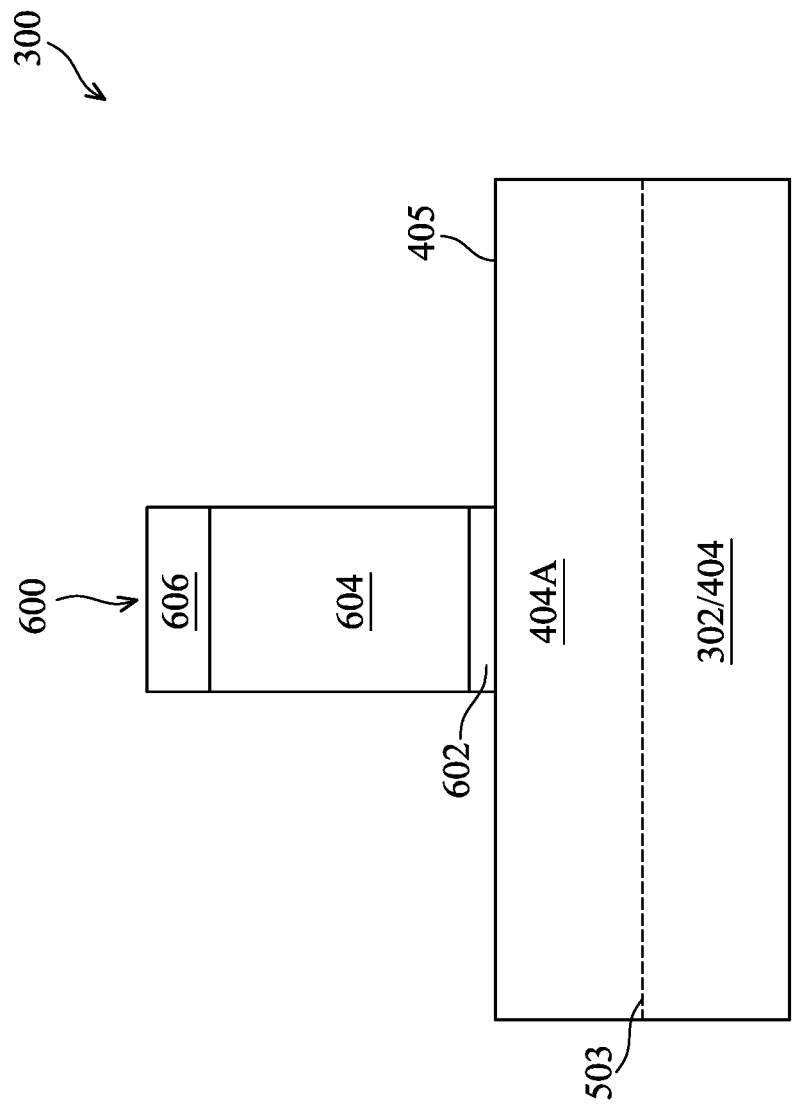

Corresponding to the operation 208 of FIG. 2, FIG. 6A is a perspective view of the FinFET 300 including a dummy gate structure 600 at one of the various stages of fabrication, according to some embodiments, and FIG. 6B is a cross-sectional view of the FinFET 300 taken along line B-B of FIG. 6A.

As shown, the dummy gate structure 600 has a longitudinal (or lengthwise) axis extended along line A-A, which is perpendicular to the longitudinal axis of the fin 404 (line B-B). In some embodiments, the dummy gate structure 600 overlays a central portion of the fin 404A, e.g., overlaying a top surface 405 and sidewalls 407 of the central portion of the fin 404A. Such a central portion of the fin 404A, overlaid by the dummy gate structure 600, may serve as a conduction channel of the FinFET 300 to conduct a current flowing along line B-B.

The dummy gate structure 600 includes a dummy gate dielectric 602 and a dummy gate electrode 604, which will be removed in a later removal (e.g., etching) process to form a metal (or otherwise active) gate structure. The dummy gate dielectric 602 and the dummy gate electrode 604 may be formed by performing at least some of the following processes. A dielectric layer (used to form the dummy gate dielectric 602) is formed over the fin 404A. The dielectric layer may be, for example, silicon oxide, silicon nitride, multilayers thereof, or the like, and may be deposited or thermally grown. Next, a gate layer (used to form the dummy gate electrode 604) is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to form a mask 606. The pattern of the mask 606 then may be transferred to the gate layer and the dielectric layer by an acceptable etching technique to form the dummy gate dielectric 602 and the dummy gate electrode 604, respectively.

The dummy gate dielectric 602 is shown to be formed over the fin 404A (e.g., over top surface 405 and sidewalls 407 of the fin 404A) and over the isolation regions 502. In other embodiments, the dummy gate dielectric 602 may be formed by, e.g., thermal oxidization of a material of the fin 404A, and therefore, may be formed over the fin 404A but not over the STI regions 502. It should be appreciated that these and other variations are still included within the scope of the present disclosure.

Figure 7A:
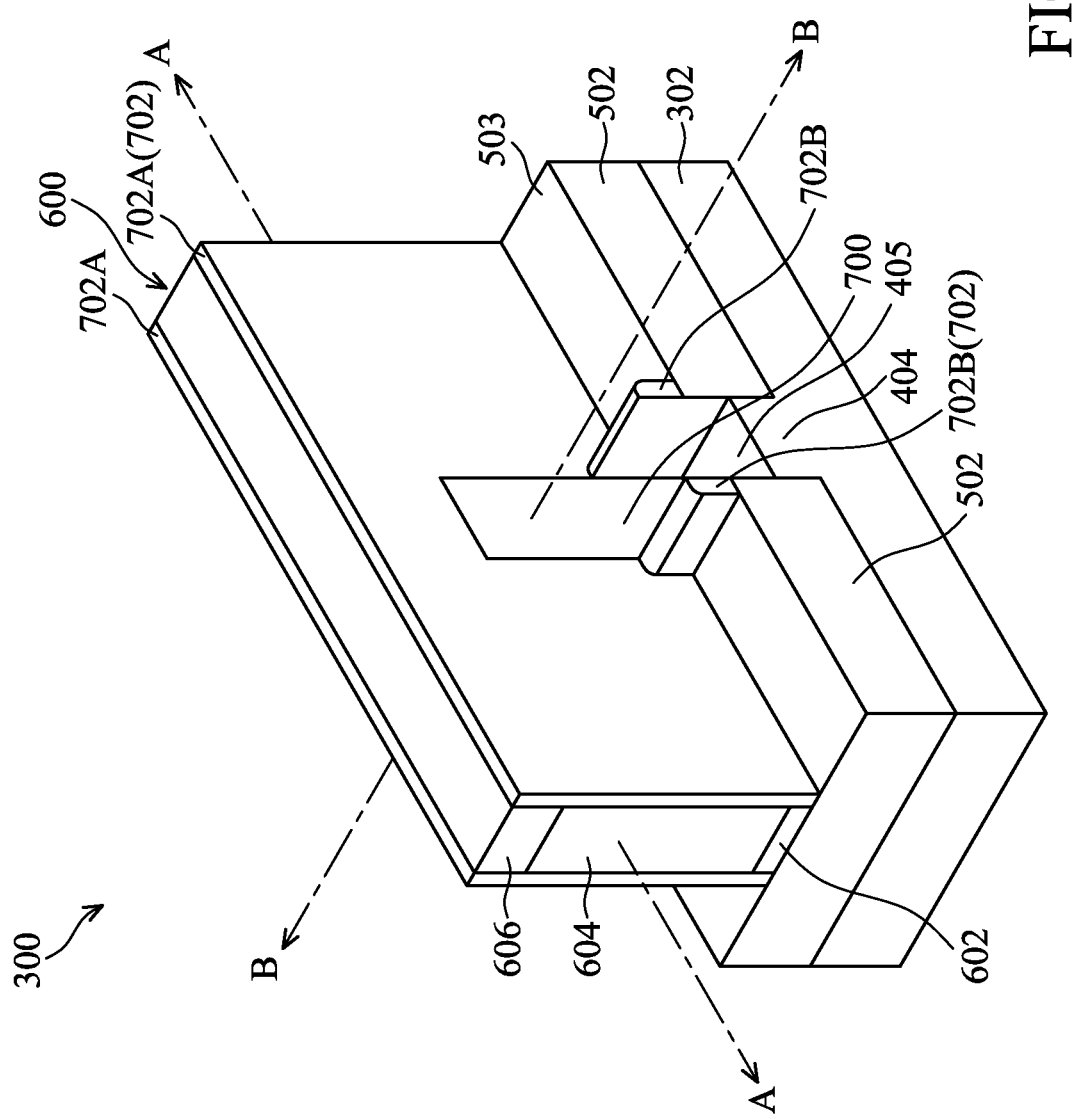

Corresponding to the operation 210 of FIG. 2, FIG. 7A is a perspective view of the FinFET 300 including source/drain trenches 700 and a gate spacer 702 at one of the various stages of fabrication, according to some embodiments, and FIG. 7B is a cross-sectional view of the FinFET 300 taken along line B-B of FIG. 7A.

In some embodiments, the source/drain trenches 700 are formed on opposite sides of the dummy gate structure 600. In some embodiments, the gate spacer 702 may be formed around the dummy gate structure 600. For example, the gate spacer 702 can include at least a first portion and a second portion, 702A, respectively extended along sidewalls of the dummy gate structure 600. The gate spacer 702 can also include portions, 702B, that are extended from the first and second portions 702A along the line B-B, as shown in FIG. 7A. Such extended portions 702B may be subsequently used to direct or confine growth of the source/drain regions from the source/drain trenches 700. In the example of FIG. 7A, the extended portion 702B is shown to have a cross-section in a quarter circle shape. However, it should be understood that the cross-section of the extended portion 702B can have any of various other shapes (e.g., a fan shape, a rectangular shape, a trapezoidal shape, etc.), while remaining within the scope of the present disclosure.

In some embodiments, the gate spacer 702 and the source/drain trenches 700 may be concurrently formed. For example, a dielectric layer (used to form the gate spacer 702) is deposited over the dummy gate electrode 704 and the end (exposed) portions of the fin 404A (FIG. 6A). The dielectric layer may be, for example, silicon oxide, silicon nitride, multilayers thereof, or the like. Any suitable deposition method, such as thermal oxidation, chemical vapor deposition (CVD), or the like, may be used to form the dielectric layer. Next, one or more photolithography processes and one or more etching processes are performed on the dielectric layer to concurrently form the gate spacer 702 and the source/drain trenches 700. The etching process may be anisotropic. As such, portions of the dielectric layer at the corner of the fin 404A and isolation regions 502 may remain, which forms the extended portion 702B. When anisotropically etching the dielectric layer, a portion of the dielectric layer overlaying the mask 606 may be removed. Accordingly, the mask 606 may be re-exposed. It should be understood that the gate spacer 702 may be formed subsequently to or prior to the formation of the source/drain trenches 700, while remaining within the scope of the present disclosure.

Upon the source/drain trenches 700 being formed, sidewalls of the central portion of the fin 404A that are collectively overlaid by the dummy gate electrode 604 and gate spacer portion 702A can be exposed, as shown in FIGS. 7A-B. The sidewalls of the fin 404A are opposite to each other along the line B-B. Such exposed sidewalls of the fin 404A can be used to epitaxially grow the source/drain regions in the source/drain trenches 700, in some embodiments. In addition to exposing the sidewalls of the fin 404A, the source/drain trenches 700 can expose a surface of the fin 404, e.g., surface 405. In the illustrated embodiment of FIGS. 6A-B (and the following figures), the surface 405 is vertically below the top surface 503 of the isolation regions 502. However, it should be understood that the surface 405 may be formed to be vertically aligned with or above the top surface 503, while remaining within the scope of the present disclosure.

Figure 8A:
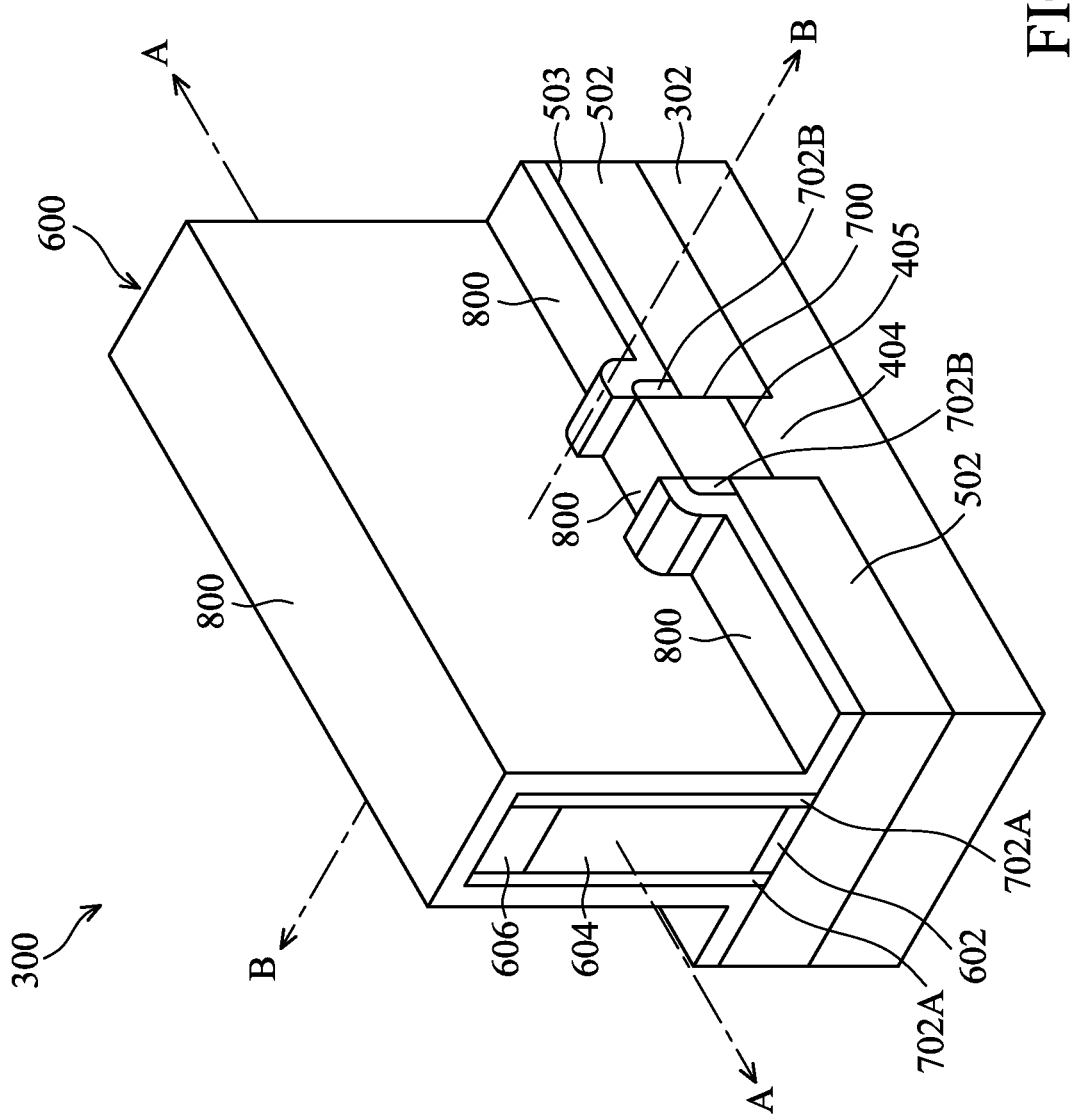
Figure 8B:
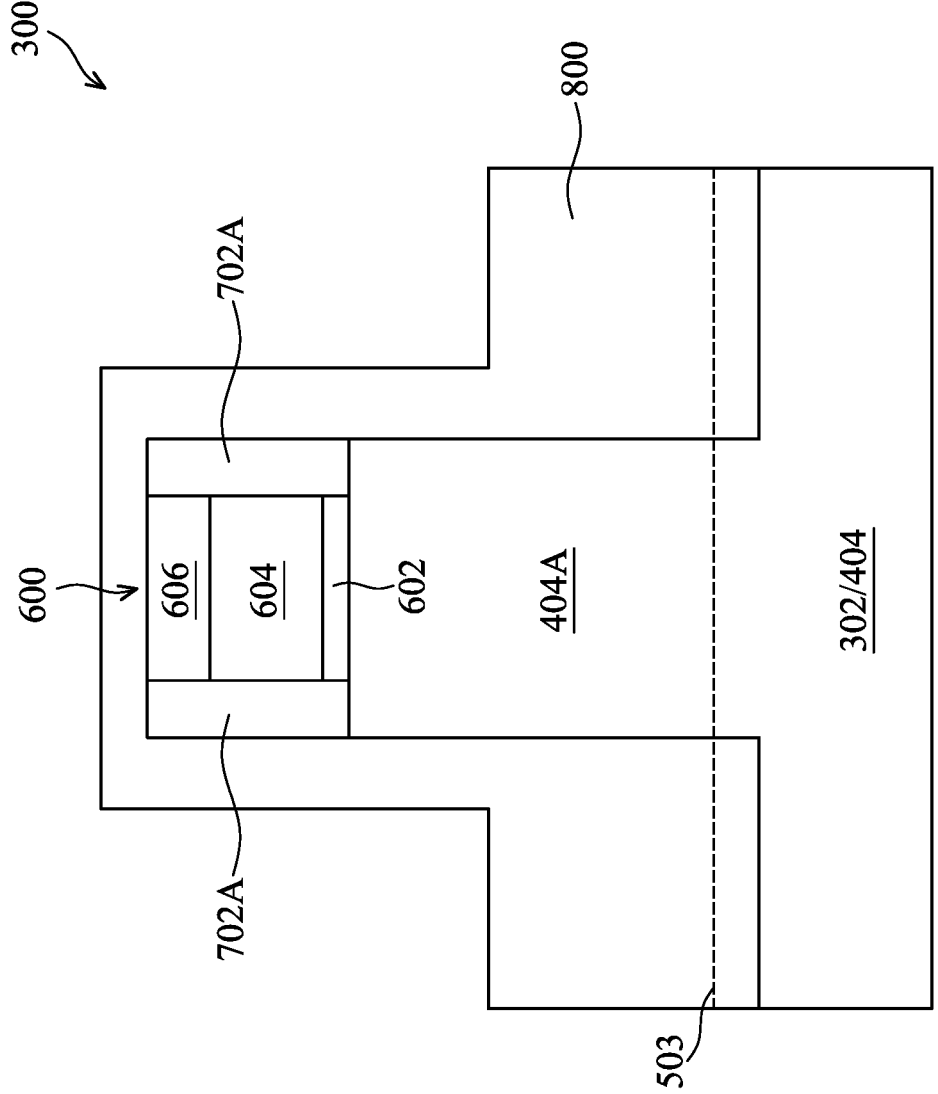

Corresponding to the operation 212 of FIG. 2, FIG. 8A is a perspective view of the FinFET 300 including a blanket dielectric 800 at one of the various stages of fabrication, according to some embodiments, and FIG. 8B is a cross-sectional view of the FinFET 300 taken along line B-B of FIG. 8A.

In some embodiments, the blanket dielectric 800 is optional. As shown, the blanket dielectric 800 may be formed to overlay the dummy gate structure 600 (which includes the dummy gate dielectric 602 and dummy gate electrode 604), the gate spacer 702 (which includes portions 702A and 702B), and the isolation regions 502, and fill at least a lower portion of each of the source/drain trenches 700. By filling at least the lower portion of the source/drain trench 700 with the blanket dielectric 800, the exposed surface 405 of the fin 404 can be covered by a dielectric material, which causes the fin 404 to be electrically insulated from any conductive features subsequently formed over the fin 404. The blanket dielectric 800 may reduce the leakage current of a FinFET device that can commonly conduct between the source/drain trenches 700 through a structure.

The blanket dielectric 800 may include a material selected from the group consisting of silicon oxide, silicon nitride, silicon carbide, silicon oxycarbide, silicon oxynitride, silicon carbonitride, silicon oxycarbonitride, and combinations thereof. In some embodiments, the blanket dielectric 800 and the gate spacer 702 may have different materials to provide etching selectivity in subsequent processes. The blanket dielectric 800 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the blanket dielectric 800 may include a high-k dielectric material. As such, the blanket dielectric 800 may have a k value greater than about 4.0 or even greater than about 7.0, and may include a metal oxide or a silicate of Hf, Al, Zr, La, Mg, Ba, Ti, Pb, and combinations thereof. The formation methods of such a high-k blanket dielectric 800 may include molecular beam deposition (MBD), atomic layer deposition (ALD), PECVD, and the like.

Figure 9A:
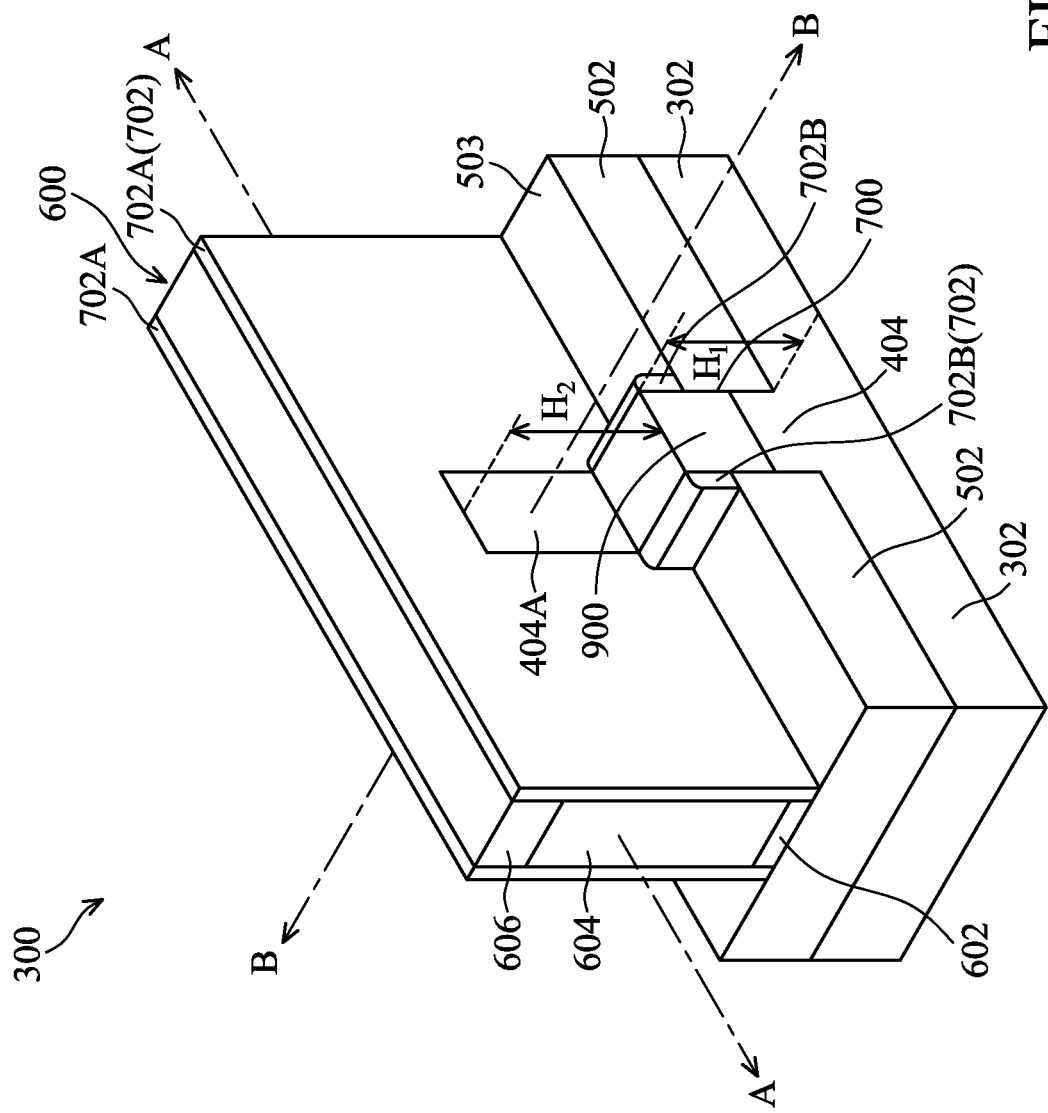
Figure 9B:
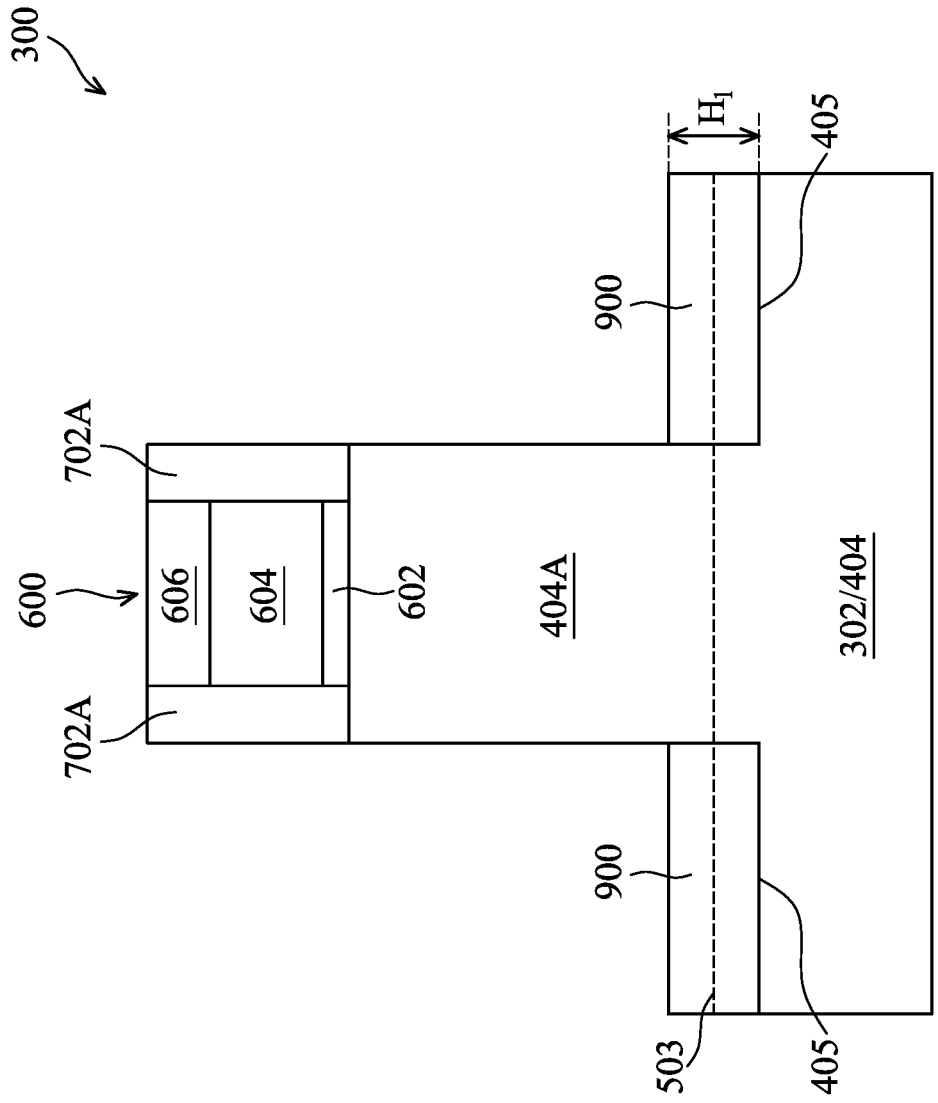

Corresponding to the operation 214 of FIG. 2, FIG. 9A is a perspective view of the FinFET 300 including dielectric structures 900 at one of the various stages of fabrication, according to some embodiments, and FIG. 9B is a cross-sectional view of the FinFET 300 taken along line B-B of FIG. 9A.

In some embodiments, the dielectric structures 900 are optional. As shown, in each of the source/drain trenches 700, one of the dielectric structures 900 may be formed. In accordance with some embodiments, the dielectric structure 900 may be configured to elevate or otherwise separate a subsequently formed conductive feature (e.g., a source/drain region) from the fin 404, thereby electrically isolating the conductive feature from the underlying fin 404 or substrate 302. In turn, a leakage path from one to the other of the source/drain regions through the fin 404 or substrate 302 can be advantageously eliminated. As such, performance of the FinFET 300 can be significantly improved, e.g., decreased $I_{off}$, increased $I_{on}/I_{off}$ ratio, etc.

The dielectric structure 900 may be formed by performing at least one dry or wet etching process to remove the portion of the blanket dielectric 800 (FIGS. 8A-B) but partially leave the portion in source/drain trench 700. In some embodiments, the dry or wet etching process may selectively remove the blanket dielectric 800, while leaving the gate spacer 702 substantially intact. For example, the dry or wet etching process may etch the material of the blanket dielectric 800 at a higher rate (e.g., 5 times greater) than the material of the gate spacer 702. The etching process may stop at the gate spacer 702 (e.g., 702B). As such, while a majority portion of the blanket dielectric 800 is etched away, the portion of the blanket dielectric 800 (e.g., the dielectric structure 900) that extends into the source/drain trench 700 can remain.

For example, the wet etching process can include using diluted hydrofluoric acid (DHF), and/or an amine derivative etchant (e.g., $NH_4OH$, $NH_3(CH_3)OH$, TetraMethyl Ammonium Hydroxide (TMAH), etc.). The etchant may be mixed with a select oxidizer to have a higher etching rate on the material of the blanket dielectric 800 than the respective materials of the gate spacer 702, the mask 606, and the isolation regions 502. For example, the oxidizer may be a fluoride-based acid, for example, hydrofluoric acid (HF), fluoroantimonic acid ($H_2FSbF_6$), etc.

In another example, the dry etching process includes using a plasma of reactive gas that is selected from: fluorocarbon based gas (e.g., $CF_4$, $CHF_3$, $CH_2F_2$, $CH_3F$, $C_4F_6$, $C_4F_8$), sulfur fluoride based gas (e.g., $SF_6$), oxygen, chlorine, boron trichloride, nitrogen, argon, helium, or combinations thereof. Operation conditions of the plasma process may be selected to have a higher etching rate on the material of the blanket dielectric 800 than the respective materials of the gate spacer 702, the mask 606, and the isolation regions 502. For example, the plasma process can be on the order of about 3 mTorr~about 500 mTorr with a radio frequency (RF) power in the range of about 50 watts (W)~1500 W to produce a temperature less than about 500° C. Process gas flows can vary according to the desired optimal process conditions, and examples include: (i) $CH_2F_{2=5}$ sccm~80 sccm; Ar=100 sccm~500 sccm; $O_2$=2 sccm·150 sccm; and (ii) $CH_3F$=5 sccm~50 sccm; Ar=100 sccm~500 sccm; $O_2$=2 sccm~150 sccm.

A top surface of the dielectric structure 900 may have a flat surface (as illustrated), a convex surface, a concave surface (such as dishing), or combinations thereof. The top surface of the dielectric structure 900 may be formed flat, convex, and/or concave by an appropriate etching process. In some embodiments, a profile of the top surface of the dielectric structure 900 may affect a rate or otherwise efficiency to epitaxially grow a source/drain region above the dielectric structure 900, which will be discussed below with respect to FIGS. 10A-B. In certain cases, having the top surface of the dielectric structure 900 to have a v-shape (e.g., a convex) may advantageously help the growth of the source/drain region.

As shown in FIG. 9B, the dielectric structure 900 can be extended from the surface 405 of the fin 404 to a certain point of the source/drain trench 700 to have a height, $H_1$, which can range from about 1 nanometer (nm) to 100 nm. In some embodiments, the height, $H_1$, may be controlled via various operation conditions of the etching process such as, for example, time, temperature, concentration, pressure, power, etc. In some embodiments, the height, $H_1$, may be selected to cause a top surface of the dielectric structure 900 to be vertically lower than a top surface of the extended (gate spacer) portions 702B, as illustrated in FIGS. 9A-B. In some embodiments, the height, $H_1$, may be selected to cause portions of the sidewalls of the fin 404A to be re-exposed with a height, $H_2$, as illustrated in FIG. 9A. A ratio of $H_1$ to $H_2$ may be optimally tuned to meet overall performance of the completed FinFET 300. As such, the source/drain regions can be epitaxially grown from the re-exposed sidewalls of the fin 404A and directed by the gate spacer portions 702B, which will be discussed as follows.

Figure 10A:
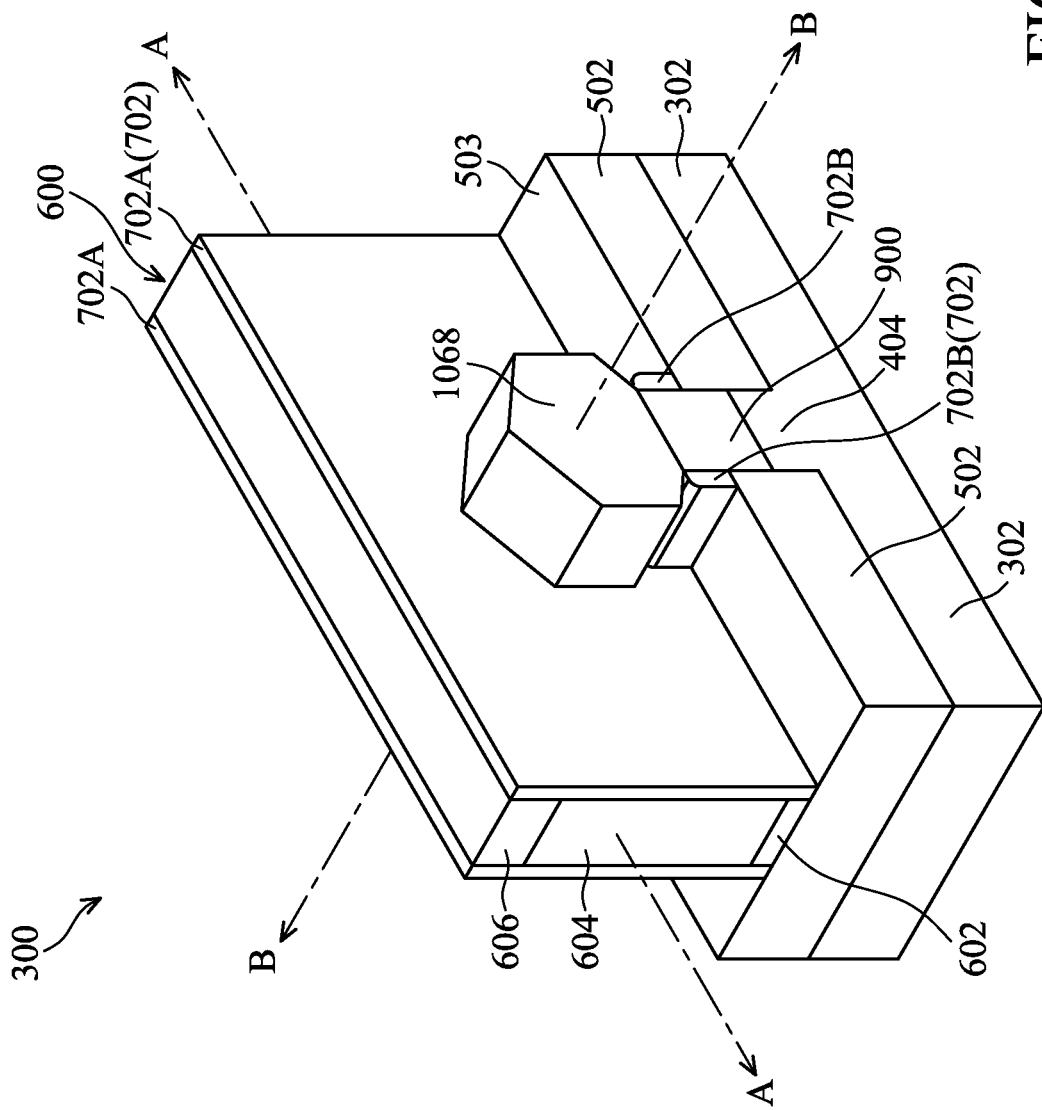
Figure 10B:
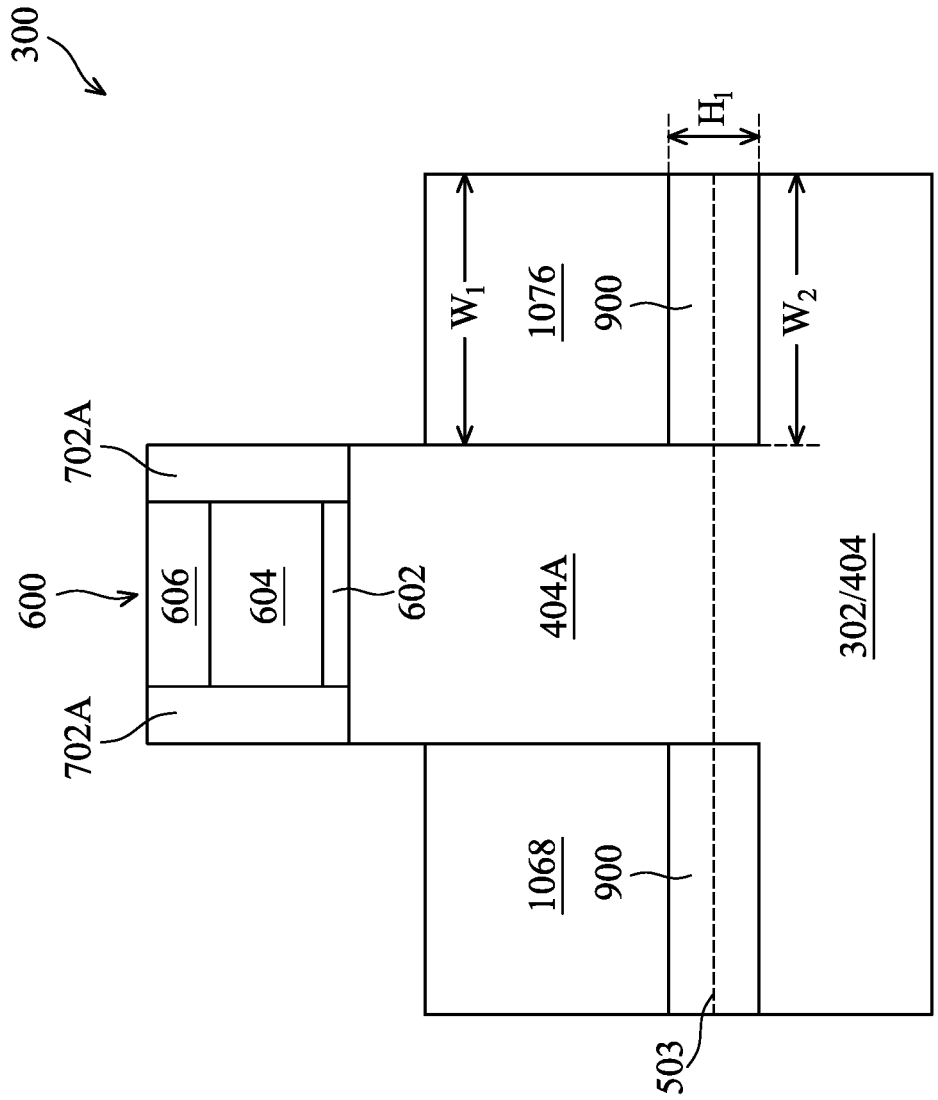

Corresponding to the operation 216 of FIG. 2, FIG. 10A is a perspective view of the FinFET 300 including an epitaxial structure 1068 at one of the various stages of fabrication, according to some embodiments, and FIG. 10B is a cross-sectional view of the FinFET 300 taken along line B-B of FIG. 10A including an epitaxial structure 1076. It is understood that the epitaxial structures are source/drain regions. The epitaxial structures 1068 and 1076 are formed on the opposite sides of the dummy gate structure 600. Further, as shown, each of the epitaxial structures 1068 and 1076 may be formed in one of the source/drain trenches 700, with one of the dielectric structures 900 vertically spaced apart from the fin 404.

The epitaxial structures 1068 and 1076 are formed by epitaxially growing a semiconductor material from the exposed sidewalls of the fin 404A (FIG. 9A) in the source/drain trenches 700, with the extended portion 702B confining or guiding the growth. Thus, it is appreciated that although the epitaxial structures 1068 and 1076 are vertically spaced apart from the fin 404, each epitaxial structure 1068 and 1076 is extended from (e.g., physically connected to) the ends of the fin 404A, which functions as the conduction channel of the FinFET 400. As shown in FIG. 10B (cut across the line B-B of FIG. 10A), the epitaxial structures 1068 and 1076 have a width, $W_1$. The width, $W_1$, may be equal to or greater than a width, $W_2$, of the dielectric structure 900, which depends on various operation conditions of the epitaxial growth. Various suitable methods can be used to epitaxially grow the epitaxial structures 1068 and 1076 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof. In some embodiments, the epitaxial structures of the adjacent fins may merge to form a continuous epitaxial source/drain region (not shown). In some embodiments, the epitaxial structure of the adjacent fins may not merge together and remain separate epitaxial structures In some embodiments, when the resulting FinFET 300 is an n-type FinFET, the epitaxial structures 1068 and 1076 may include silicon carbide (SiC), silicon phosphorous (SiP), phosphorous-doped silicon carbon (SiCP), or the like. When the resulting FinFET 300 is a p-type FinFET, the epitaxial structures 1068 and 1076 may include SiGe, and a p-type impurity such as boron or indium.

The epitaxial structures 1068 and 1076 may be implanted with dopants to form the epitaxial structures 1068 and 1076, followed by an anneal process. The implanting process may include forming and patterning masks such as a photoresist to cover the regions of the FinFET 300 that are to be protected from the implanting process. The epitaxial structures 1068 and 1076 may have an impurity (e.g., dopant) concentration in a range from about $1\times10^{19}$ $cm^{-3}$ to about $1\times10^{21}$ $cm^{-3}$. P-type impurities, such as boron or indium, may be implanted in the epitaxial structures 1068 and 1076 of a P-type transistor. N-type impurities, such as phosphorous or arsenide, may be implanted in the epitaxial structures 1068 and 1076 of an N-type transistor. In some embodiments, the epitaxial source/drain structure may be in situ doped during growth.

In some other embodiments, the extended portions 702B on the sides (along the line A-A) of each of the dielectric structures 900 may have different dimensions. For example, one of the gate spacer portions 702B may have a relatively taller height along one of the sidewalls of the dielectric structure 900, and the other of the gate spacer portions 702B may have a relatively shorter height along the other of the sidewalls of the dielectric structure 900, which may cause the corresponding epitaxial structures 1068 and 1076 to grow asymmetrically toward different sides along the line A-A. As such, the epitaxial structures 1068 and 1076 may include two portions, one of which is disposed on a first side with a relatively longer width along the line A-A, and the other of which is disposed on a second side with a relatively shorter width along the line A-A.

Figure 11A:
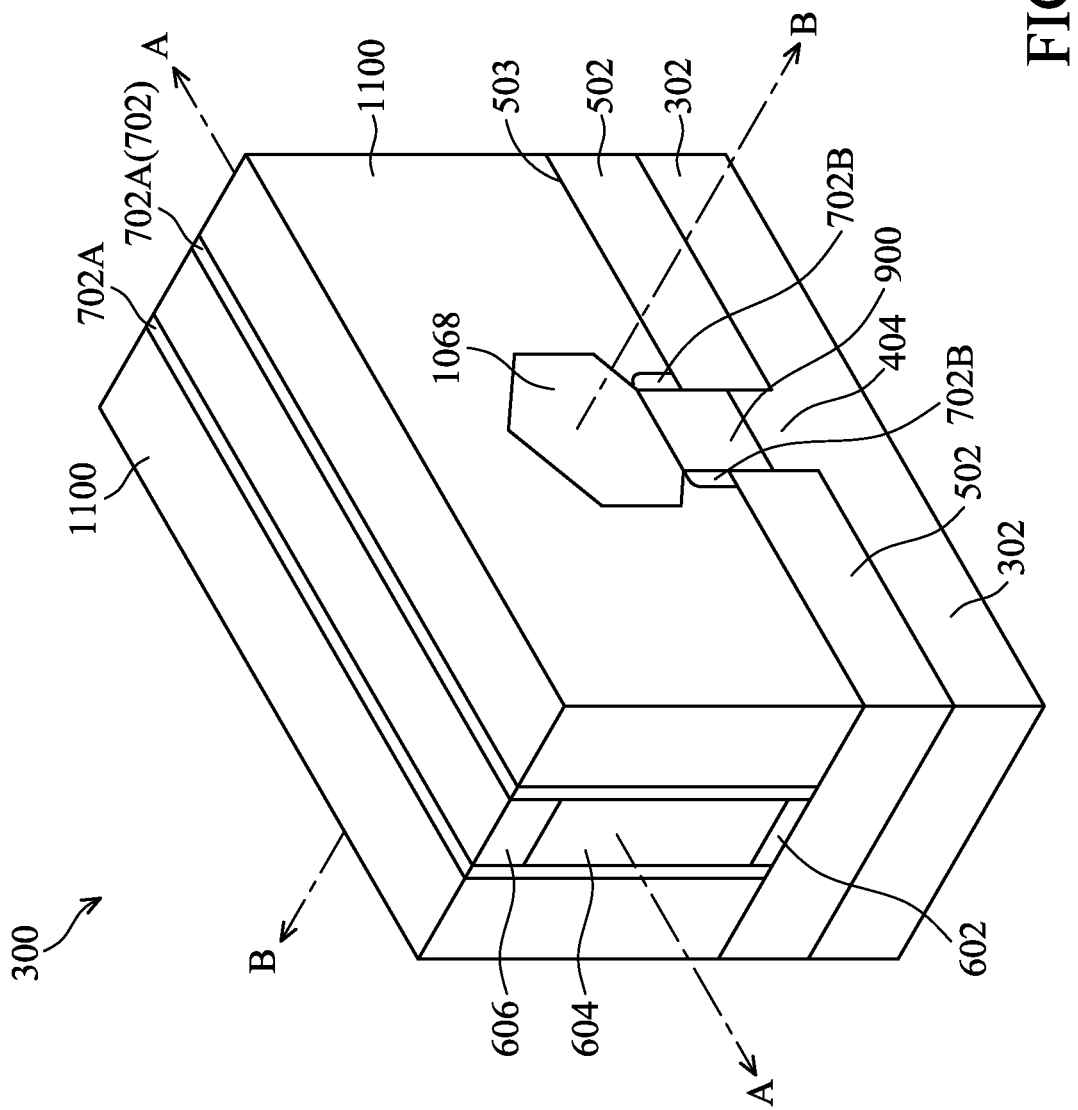
Figure 11B:
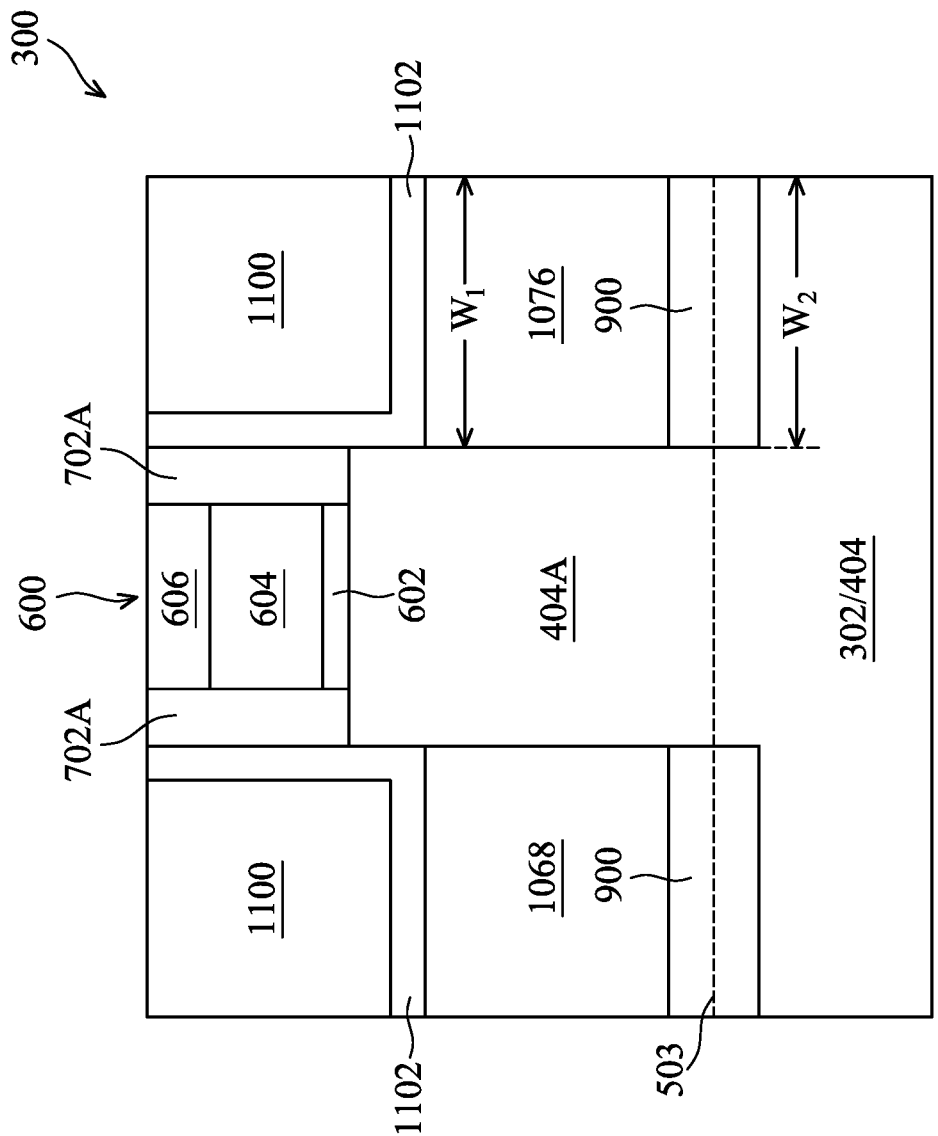

Corresponding to the operation 218 of FIG. 2, FIG. 11A is a perspective view of the FinFET 300 including an interlayer dielectric (ILD) 1100 at one of the various stages of fabrication, according to some embodiments, and FIG. 11B is a cross-sectional view of the FinFET 300 taken along line B-B of FIG. 10A. As shown, the ILD 1100 is formed on the sides of the dummy gate structure 600 (or gate spacer portions 702A) to overlay the epitaxial structures 1068 and 1076.

In some embodiments, the ILD 1100 is formed over a contact etch stop layer (CESL) 1102, as shown in the cross-sectional view of FIG. 10B. The CESL 1102 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like. In some embodiments, the CESL 1102 may be formed over a top surface of the epitaxial structure 1068 (not shown). In some embodiments, the CESL 1102 has a thickness in between about 3 and about 10 nanometers, inclusive (e.g., 3, 4, 5, 6, 7, 8, 9, and 10 nanometers).

Next, the ILD 1100 is formed over the CESL 1102 and over the dummy gate structures 600. In some embodiments, the ILD 1100 is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. After the ILD 1100 is formed, a planarization process, such as a CMP process, may be performed to achieve a level upper surface for the ILD 1100. The CMP may also remove the mask 606 (see, e.g., FIGS. 10A-B) and portions of the CESL 1102 disposed over the dummy gate structure 600. After the planarization process, the upper surface of the ILD 1100 can be level with the upper surface of the dummy gate structure 600, in some embodiments. In some embodiments, the ILD 1100 has a thickness between about 10 and about 50 nanometers, inclusive (e.g., 10, 20, 30, 40, and 50 nanometers).

Figure 12A:
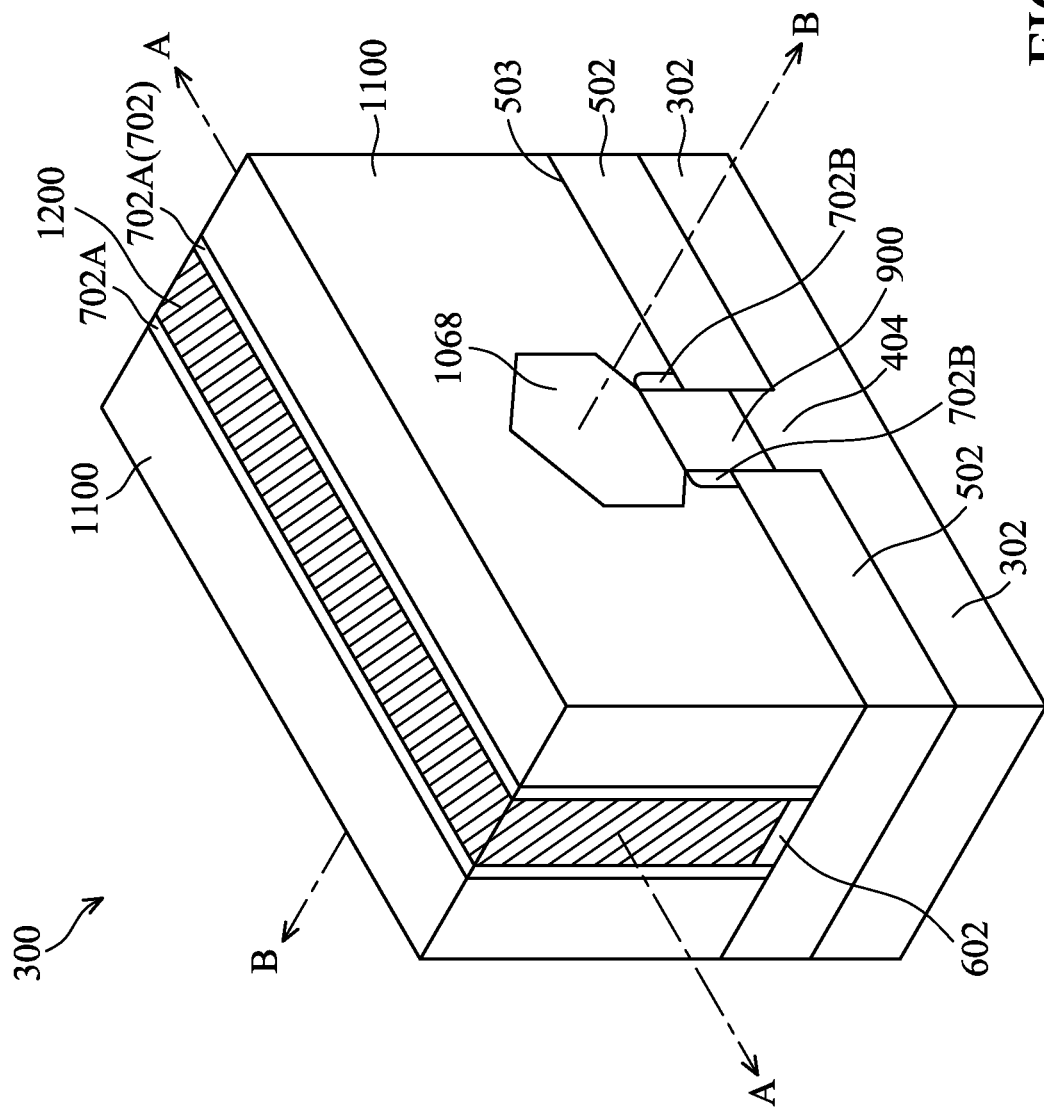
Figure 12B:
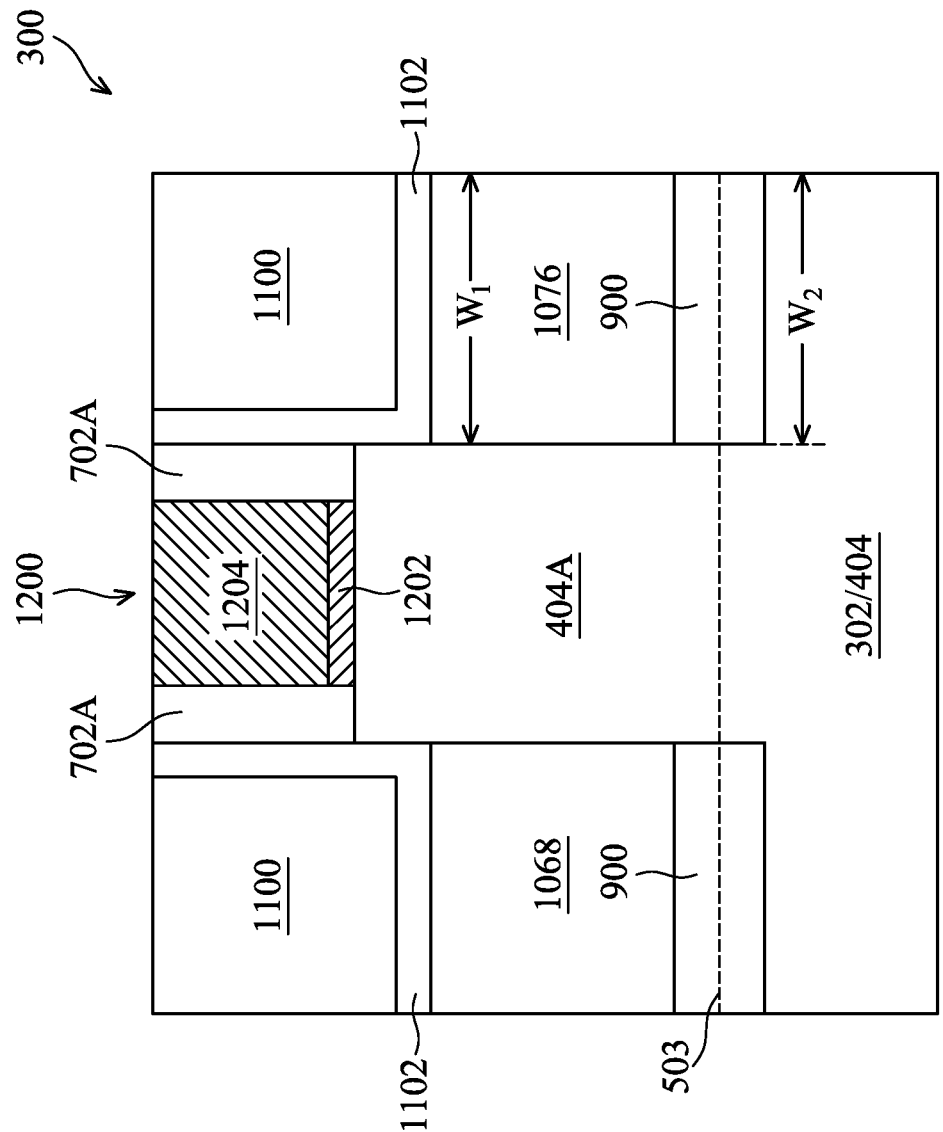

Corresponding to the operation 220 of FIG. 2, FIG. 12A is a perspective view of the FinFET 300 including an gate structure (sometimes referred to as a first metal structure) 1200 at one of the various stages of fabrication, according to some embodiments, and FIG. 12B is a cross-sectional view of the FinFET 300 taken along line B-B of FIG. 12A. An example gate-last process (sometimes referred to as replacement gate process) is performed subsequently to replace the dummy gate structure 600 with the gate structure 1200 (which may sometimes be referred to as a replacement gate structure, a metal gate structure, or an active gate structure).

In some embodiments, the gate structure 1200 may include at least one gate dielectric layer 1202 and at least one conductive gate electrode 1204, as shown in the cross-sectional view of FIG. 12B. The central portions of the fin 404A are overlaid by the conductive gate electrode 1204 with the gate dielectric layer 1202 sandwiched there between. The gate dielectric layer 1202 may include a high-k dielectric material (e.g., with a k value greater than about 4.0 or even greater than about 7.0). In such embodiments, the high-k gate dielectric layer 1202 may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k gate dielectric layer 1202 may be formed using a suitable process such as ALD, CVD, PVD, plating, or combinations thereof. The conductive gate electrode 1204 may include a metal material such as, for example, Al, Cu, W, Ti, Ta, TiN, TiAl, TiAlN, TaN, NiSi, CoSi, or combinations thereof. In some other embodiments, the conductive gate electrode 1204 may include a polysilicon material. The polysilicon material may be doped with a uniform or non-uniform doping concentration. The conductive gate electrode 1204 may be formed using a suitable process such as ALD, CVD, PVD, plating, or combinations thereof.

Figure 13A:
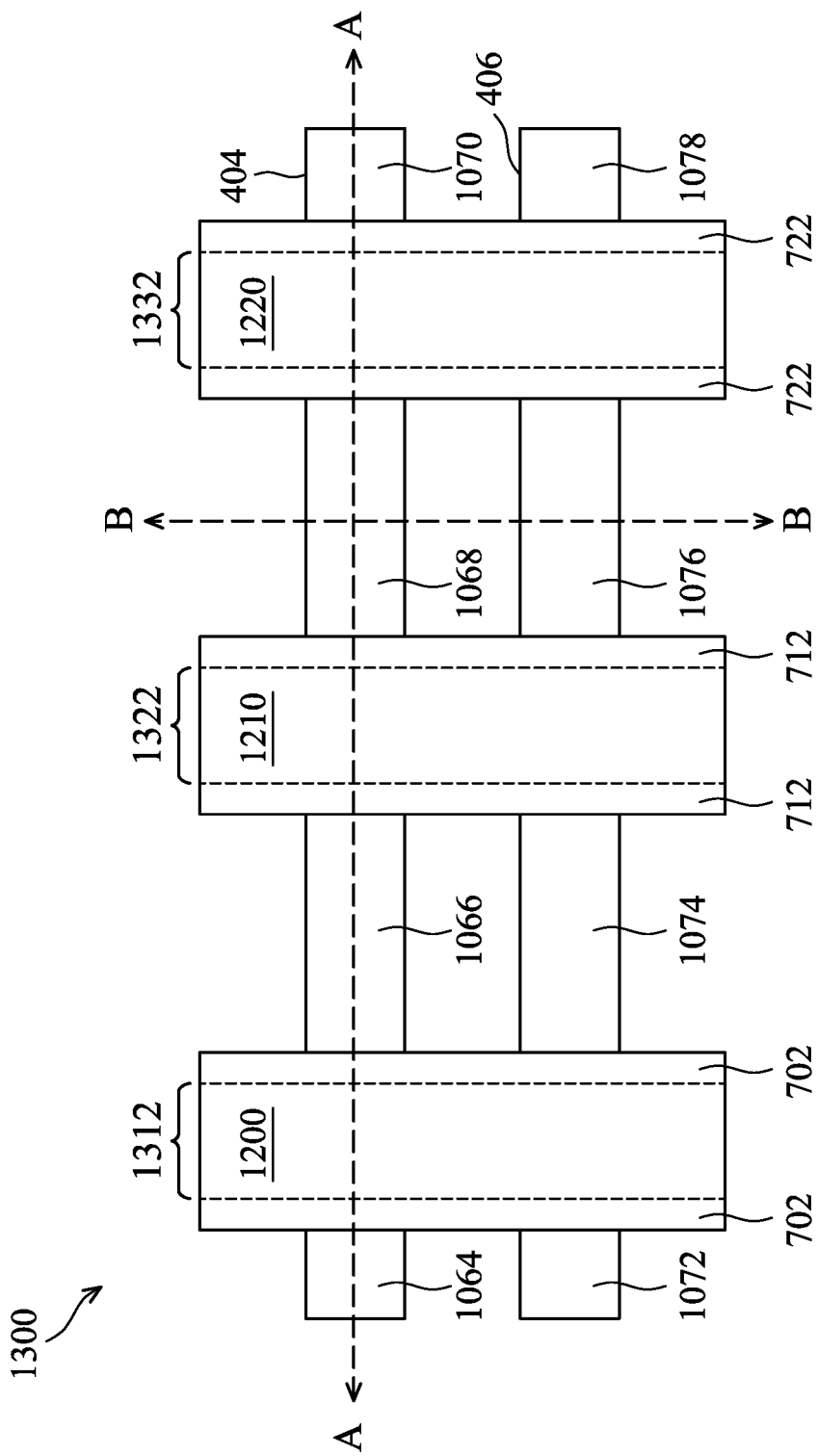

Corresponding to the operation 222 of FIG. 2, FIG. 13A is a top view of a partially formed FinFET device 1300 including three first dielectric capping layers (sometimes referred to as nitrogen-containing dielectric capping layers), 1312, 1322, and 1332, over three gate structures, 1200, 1210, and 1220, respectively. The ILD 1100 is not shown for purposes of clarity.

In some embodiments, the FinFET device 1300 includes the FinFET device 300, but with two more gates structures. The FinFET device 1300 includes but is not limited to the structures of the FinFET device 300 such as, for example, the gate structures 1200-1220 (FIGS. 12A-B), the ILD 1100 (FIGS. 11A-B), the epitaxial structures 1068 and 1076 (FIGS. 10A-B), the isolation structure 502 (FIGS. 5A-B), the fins 404-406 (FIGS. 4A-B), and the semiconductor substrate 302 (FIG. 3A-B). The FinFET device 1300 is illustrated at a greater scale, and thus, it should be understood that some of the features/structures shown above with respect to the FinFET device 300 may not be shown again in the FinFET device 1300 for example, the CESL 1102, the gate dielectric layer 1202, and the gate electrode 1204.

In various embodiments, the fins 404 and 406 each extend along a first lateral direction A-A, and the gate structures 1200, 1210, and 1220 each extend along a second lateral direction (e.g., perpendicular to the first lateral direction) and traverse the fins 404 and 406. Along its opposite sides, each of the metal gate structures includes a gate spacer. For example, a gate spacer 702 includes two portions that extend along sides of the gate structure 1200, respectively; a gate spacer 712 includes two portions that extend along sides of the gate structure 1210, respectively; and a gate spacer 722 includes two portions that extend along sides of gate structure 1220, respectively.

Each of the fins can be overlaid by one or more gate structures (and respective gate spacers) to define a number of epitaxial structures. For example, the gate structure 1200 (together with the gate spacer 702) overlays a first portion of the fin 404 to define epitaxial structures 1064 and 1066; the gate structure 1200 (together with the gate spacer 702) overlays a first portion of the fin 406 to define epitaxial structures 1072 and 1074; the gate structure 1210 (together with the gate spacer 712) overlays a second portion of the fin 404 to define epitaxial structures 1066 and 1068; the gate structure 1210 (together with the gate spacer 712) overlays a second portion of the fin 406 to define epitaxial structures 1074 and 1076; the gate structure 1220 (together with the gate spacer 722) overlays a third portion of the fin 404 to define epitaxial structures 1068 and 1070; and the gate structure 1220 (together with the gate spacer 722) overlays a third portion of the fin 406 to define epitaxial structures 1076 and 1078.

Each of the overlaid portions of the fins can have two ends coupled to one or more respective epitaxial structures (e.g., a pair of epitaxial structures). For example, the epitaxial structures 1064 and 1066 are coupled to ends of the first overlaid portion of the fin 404, respectively; the epitaxial structures 1066 and 1068 are coupled to ends of the second overlaid portion of the fin 404, respectively; the epitaxial structures 1068 and 1070 are coupled to ends of the third overlaid portion of the fin 404, respectively; the epitaxial structures 1072 and 1074 are coupled to ends of the first overlaid portion of the fin 406, respectively; the epitaxial structures 1074 and 1076 are coupled to ends of the second overlaid portion of the fin 406, respectively; and the epitaxial structures 1076 and 1078 are coupled to ends of the third overlaid portion of the fin 406, respectively.

Figure 13B:
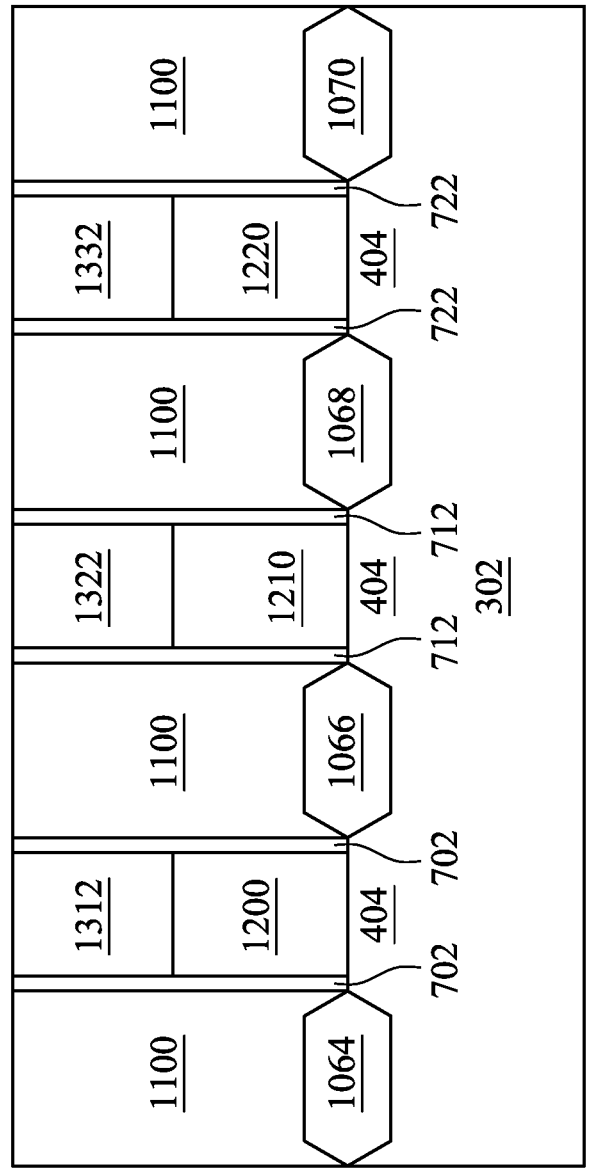
Figure 13C:
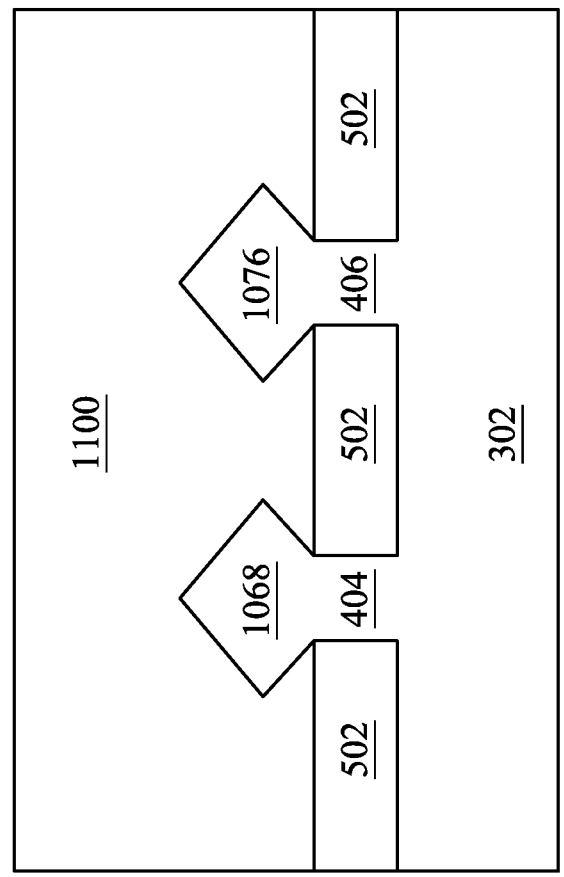

To further illustrate the FinFET device 1300, FIG. 13B illustrates its cross-sectional view cut along cross-section A-A, which extends along a lengthwise direction of the fin 404; and FIG. 13C illustrates its cross-sectional view cut along cross-section B-B, which traverses the epitaxial structures 1068 and 1076.

As shown in FIG. 13C, the fins 404 and 406, which protrude from a substrate 302, are separated apart from each other by an isolation structure 502 (sometime referred to as a shallow trench isolation (STI)) as shown in FIG. 13C. The epitaxial structures 1068 and 1076 are coupled to the fins 404 and 406, respectively. The ILD 1100 overlays the epitaxial structures while extending along sidewalls of each of the gate structures 1200-1220, as shown in FIG. 13B. Each of the gate structures 1200-1220 can include a gate dielectric (which can include one or more high-k dielectric layers) and a gate metal over the gate dielectric (which can include one or more metal layers). Such a gate dielectric and a gate metal are collectively shown as the metal gate structure for clarity of illustration.

Further, each of the gate structures (and respective gate spacers) can be overlaid by a first dielectric capping layer (sometimes referred to as a nitrogen-containing dielectric capping layer). For example in FIG. 13B, the gate structure 1200 (and the gate spacer 702) are overlaid by a first dielectric capping layer 1312; the gate structure 1210 (and the gate spacer 712) are overlaid by a first dielectric capping layer 1322; and the gate structure 1330 (and the gate spacer 722) are overlaid by a first dielectric capping layer 1332. In some embodiments, the first dielectric capping layers 1312-1332 are formed by recessing the gate structures 1200-1220 and then filling at least the respective recesses with a dielectric material, and followed by a CMP process. The CMP process can level a top surface of the first dielectric capping layers 1312-1332 with the top surface of the ILD 1100. In some embodiments, the first dielectric capping layers 1312-1332 have a thickness in between about 10 and about 60 nanometers, inclusive (i.e., 10, 20, 30, 40, 50, and 60 nanometers). In some embodiments, the first dielectric capping layers 1312-1332 are at an angle of about 60 to about 90 degrees, inclusive (e.g., 60, 65, 70, 75, 80, 85, and 90 degrees) to the top surface of the ILD 1100.

In some embodiments, the first dielectric capping layers 1312-1332 contain nitrogen. In some other embodiments, the first dielectric capping layers 1312-1332 may be, for example, SN, SiOCN, SiOC, SiON, multilayers thereof, or the like. The first dielectric capping layers 1312-1332 may be deposited or thermally grown. For example, thermal oxidation, chemical vapor deposition (CVD), or the like, may be used to form the first dielectric capping layers 1312-1332. The first dielectric capping layers 1312-1332 may be configured to protect the gate structures 1200-1220, respectively.

Figure 14B:
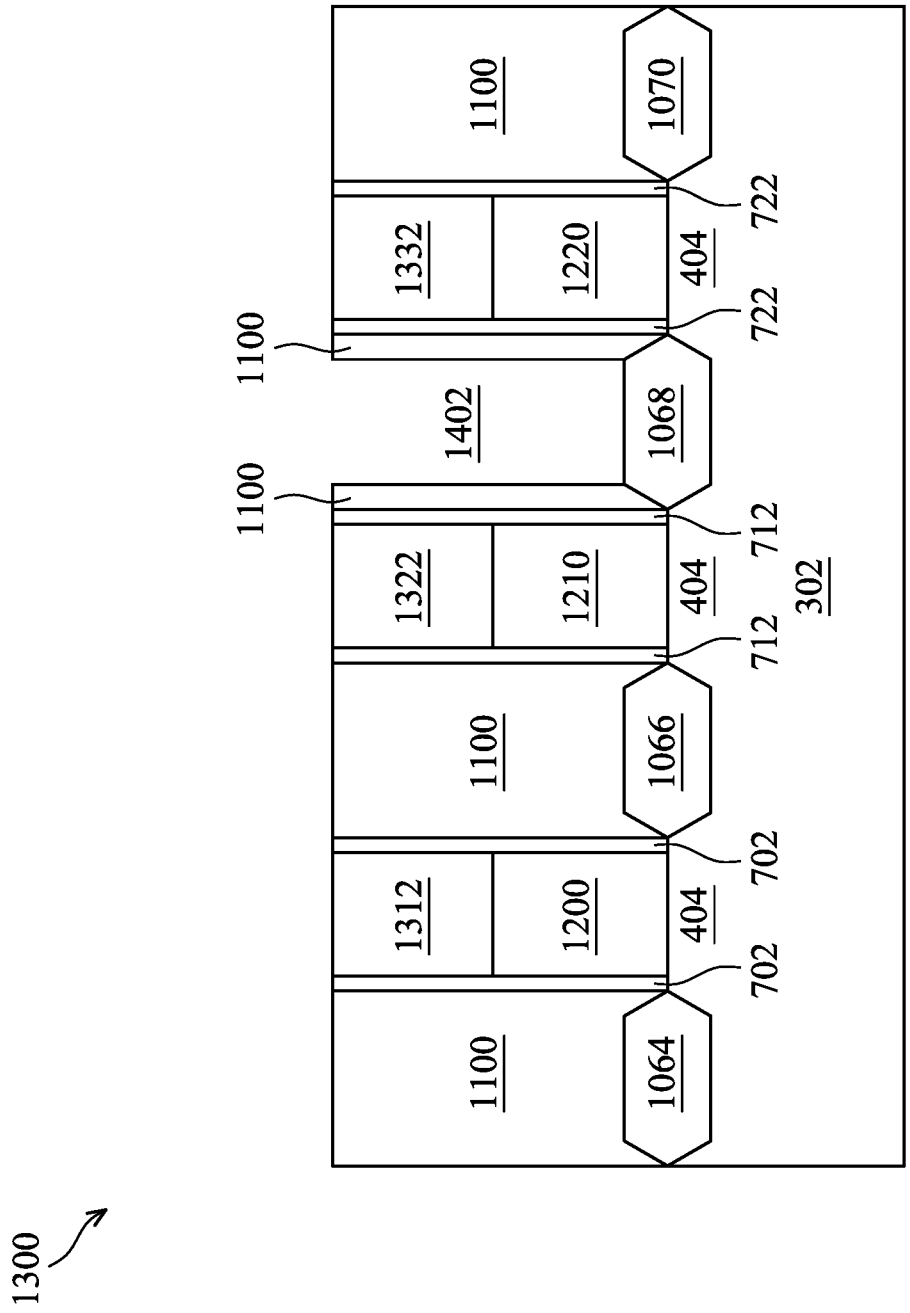
Figure 14C:
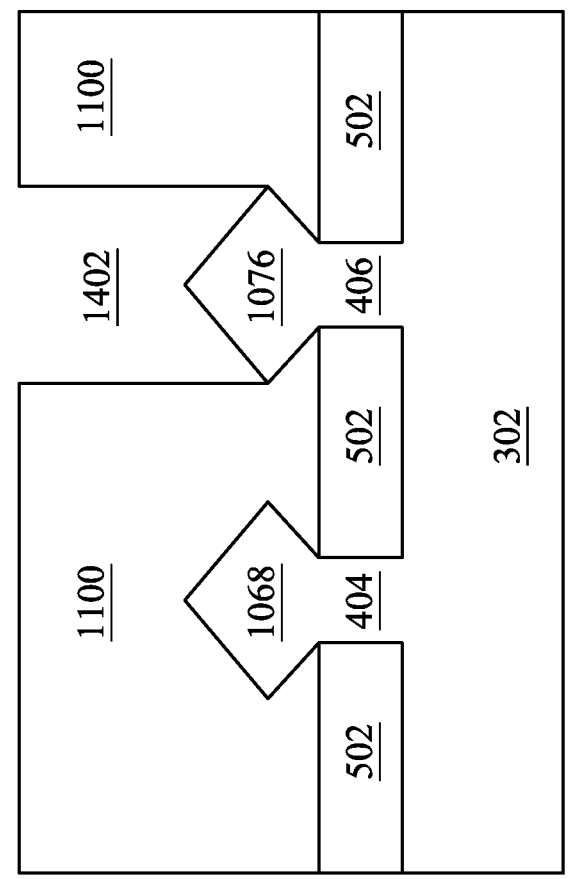

Corresponding to operations 224-228 of FIG. 2, FIG. 14A is a top view of a partially formed FinFET device 1300 that includes a recess 1402 formed through the ILD 1100. For the purposes of clarity, the gate spacers 702-722 are not shown in FIG. 14A. FIGS. 14B and 14C illustrate corresponding cross-sectional views of the FinFET device 1300 of FIG. 14A cut along cross-section A-A and cross-section B-B, respectively.

At least one photoresist layer corresponding to operation 224 (also referred to as a resist layer, photosensitive layer, patterning layer, light sensitive layer, etc.) that is responsive to an exposure process for creating patterns is formed on a top surface of the transistor device. The photoresist layer(s) may be a positive-type or negative-type resist material and may form a multi-layer structure. One example resist material is a chemical amplifier (CA) resist. Then, a photolithography process corresponding to operation 226 may be applied to the photoresist layer(s). The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the photoresist layer while protecting one or more other portions of the photoresist layer. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Next, corresponding to operation 228, the recess 1402 may be formed in the ILD 1100 through an etching process, including various dry etching, wet etching, and/or other etching methods (e.g., reactive ion etching). In some embodiments, the recess 1402 may be formed to expose the top surface of an epitaxial structure. In some embodiments, the recess 1402 is vertically sandwiched between two sections if the ILD 1100, as shown in FIG. 14B. In some embodiments, the recess 1402 is formed in contact vertically with the gate spacer 712 (not shown). The face of recess 1402 may be a rectangular shape as shown in FIG. 14B-C, but the face of recess 1402 is not limited to a rectangular shape. In such embodiments, the width of the recess 1402 along cross section A-A may be between about 5 and about 35 nanometers, inclusive (e.g. 5, 10, 15, 20, 25, 30, and 35 nanometers). In such embodiments, the length of the recess 1402 along cross-section B-B may be between about 5 and about 105 nanometers, inclusive (e.g. 5, 15, 25, 35, 45, 55, 65, 75, 85, 95, and 105 nanometers). The face of the recess 1402 may be formed in the shape of a triangle, trapezoid, circle, rectangle, or other combination of shapes thereof. In some embodiments, the angle of the sidewalls of the recess 1402 may be between about 85 and about 90 degrees, inclusive (e.g. 85, 86, 87, 88, 89, and 90 degrees). The top surface of the epitaxial structure 1068 is shown to be exposed in FIG. 14B, but it is understood that the recess may be formed to expose the top surface of any epitaxial structure. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$, $C_4F_6$, $C_4F_8$), chlorine-containing gas (e.g., $Cl_2$, and/or $BCl_3$), bromine-containing gas (e.g., HBr), other suitable gases and/or plasmas, or combinations thereof. After the etching process, the remaining photoresist layer(s) are removed by any suitable process, including a photoresist stripping process. It is understood that multiple photoresist layers may be simultaneously or independently removed.

Figure 15A:
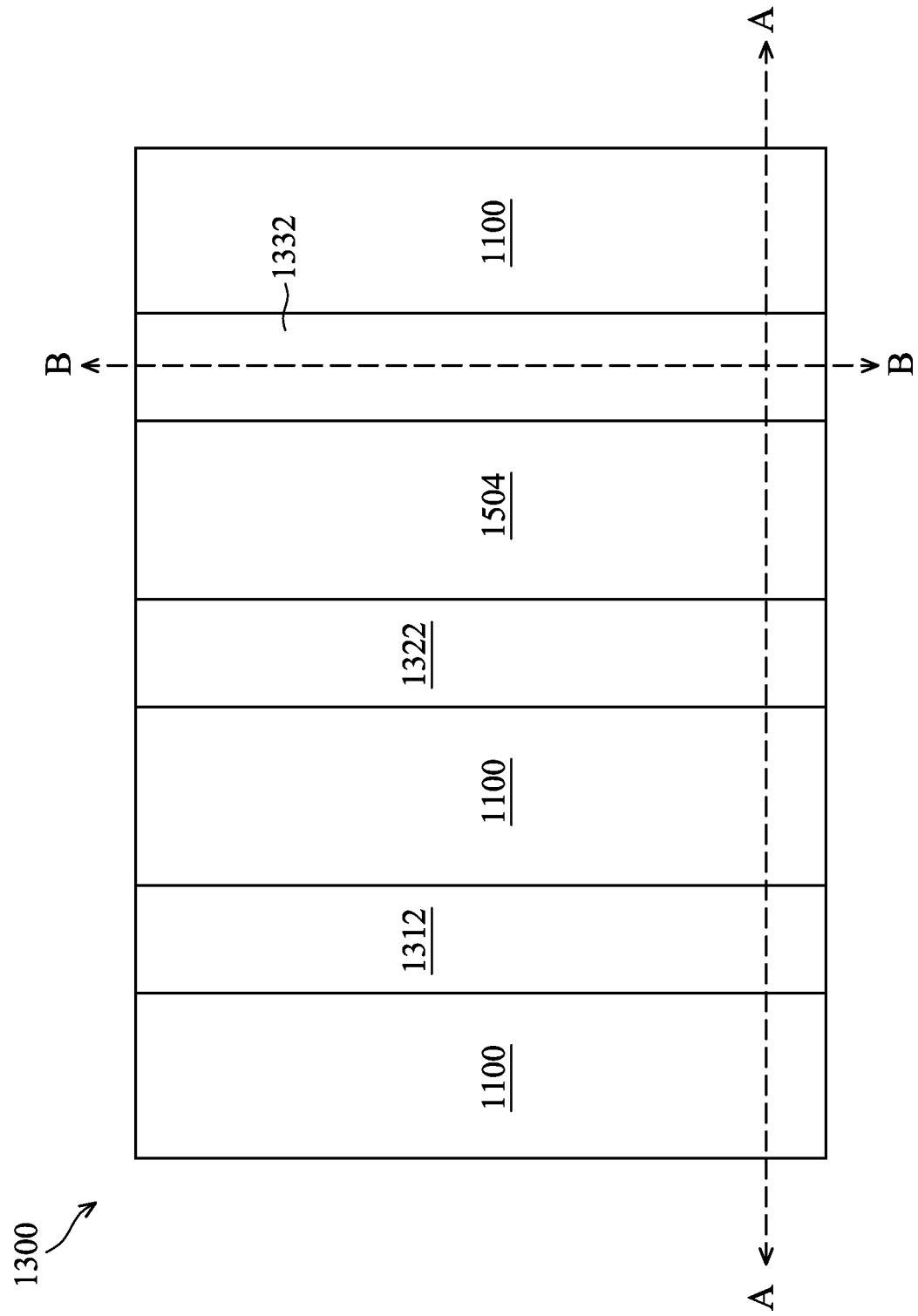
Figure 15B:
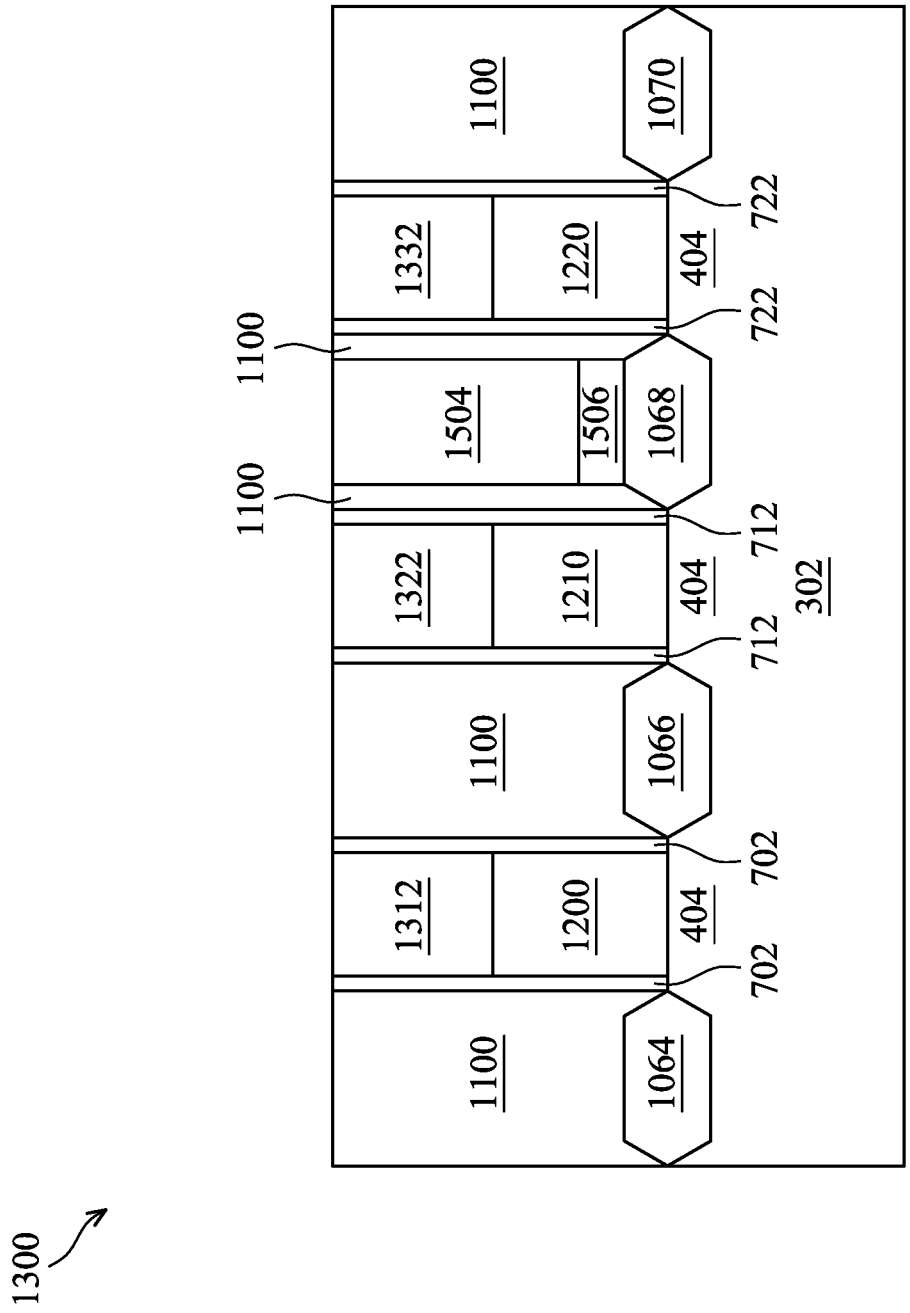
Figure 15C:
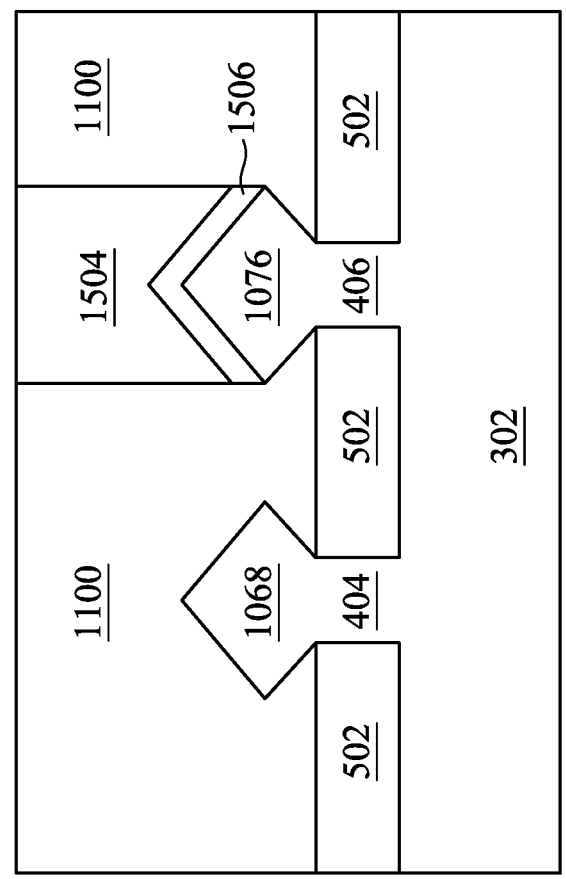

Corresponding to operation 230 in FIG. 2, FIG. 15A is a top view of a partially formed FinFET device 1300 including a first interconnect structure (sometimes referred to as a second metal structure) 1504 formed by filling in the recess 1402 (FIGS. 14A-C). FIGS. 15B and 15C illustrate corresponding cross-sectional views of the partially formed FinFET device 1300 of FIG. 15A cut along cross-section A-A and cross-section B-B, respectively. For the purposes of clarity, the gate spacers 702-722 are not shown.

The first interconnect structure 1504 may be formed by filling the recess 1402 with a metal material, followed by a CMP process to remove any insulation materials which corresponds to operation 232 in FIG. 2. The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the first interconnect structure 1504. In some embodiments, the first interconnect structure 1504 does not contain nitrogen. The first interconnect structure 1504 is disposed on the top surface of an epitaxial structure such as 1068 and is electrically coupled with said surface, as shown in FIG. 15B. The first interconnect structure 1504 extends along the direction A-A as shown in FIG. 15A. In some embodiments, the first interconnect structure 1504 includes the same shape and dimensions as the recess 1402 (FIGS. 14A-C). It is understood that a FinFET device may include multiple first interconnect structures or that the first interconnect structure can be electrically coupled to any epitaxial structure. In various embodiments, the first interconnect structure 1504 may be part of a middle-end-of-line (MEOL) interconnection network, where such interconnect structures are sometimes referred to as "MDs." In some embodiments, the interconnect structure may further comprise a silicide layer 1506 disposed in between the epitaxial structure 1068 and the first interconnect structure 1504, as shown in FIG. 15B-C. The silicide layer 1506 reduces the contact resistance of the epitaxial structure 1068 and the first interconnect structure 1504. The silicide layer 1506 may include a mixture of metal and semiconductor materials such as platinum silicides, titanium silicides, cobalt silicides, nickel silicides, tungsten silicides, molybdenum silicides, tantalum silicides, other metallic silicides, germanides, polycides, salicides, combinations thereof, multi-layers thereof, alloys thereof, or the like. The silicide layer 1506 is formed before the first interconnect structure 1504. The silicide layer 1506 may be formed from sputtering a metal film on a silicon wafer surface using a method such as but not limited to PVD, heating the silicon wafer in order to react the silicon and the metal to form a metallic silicide, and removing the metal film. In some embodiments, the silicide layer 1506 is optional. It is understood that a FinFET device may include multiple silicide layers in between multiple first interconnect structures and epitaxial structures.

In some embodiments, the first interconnect structure 1504 has a contact width with the silicide 1506 or the epitaxial structure 1068 along the first cross-section A-A of between about 10 and about 30 nanometers, inclusive (e.g., 10, 15, 20, 25, and 30 nanometers). In some embodiments, the first interconnect structure 1504 has a contact length with the silicide 1506 or the epitaxial structure 1068 along the second cross-section B-B of between about 10 and about 100 nanometers, inclusive (e.g., 10, 20, 30, 40, 50, 60, 70, 80, 90, and 100 nanometers). In some embodiments, the first interconnect structure 1504 is at an angle of between about 86 and 89 degrees to the ILD 1100 (i.e., 86, 87, 88, and 89 degrees).

Figure 16A:
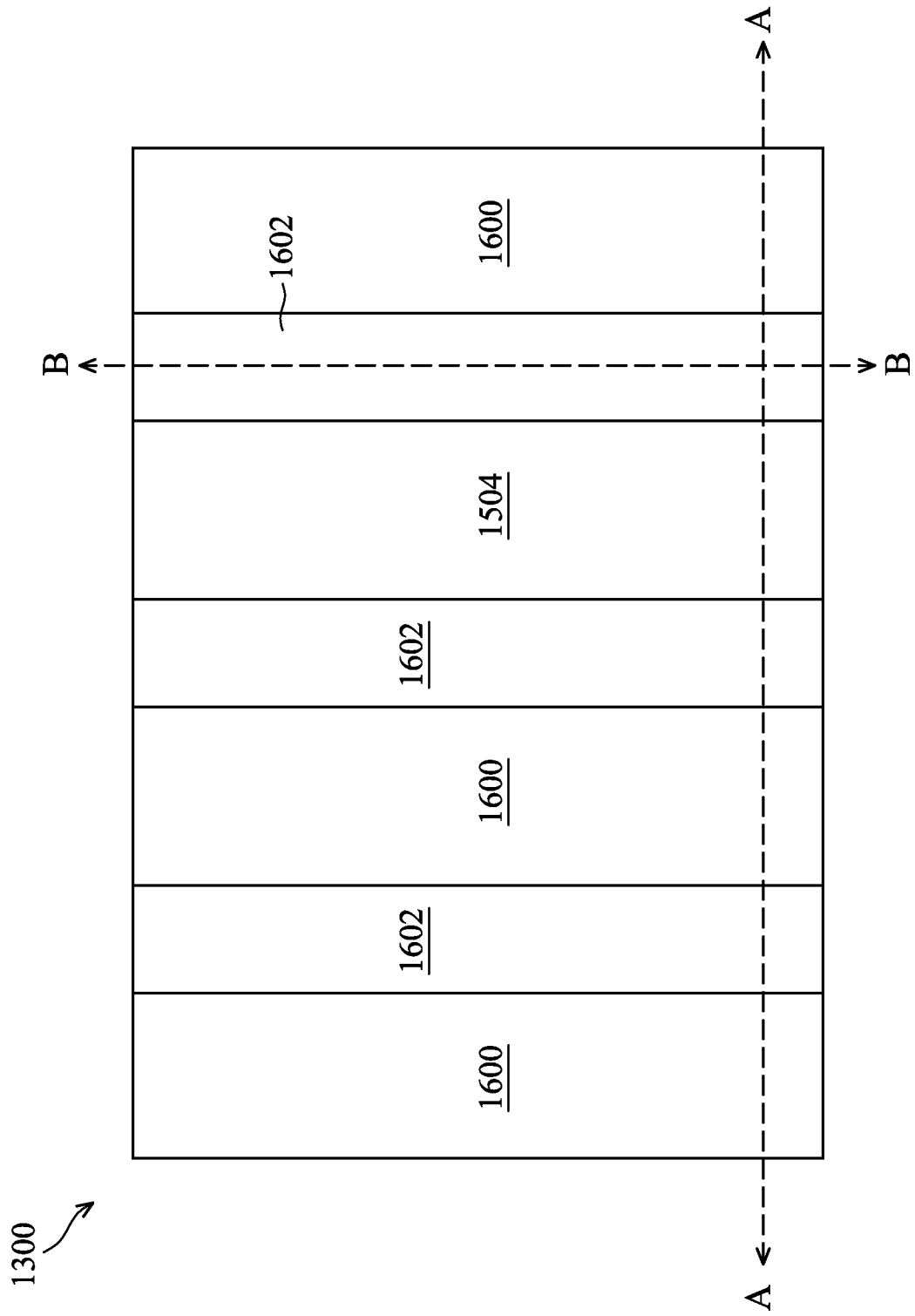
Figure 16B:
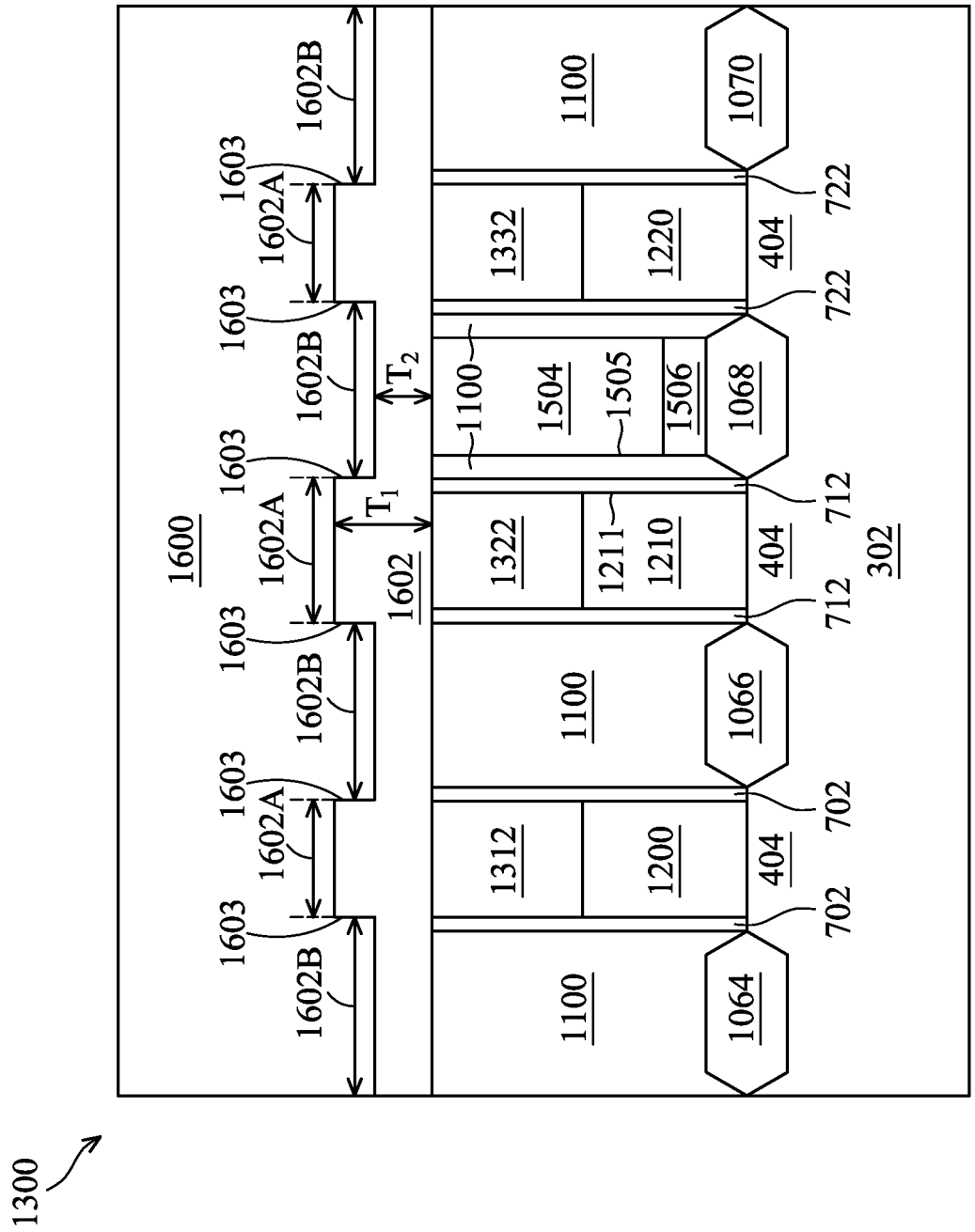
Figure 16C:
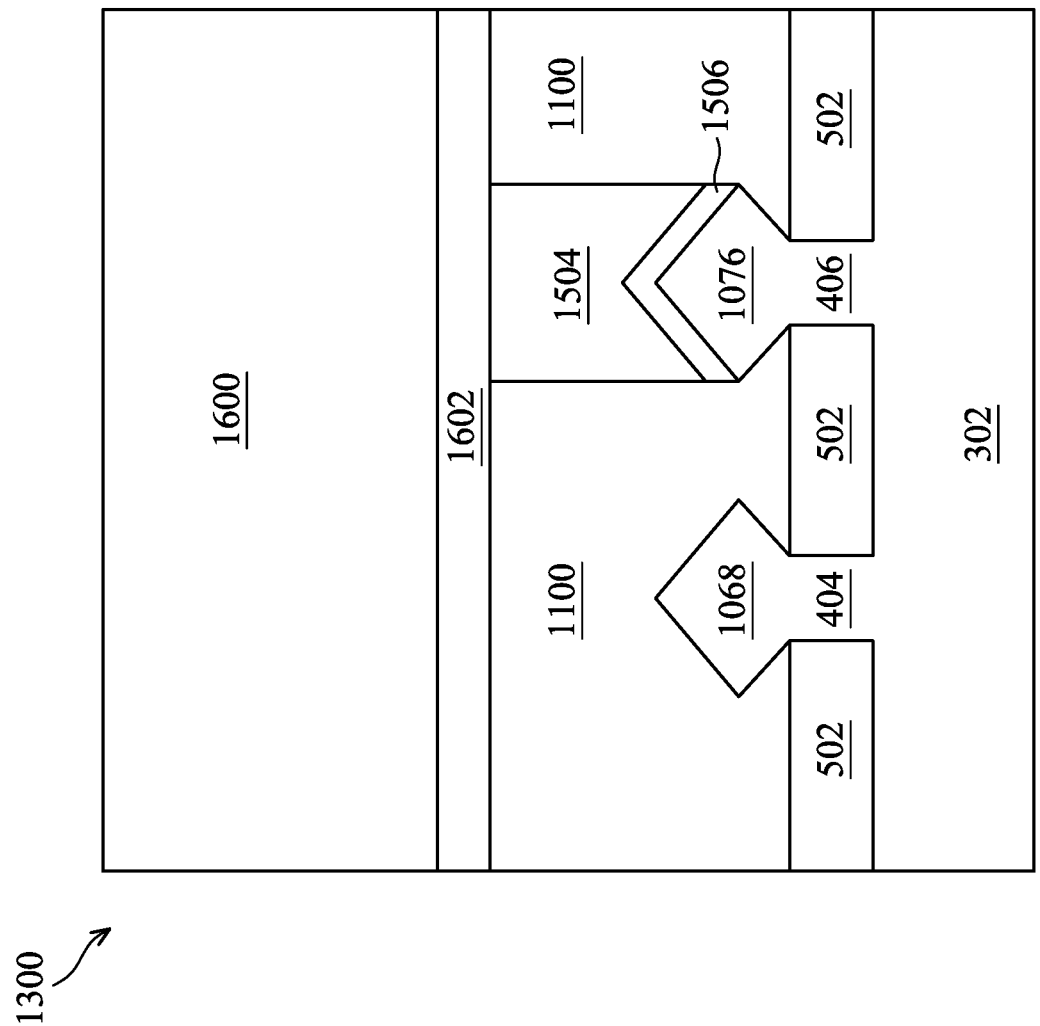

Corresponding to operations 234-236 in FIG. 2, FIG. 16A is a top view of a partially formed FinFET device 1300 including a second ILD 1600. For the purposes of clarity, the second ILD 1600 and a second portion of the dielectric layer 1602 are not shown above the first interconnect structure in FIG. 16A. FIGS. 16B and 16C illustrate corresponding cross-sectional views of the partially formed FinFET device 1300 of FIG. 16A cut along cross-section A-A and cross-section B-B, respectively.

The dielectric layer 1602 may comprise a first portion 1602A with a first thickness $T_1$ and the second portion 1602B with a second thickness $T_2$ where the first portion 1602A is selectively disposed on the first capping dielectric layer 1322, as shown in FIG. 16B. The first thickness $T_1$ may be greater than the second thickness $T_2$, as shown in FIG. 16B. The ratio of the first thickness $T_1$ to the second thickness $T_2$ may be greater than 2. In some embodiments, the first thickness $T_1$ may be between about 1 to about 10 nanometers, inclusive (i.e., 1, 2, 3, 4, 5, 6, 7, 8, 9, and 10 nanometers). In some embodiments, the first portion 1602A may include a width along the first cross-section A-A that is between about 10 and about 30 nanometers, inclusive (i.e., 10, 15, 20, 25, and 30 nanometers). In some embodiments, the first portion 1602A may include a length along the second cross-section B-B that is between about 10 and about 100 nanometers, inclusive (i.e., 10, 20, 30, 40, 50, 60, 70, 80, 90, and 100 nanometers). The first portion 1602A and the second portion 1602B may form a stair 1603. In some embodiments, the stair 1603 is about 60 to about 90 degrees, inclusive (e.g., 60, 65, 70, 75, 80, 85, and 90 degrees) to the top surface of the ILD 1100. In some embodiments, the stair 1603 is disposed along either a sidewall of the gate structure 1211 or a sidewall of the first interconnect structure 1505. In such embodiments, the sidewall of the gate structure 1211 is located opposite the gate structure 1210 from the first interconnect structure 1504, as shown in FIG. 16B. In such embodiments, the sidewall of the first interconnect structure 1505 is located opposite the first interconnect structure 1504 from the gate structure 1210. The dielectric layer 1602 may be an integrally formed one-piece structure. In some embodiments, the dielectric layer 1602 may be formed in as multiple pieces coupled together.

The dielectric layer 1602 includes contains nitrogen. For example, the dielectric layer 1602 is boron nitride (BN). Boron nitride is an excellent insulator, is a low-k dielectric material (e.g., with a k value less than about 7.0 or even less than about 4.0), and has a selective deposition capability. Boron nitride selectively deposits on silicon nitride (SiN) or silicon surfaces (which form a non-volatile by-product) and does not deposit on oxide surfaces (which form a volatile by-product). In some embodiments, the boron nitride selectively deposits on the nitrogen-containing materials. In some embodiments, the first portion 1602A selectively deposits on nitrogen containing materials such as the first dielectric capping layers 1312-1332, and the second portion 1602B selectively deposits on materials that do not contain nitrogen such as the ILD 1100 and the first interconnect structure 1504. It should be understood that any suitable deposition method, such as thermal oxidation, chemical vapor deposition (CVD), or the like, may be used to form the dielectric layer 1602. In some other embodiments, the dielectric layer 1602 may include boron carbide, boron oxide ($B_2O_3$), SiN, $C_xF_y$ polymer where x and y are greater than 0, or the like.

Corresponding to operation 236, the second ILD 1600 is formed over the dielectric layer 1602 as shown in FIGS. 16A-C. In some embodiments, the second ILD 1600 is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. After the second ILD 1600 is formed, a planarization process, such as a CMP process, may be performed to achieve a level upper surface for the second ILD 1600. In some embodiments, the second ILD 1600 may have a thickness in between about 10 and about 50 nanometers, inclusive (e.g., 10, 20, 30, 40, and 50 nanometers).

Figure 17A:
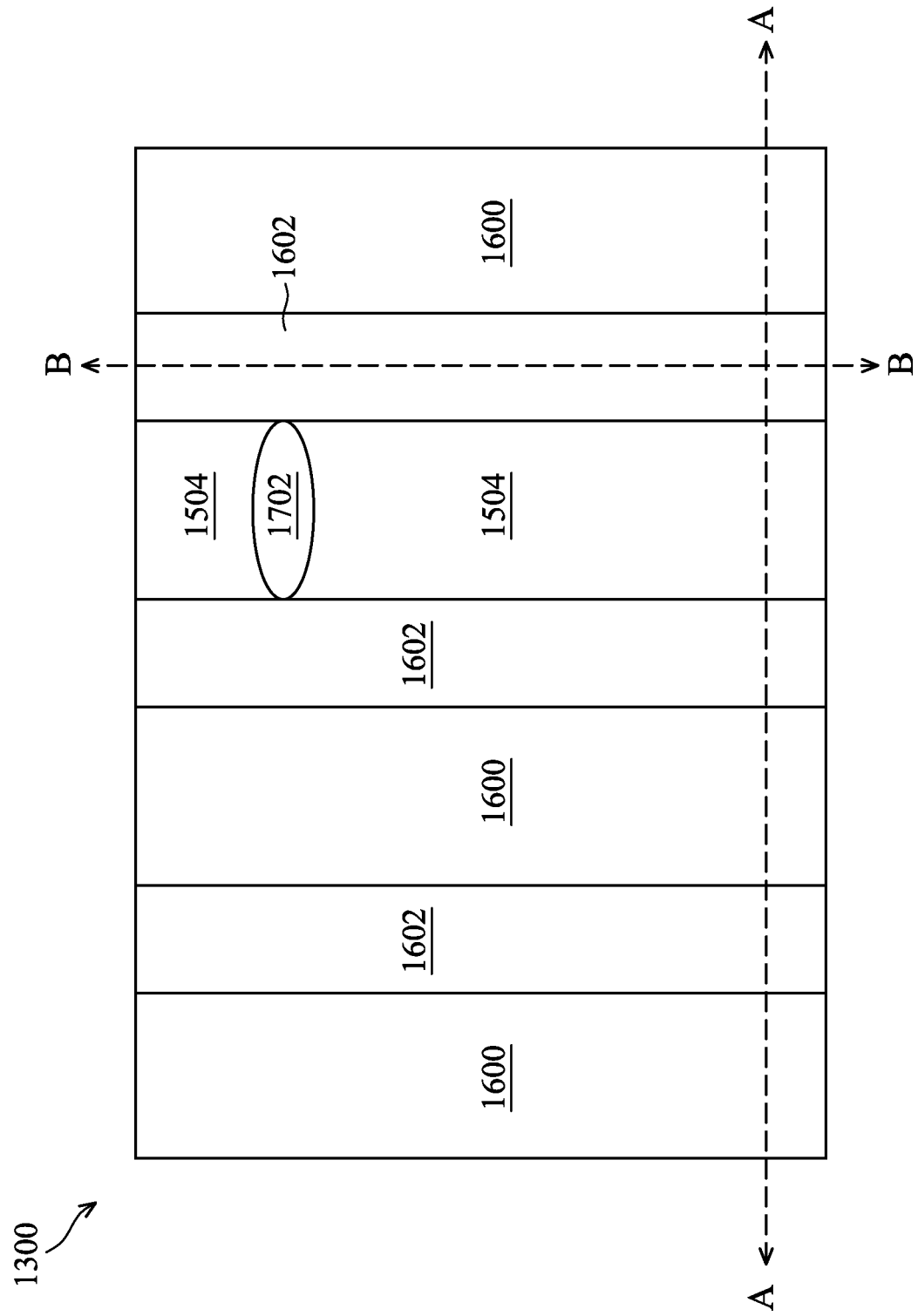
Figure 17B:
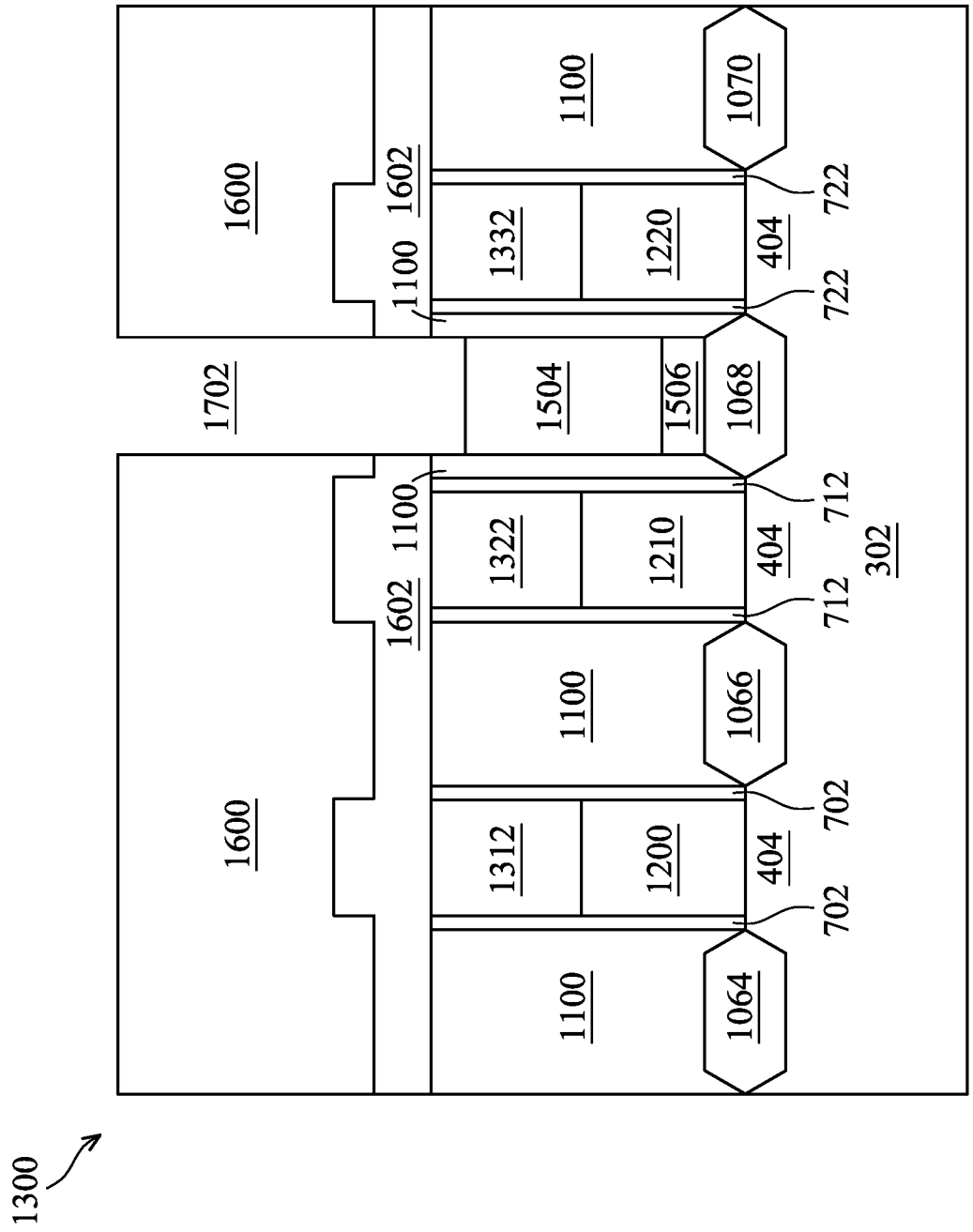
Figure 17C:
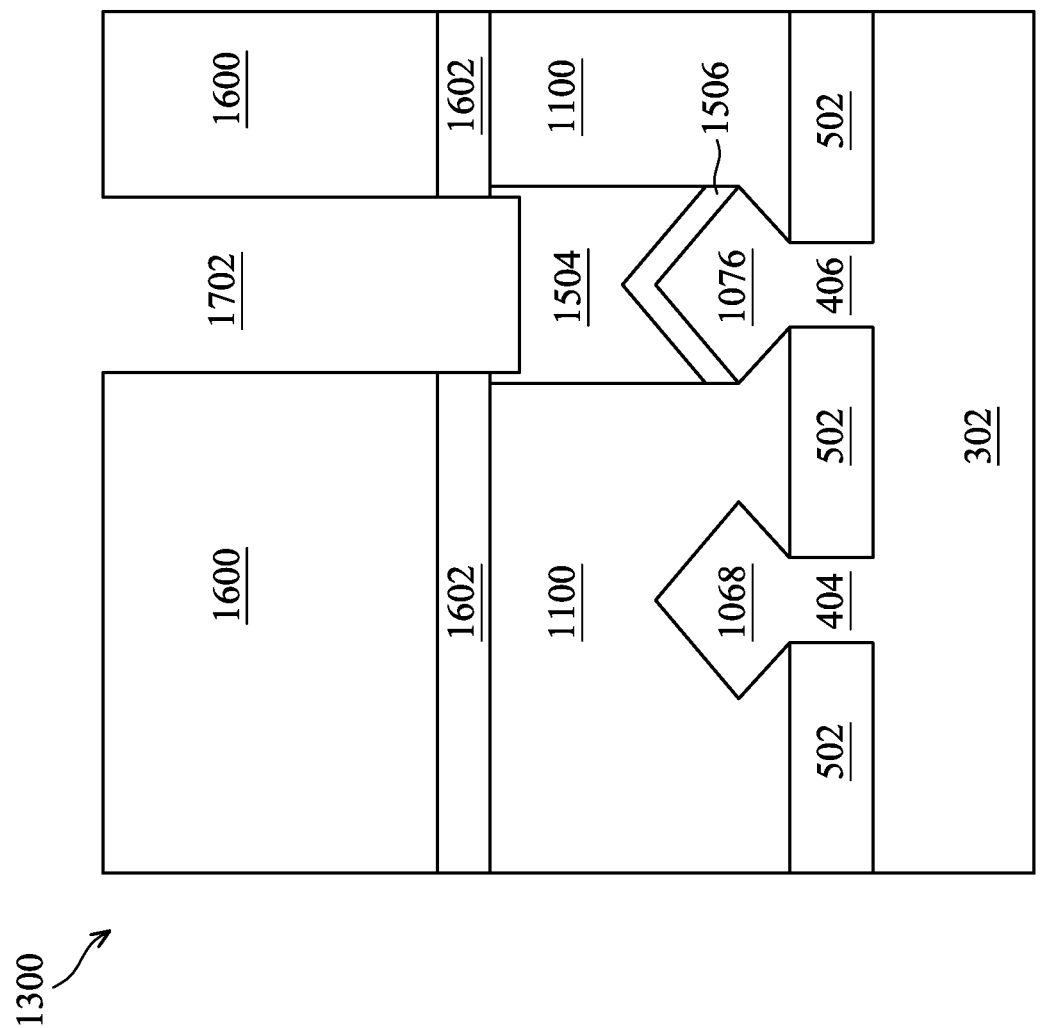

Corresponding to operations 238-242 in FIG. 2, FIG. 17A is a top view of a partially formed FinFET device 1300 that includes a recess 1702 formed through the second ILD 1600. FIGS. 17B and 17C illustrate corresponding cross-sectional views of the partially formed FinFET device 1300 of FIG. 17A cut along cross-section A-A and cross-section B-B, respectively.

At least one photoresist layer (also referred to as a resist layer, photosensitive layer, patterning layer, light sensitive layer, etc.) that is responsive to an exposure process for creating patterns is formed on a top surface of the transistor device. The photoresist layer corresponding to operation 238 may be a positive-type or negative-type resist material and may form a multi-layer structure. One example resist material is a chemical amplifier (CA) resist. Then, a photolithography process corresponding to operation 240 may be applied to the photoresist layer(s). The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the photoresist layer while protecting one or more other portions of the photoresist layer. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Then, corresponding to operation 242, the recess 1702 may be formed in the second ILD 1600 through an etching process, including various dry etching, wet etching, and/or other etching methods (e.g., reactive ion etching). In some embodiments, the recess 1702 may formed to expose the top surface of the first interconnect structure 1504. The recess 1702 may be a rectangular shape as shown in FIG. 17B-C, but the recess 1702 is not limited to a rectangular shape. In such embodiments, the width of the recess 1702 along cross section A-A may be between about 5 and about 35 nanometers, inclusive (e.g. 5, 10, 15, 20, 25, 30, and 35 nanometers). In such embodiments, the length of the recess 1702 along cross-section B-B may be between about 5 and about 105 nanometers, inclusive (e.g. 5, 15, 25, 35, 45, 55, 65, 75, 85, 95, and 105 nanometers). The face of the recess 1702 may be formed in the shape of a rectangle, triangle, trapezoid, circle, or other combination of shapes thereof. In some embodiments, the angle of the sidewalls of the recess 1702 may be between about 85 and about 90 degrees, inclusive (e.g. 85, 86, 87, 88, 89, and 90 degrees). In some embodiments, the recess 1702 may be formed to form a recess in the first interconnect structure 1504, as shown in FIG. 17B. The top surface of the first interconnect structure 1504 is shown to be exposed in FIG. 17B, but it is understood that the recess may be formed to expose the top surface of any interconnect structure. In some embodiments, the recess 1702 may not be perfectly aligned with the first interconnect structure 1504 (not shown). The recess 1702 does not extend along the entire length of first interconnect structure 1504 as shown in FIG. 17A. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$), chlorine-containing gas (e.g., $Cl_2$, and/or $BCl_3$), bromine-containing gas (e.g., HBr), other suitable gases and/or plasmas, or combinations thereof. After the etching process, the remaining photoresist layer(s) are removed by any suitable process, including a photoresist stripping process. It is understood that multiple photoresist layers may be simultaneously or independently removed.

Figure 18A:
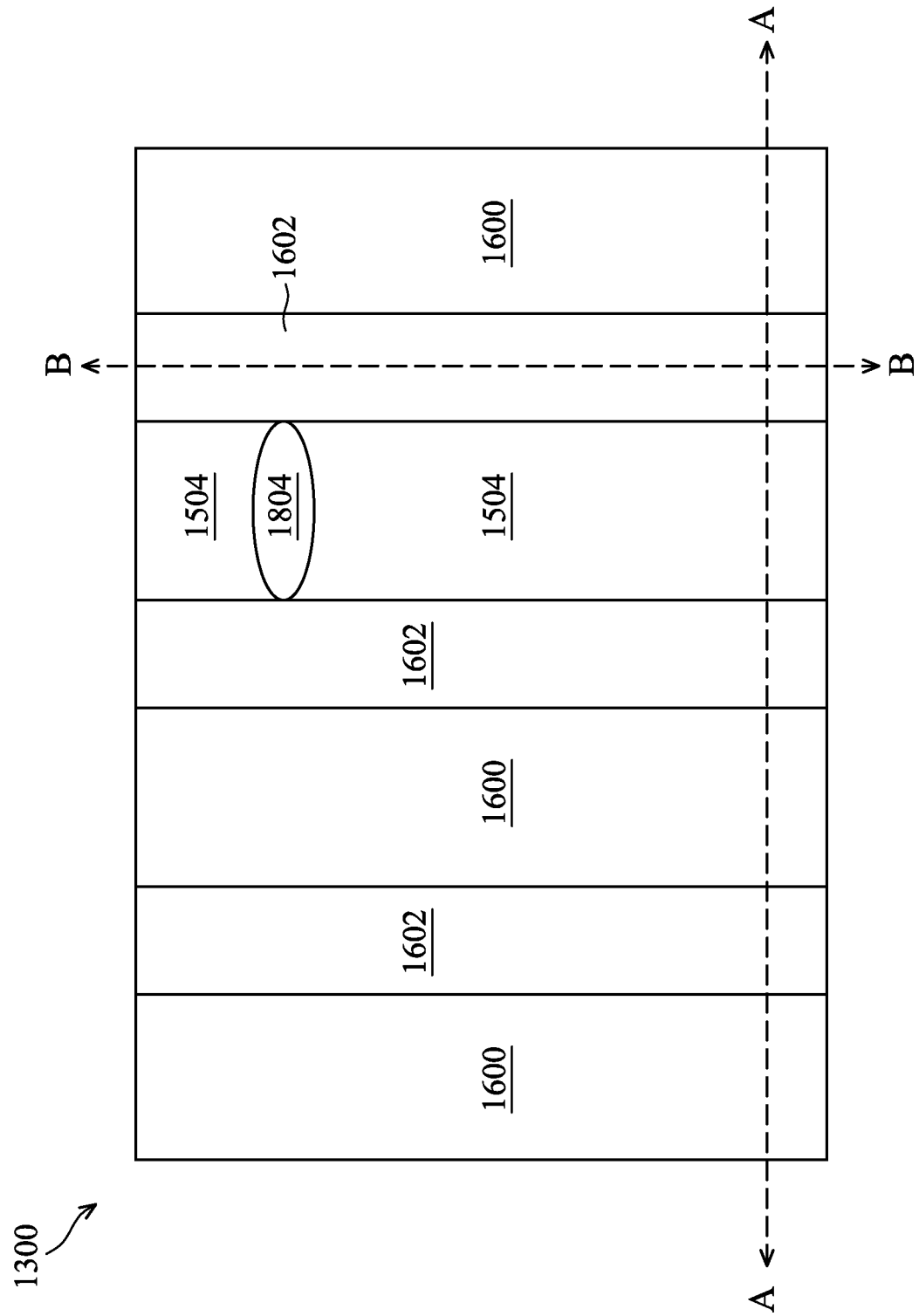
Figure 18B:
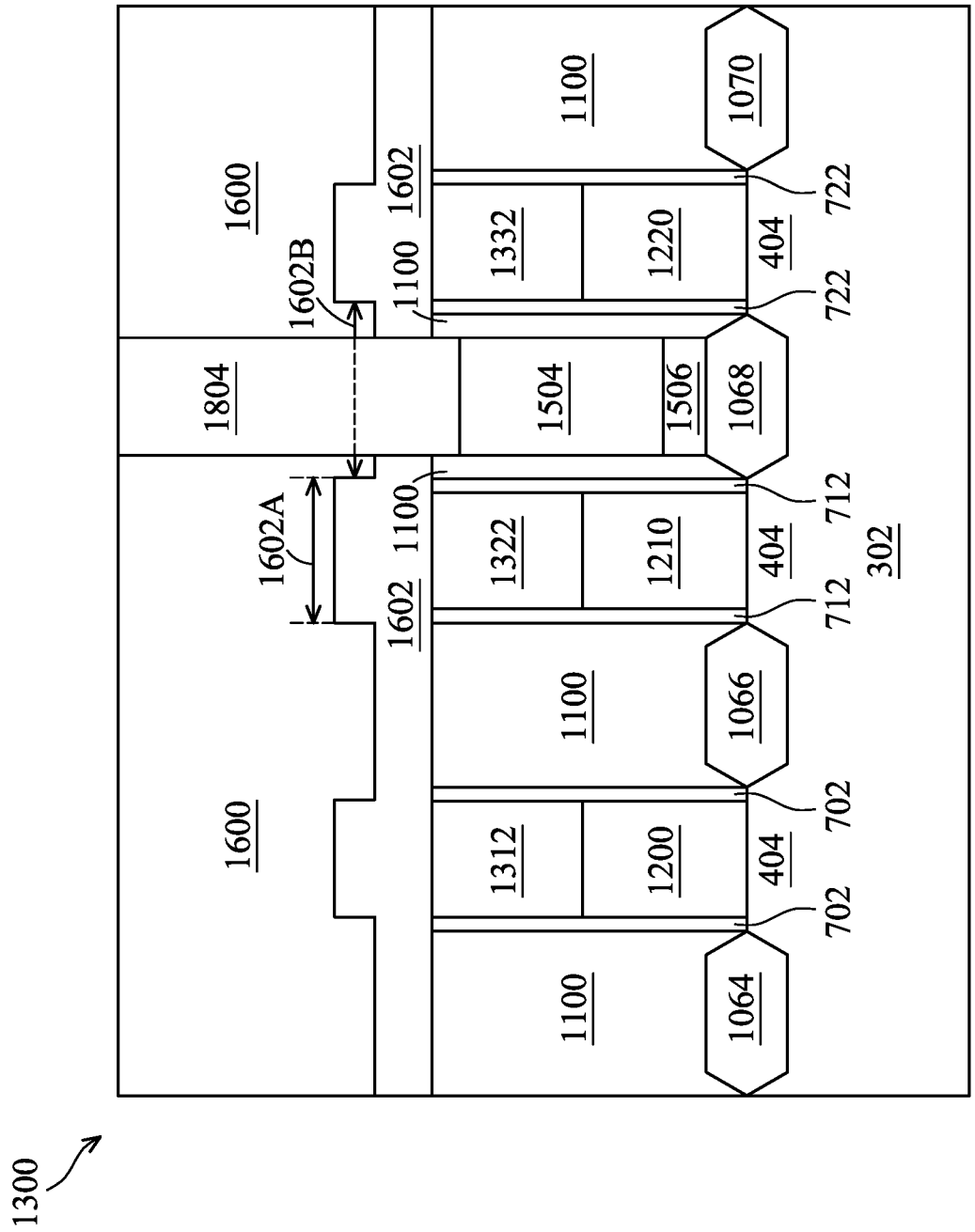
Figure 18C:
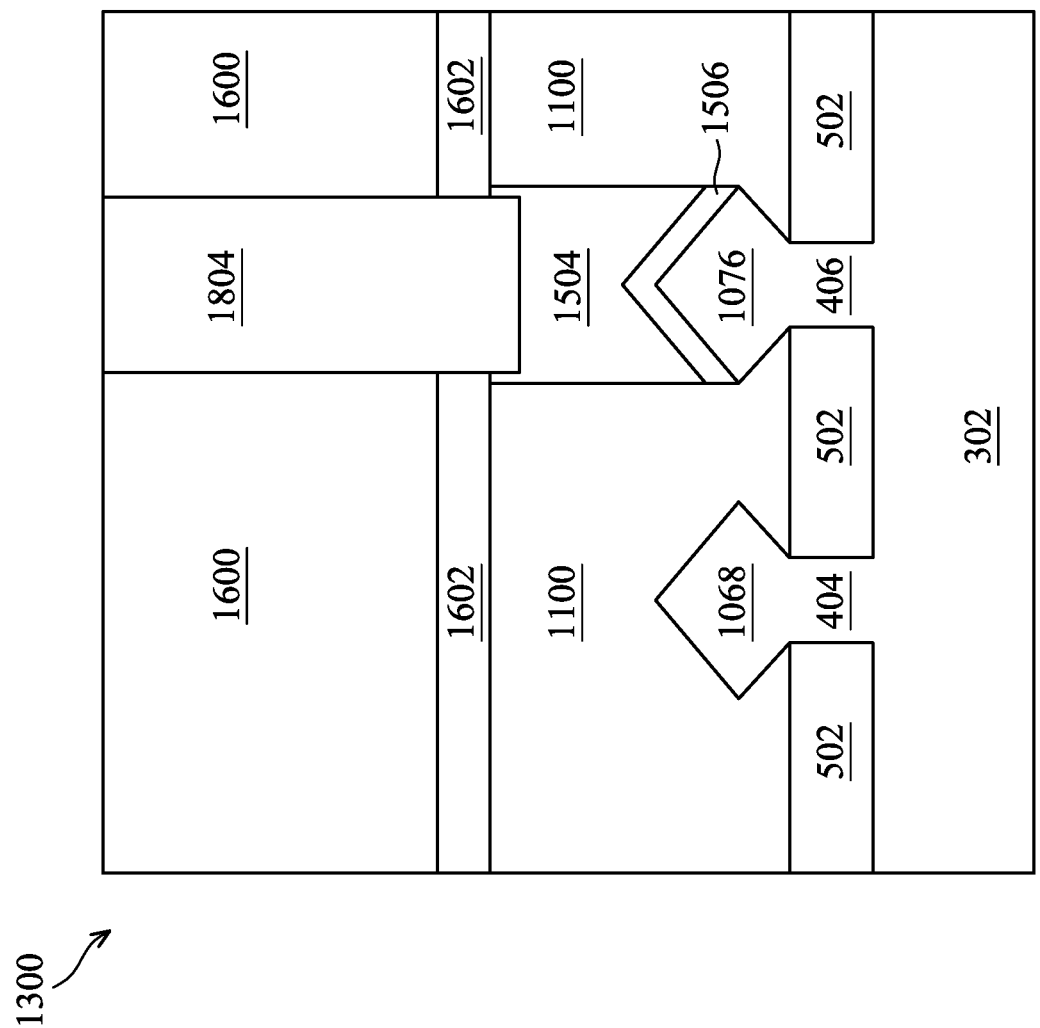
Figure 18D:
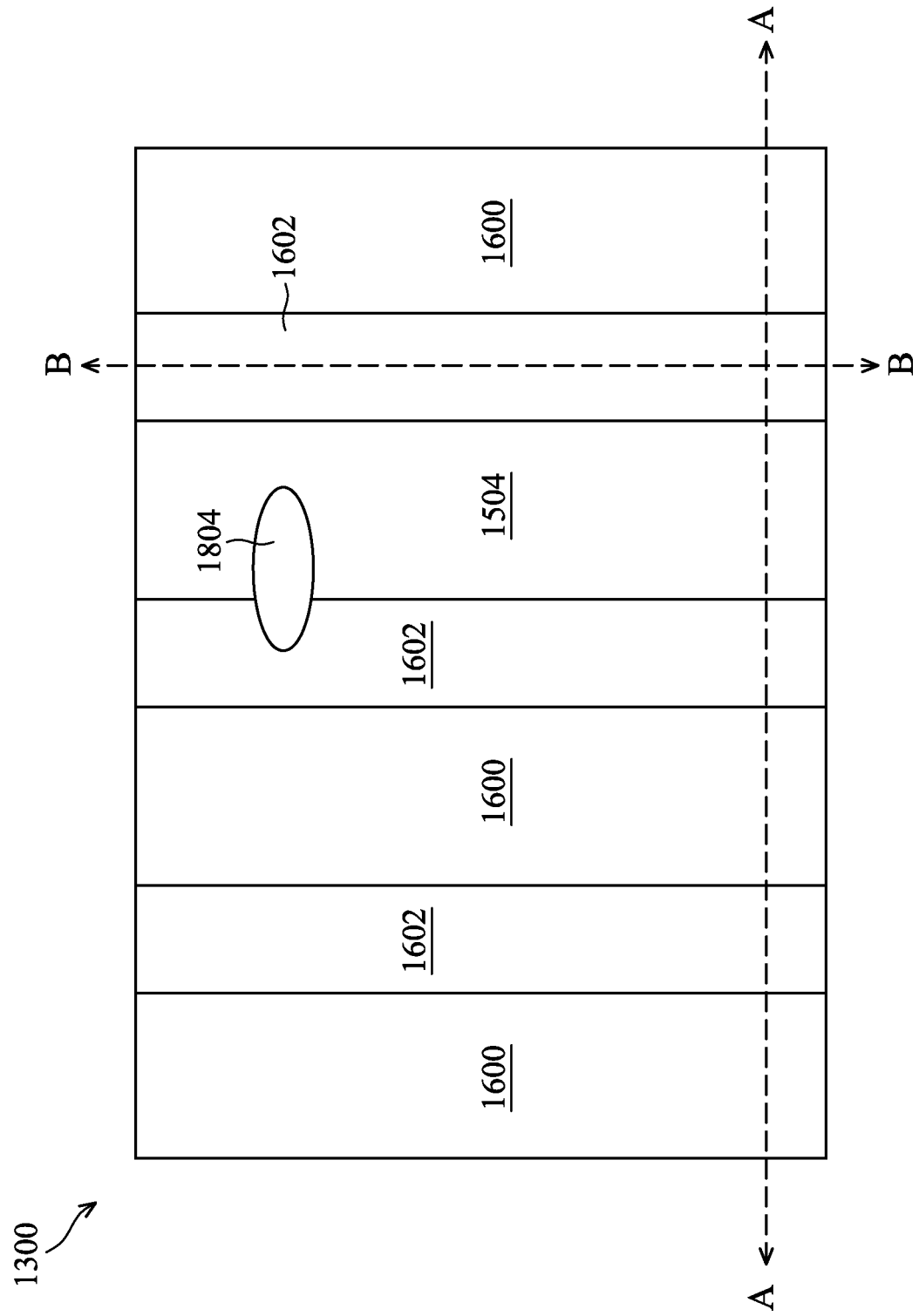
Figure 18E:
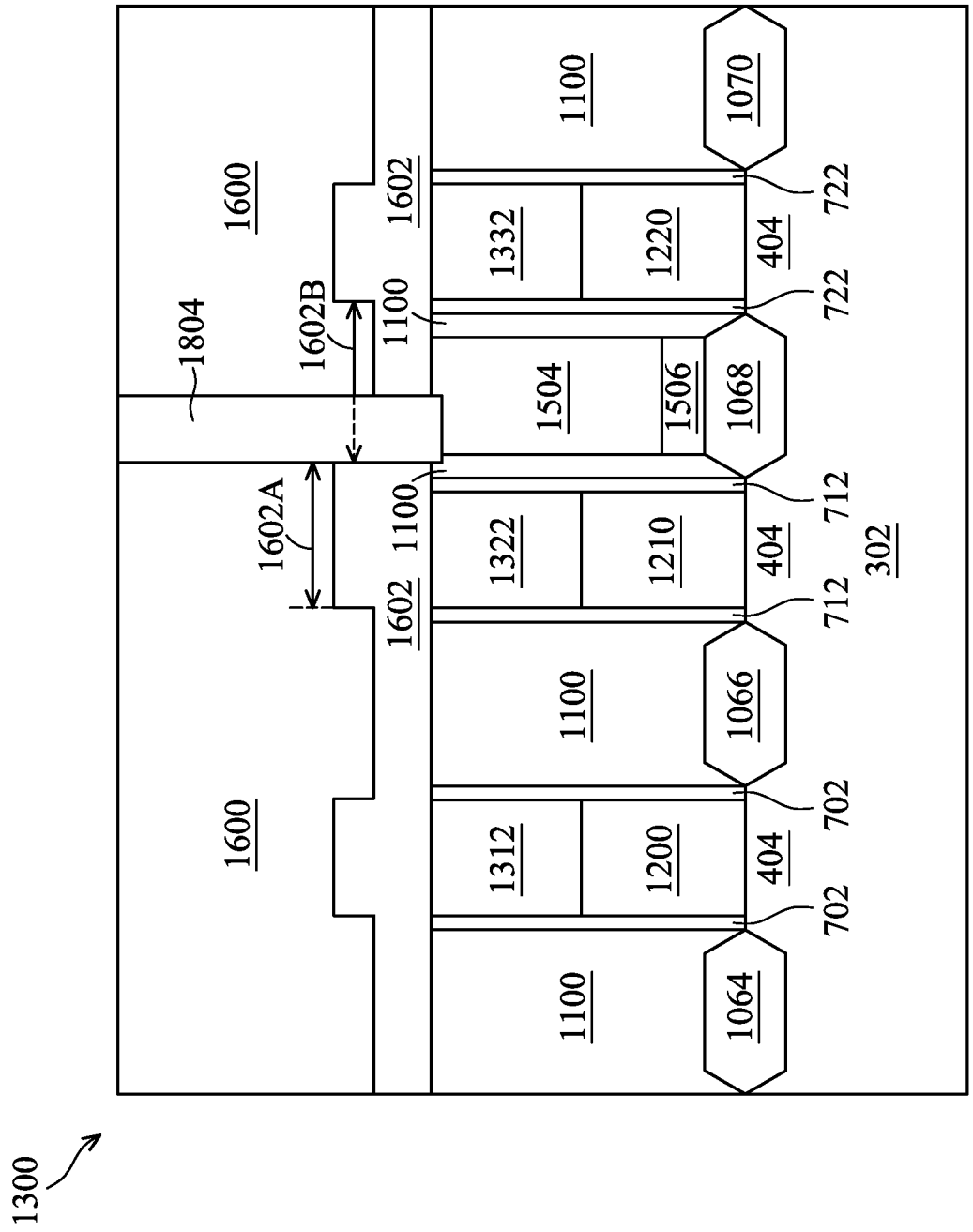

Corresponding to operation 244-246 in FIG. 2, FIG. 18A is a top view of a partially formed FinFET device 1300 that includes a second interconnect structure 1804 formed by filling in the recess 1702 (FIGS. 17A-C). FIGS. 18B and 18C illustrate corresponding cross-sectional views of a portion of the partially formed FinFET device 1300 in FIG. 18A cut along cross-section A-A and cross-section B-B, respectively. FIG. 18D is another embodiment of FIGS. 18A-C and also is a top view of a partially formed FinFET device 1300 that includes a second interconnect structure 1804 electrically coupled to the first interconnect structure 1504 that is not perfectly aligned with the first interconnect structure 1504. FIG. 18E illustrates a cross-sectional view of a portion of a partially formed FinFET device 1300 cut along cross-section AA in FIG. 18D.

The second interconnect structure 1804 may be formed by filling the recess 1702 with a metal material, followed by a CMP process to remove any insulation materials which corresponds to operation 246 in FIG. 2. In some embodiments, the second interconnect structure 1804 is the same shape as the recess 1702 (FIGS. 17A-C). The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the second interconnect structure 1804. In some embodiments, the second interconnect structure 1804 does not contain nitrogen.

The second interconnect structure 1804 is disposed on the top surface of the first interconnect structure 1504 and is electrically coupled with said surface, as shown in FIG. 18B. The first portion of the dielectric layer 1602A may extend along a lower portion of a sidewall of the second interconnect structure 1804. The second interconnect structure 1804 is disposed next to the first portion of the dielectric layer 1602A and opposite to the stair between the first portion 1602A and the second portion 1602B. The second interconnect structure 1804 does not extend along the direction B-B, as shown in FIG. 18A. In some embodiments, a bottom portion of the second interconnect structure 1804 is vertically spaced from the top surface of the gate structure 1210 with the first dielectric capping layer 1322 between the gate structure 1210 and the first portion of the dielectric layer, as shown in FIG. 18C. It is understood that a FinFET device may include multiple second interconnect structures, that a second interconnect structure can be electrically coupled to any first interconnect structure, or that a second interconnect structure may be vertically spaced from any gate structure. In various embodiments, the second interconnect structure 1804 may be part of a middle-end-of-line (MEOL) interconnection network, where such interconnect structures are sometimes referred to as "VDs." Corresponding to operation 248 from FIG. 2, one or more metal layers may then be formed over the FinFET device 1300 (not shown).

In some embodiments, the second interconnect structure 1804 has a contact width with the first interconnect structure 1504 along the first cross-section A-A of between about 9 and about 30 nanometers, inclusive (e.g., 9, 15, 20, 25, and 30 nanometers). In some embodiments, the second interconnect structure 1804 has a contact length with first interconnect structure 1504 along the second cross-section B-B of between about 10 and about 100 nanometers, inclusive (e.g., 10, 20, 30, 40, 50, 60, 70, 80, 90, and 100 nanometers). In some embodiments, the second interconnect structure 1804 is at an angle of between about 86 and 89 degrees to the ILD 1100 (i.e., 86, 97, 88, and 89 degrees).

In some embodiments, the second interconnect structure 1804 may not be perfectly aligned with the first interconnect structure 1504, as shown in FIG. 18D-E. In such embodiments, the first portion of the dielectric layer 1602A may contact and extend along a lower portion of a sidewall of the second interconnect structure 1804. The second interconnect structure 1804 may be partially disposed above the ILD 1100. The second interconnect structure 1804 is electrically coupled to the first interconnect structure 1504. The second interconnect structure 1804 does not extend along the direction B-B, as shown in FIG. 18D. It is understood that a FinFET device may include multiple second interconnect structures that are not perfectly aligned with first interconnect structures or may include a mixture of second interconnect structures aligned and not aligned with the first interconnect structure. FIG. 18C illustrates the corresponding cross-sectional view of the partially formed FinFET device in 18D, cut along cross-section B-B in FIG. 18D.

Figure 19:
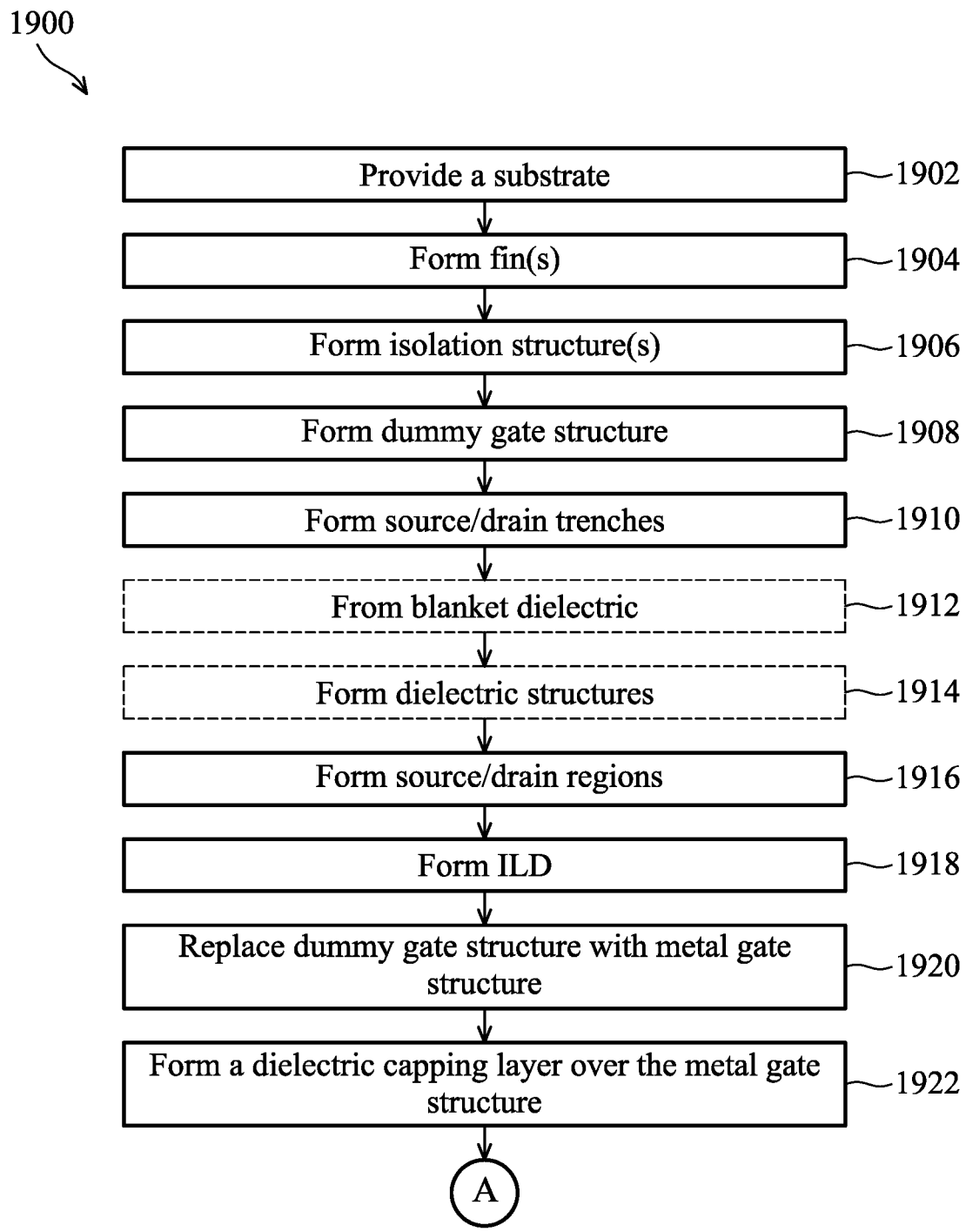
FIG. 19 illustrates a flow chart of another example method for making interconnect structures for a transistor device, in accordance with some embodiments.
Figure 19:
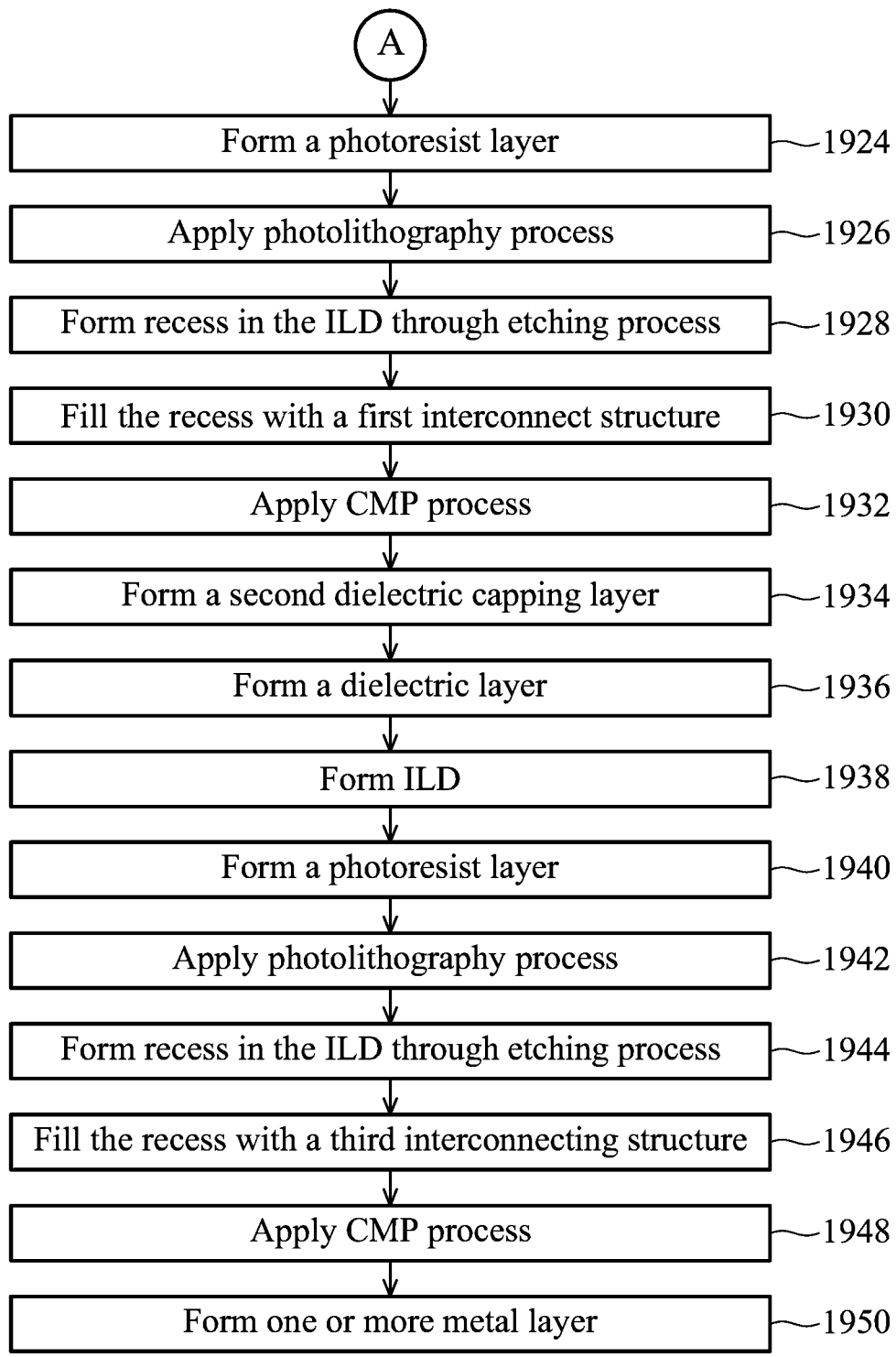

FIG. 19 illustrates a flowchart of another method 1900 to form interconnect structures for a transistor device, according to one or more embodiments of the present disclosure. For example, at least some of the operations of the method 1900 can be used to form a FinFET device (e.g., FinFET device 2000). It is noted that the method 1900 is merely an example, and is not intended to limit the present disclosure. Accordingly, it is understood that additional operations may be provided before, during, and after the method 1900 of FIG. 19, and that some other operations may only be briefly described herein.

In some embodiments, the method 1900 is substantially similar to the method 200 of FIG. 2 except that the method 1900 further includes operations to form a third interconnect structure and a second dielectric capping layer (sometimes referred to as a nitrogen-containing dielectric capping layer) and does not include operations to form a second interconnect structure. Thus, in the following discussions, operations of the method 1900 may be associated with the cross-sectional views of an example FinFET device at various fabrication stages, as shown in FIGS. 20A-C, 21A-C, and 22A-C, respectively, which are only directed to the differences between methods 200 and 1900.

In brief overview, the method 1900 starts with operation 1902 in which a semiconductor substrate is provided. The method 1900 continues to operation 1904 in which one or more fins are formed extending beyond a major surface of the semiconductor substrate. The method 1900 continues to operation 1906 in which one or more isolation structures are formed around a lower portion of each fin. The method 1900 continues to operation 1908 in which a dummy gate structure is formed over a central portion of each fin. The method 1900 continues to operation 1910 in which end portions of each fin are removed to form source/drain trenches. The method 1900 continues to operation 1912 in which a blanket dielectric is formed over the semiconductor substrate. In some embodiments, the operation 1912 is optional. The method 1900 continues to operation 1914 in which a dielectric structure is formed in each of the source/drain trenches. In some embodiments, the operation 1914 is optional. The method 1900 continues to operation 1916 in which source/drain regions are formed over the dielectric structures in the source/drain trenches, respectively. The method 1900 continues to operation 1918 in which an interlayer dielectric (ILD) is formed. The method 1900 continues to operation

1920 in which the dummy gate structure is replaced with a gate structure (sometimes referred to as a first metal structure). The method 1900 continues to operation 1922 in which a first dielectric capping layer (sometimes referred to as a nitrogen-containing capping layer) is formed over the gate structure.

The method 1900 continues to operation 1924 in which at least one photoresist layer is formed on a top surface of the transistor device. The method 1900 continues to operation 1926 in which a photolithography process and/or processes are applied to the photoresist layer(s). The method 1900 continues to operation 1928 in which a recess in the ILD is formed through an etching process. The method 1900 continues to operation 1930 in which the recess formed form operation 1928 is filled with a first interconnect structure (sometimes referred to as a second metal structure). The method 1900 continues to operation 1932 in which a chemical mechanical polish (CMP) process may remove any excess insulation material.

The method 1900 continues to operation 1934 in which a second dielectric capping layer (sometimes referred to as a nitrogen-containing dielectric capping layer) is formed. The method 1900 continues to operation 1936 in which a dielectric layer is grown on the existing transistor device. The method 1900 continues to operation 1938 in which a second ILD is formed. The method 1900 continues to operation 1940 in which at least one photoresist layer is formed on a top surface of the existing transistor device. The method 1900 continues to operation 1942 in which a photolithography process and/or processes is applied to the photoresist layer(s). The method 1900 continues to operation 1944 in which a recess in the second ILD and the first dielectric capping layer is formed through an etching process. The method 1900 continues to operation 1946 in which the recess from operation 1944 is filled with a third interconnecting structure electrically coupled to the gate structure. The method 1900 continues to operation 1948 in which a CMP process may remove any excess insulation material. The method 1900 continues to operation 1950 in which one or more metal layers are formed on the top surface of the existing transistor device.

Figure 20A:
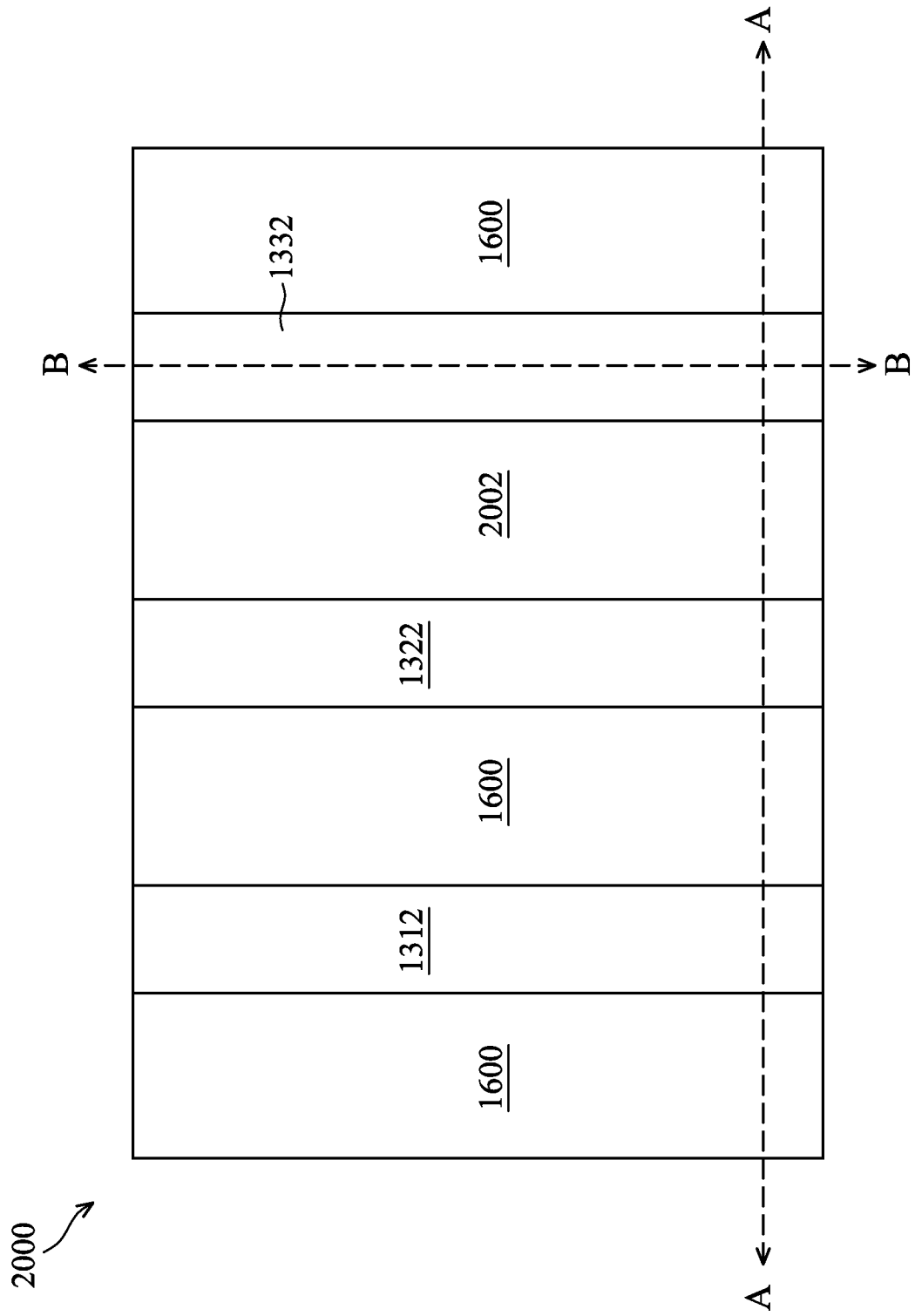
FIGS. 20A, 21A, 22A, and 22D illustrate corresponding top views of an example FinFET device (or a portion of the example FinFET device) during various fabrication stages, made by the method of FIG. 19, in accordance with some embodiments.
Figure 20B:
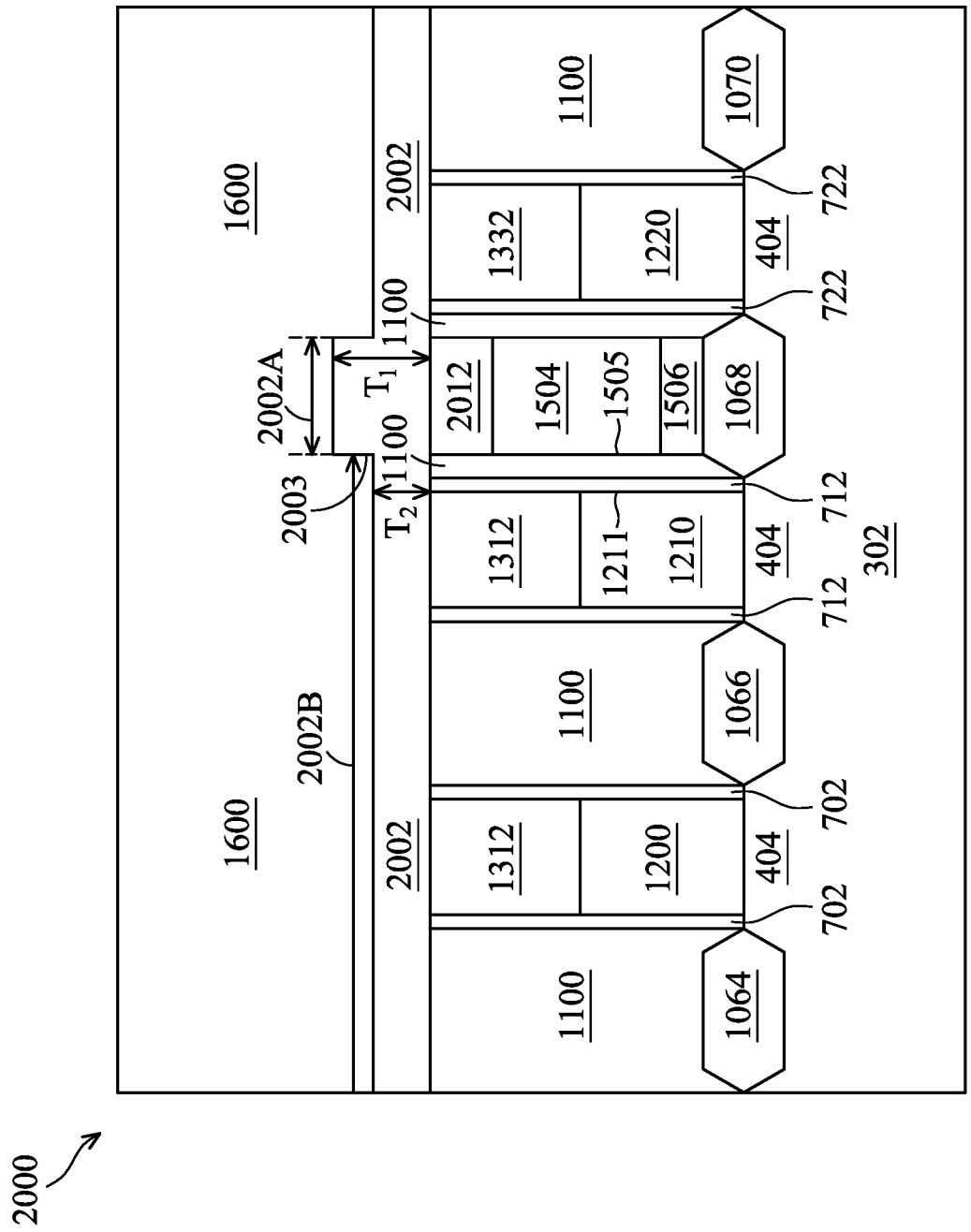
FIGS. 20B, 21B, 22B, and 22E illustrate cross-sectional views of the example FinFET device, cut along a first cross-section (e.g., along line A-A), that correspond to FIGS. 20A, 21A, 22A, and 22D, respectively, in accordance with some embodiments.
Figure 20C:
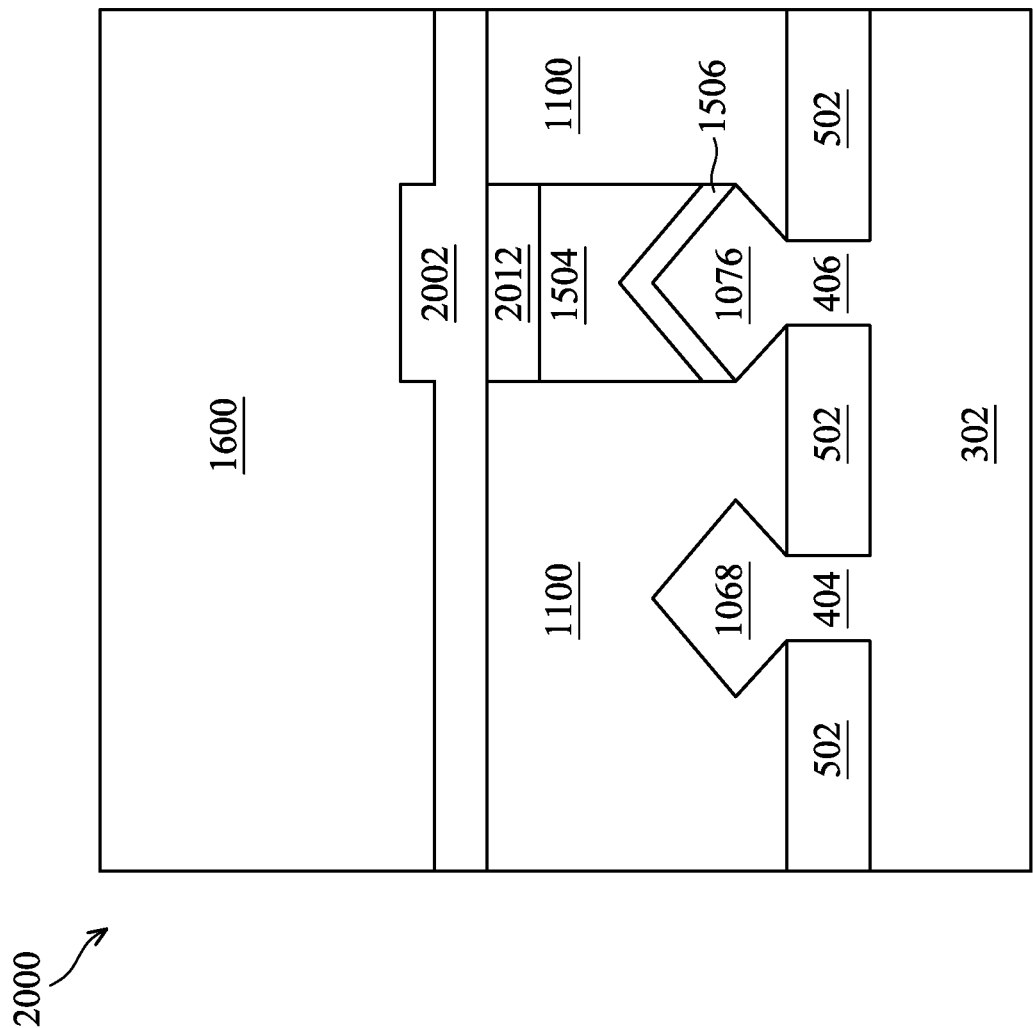
FIGS. 20C, 21C, and 22C illustrate cross-sectional views of the example FinFET device, cut along a second cross-section (e.g., along line B-B), that correspond to FIGS. 20A-22A, respectively, in accordance with some embodiments during various fabrication stages.

It is noted the operations 1902-1932 of FIG. 19 are substantially similar to the operations 202-232 of FIG. 2. Thus, the following discussions will be directed to the operations 1934-1950. FIGS. 20A, 21A, 22A, and 22D each illustrate, in a top view, the FinFET device 2000 at various fabrication stages of the method 1900 of FIG. 19. FIGS. 20B, 21B, 22B, and 22D illustrate cross-sectional views of the FinFET device 2000 cut along cross-section A-A (as indicated in FIG. 20A); and FIGS. 20C, 21C, and 22C illustrate cross-sectional views of the FinFET device 2000 cut along cross-section B-B (as illustrated in FIG. 20A). The FinFET device 2000 includes the FinFET device 300 shown in FIGS. 3A-12B and is substantially similar to the FinFET device 1300 shown in FIGS. 13A-18E, but with a third interconnect structure that extends from the top surface of the gate structure to the top surface of the second ILD, a lack of the second interconnect structure, a second dielectric capping layer (sometimes referred to as a nitrogen-containing dielectric capping layer), and the first portion of the dielectric layer disposed over first interconnect structure instead of over the gate structure.

The FinFET device 2000 is illustrated at a greater scale, and thus, it should be understood that some of the features/structures shown above with respect to the FinFET device 300 may not be shown again in the FinFET device 300 such as for example, the CESL 1102, the gate dielectric layer 1202, and the gate electrode 1204. Although FIGS. 20A-22E illustrate the FinFET device 2000, it is understood the FinFET device 2000 may include a number of other devices such as inductors, fuses, capacitors, coils, etc., which are not shown in FIGS. 20A-22E, for the purposes of clarity of illustration.

Corresponding to operations 1934-1938 of FIG. 19, FIG. 20A is a top view of the FinFET device 2000 in which a second dielectric capping layer (sometimes referred to as a nitrogen-containing dielectric capping layer) 2012 is formed before a dielectric layer 2002 is formed. The second ILD 1600 is not shown above the second dielectric capping layer 2012 in FIG. 20A for purposes of clarity. Similarly, the gate spacers 702-722 are not shown in FIG. 20A for the purposes of clarity. FIGS. 20B and 20C illustrate corresponding cross-sectional views of the FinFET device 2000 in FIG. 20A cut along cross-section A-A and cross-section B-B, respectively, with the dielectric layer 2002 formed with a first portion of the dielectric layer 2002A disposed above the first interconnect structure 1504 that is overlaid with the second dielectric capping layer 2012.

The second dielectric capping layer 2012 is formed according to operation 1934 of FIG. 19 and selectively disposed on the top surface of the first interconnect structure 1504. In some embodiments, second dielectric capping layer 2012 is formed between the first interconnect structure 1504 and the first portion of the dielectric layer 2002A, as shown in FIG. 20B. The second dielectric capping layer 2012 contains nitrogen. In some embodiments, the second dielectric capping layer 2012 can include SN, SiOCN, SiOC, SiON, or the like. For example, thermal oxidation, chemical vapor deposition (CVD), or the like, may be used to form the second dielectric capping layer 2012. After the second dielectric capping layer 2012 is formed, a planarization process such as CMP process can level a top surface of the second dielectric capping layer 2012 with a top surface of the ILD 1100.

Corresponding to operation 1936, the dielectric layer 2002 is then formed on the top surface of the ILD 1100, the first dielectric capping layers 1312-1332, and the second dielectric capping layer 2012. It should be noted that in one of the embodiments as for the method 1900 of FIG. 19, the first dielectric capping layers 1312-1332 may not contain nitrogen. For example, the first dielectric capping layers 1312-1332 may include silicon oxide. The dielectric layer 2002 may comprise the first portion of the dielectric layer 2002A with a first thickness $T_1$ and a second portion 2002B with a second thickness $T_2$ where the first portion of the dielectric layer 2002A is disposed on the second dielectric capping layer 2012 over the first interconnect structure 1504, as shown in FIG. 20B. The first thickness $T_1$ may be greater than the second thickness $T_2$, as shown in FIG. 20B. The ratio of the first thickness $T_1$ to the second thickness $T_2$ may be greater than 2. In some embodiments, the first thickness $T_1$ may be between about 1 to about 10 nanometers, inclusive (i.e., 1, 2, 3, 4, 5, 6, 7, 8, 9, and 10 nanometers). In some embodiments, the first portion 2002A may include a width along the first cross-section A-A that is between about 10 and about 30 nanometers, inclusive (i.e., 10, 15, 20, 25, and 30 nanometers). In some embodiments, the first portion 2002A may include a length along the second cross-section B-B that is between about 10 and about 100 nanometers, inclusive (i.e., 10, 20, 30, 40, 50, 60, 70, 80, 90, and 100 nanometers). The first portion of the dielectric layer 2002A and the second portion 2002B may form a stair 2003. In some embodiments, the stair 2003 is about 60 to about 90 degrees, inclusive (e.g., 60, 65, 70, 75, 80, 85, and 90 degrees) to the top surface of the ILD 1100. In some embodiments, the stair 2003 is disposed along either a sidewall of the gate structure 1211 or a sidewall of the first interconnect structure 1505. In such embodiments, the sidewall of the gate structure 1211 is located opposite the gate structure 1210 from the first interconnect structure 1504, as shown in FIG. 20B. In such embodiments, the sidewall of the first interconnect structure 1505 is located opposite the first interconnect structure 1504 from the gate structure 1210, as shown in FIG. 20B. The dielectric layer 2002 may be an integrally formed one-piece structure. In some embodiments, the dielectric layer 2002 may be formed in as multiple pieces coupled together.

The dielectric layer 2002 contains nitrogen. In some embodiments, the dielectric layer 2002 is boron nitride. Boron nitride is an excellent insulator, is a low-k dielectric material (e.g., with a k value less than about 7.0 or even less than about 4.0), and has a selective deposition capability. Boron nitride selectively deposits on silicon nitride (SiN) or silicon surfaces (which form a non-volatile by-product) and does not deposit on oxide surfaces (which form a volatile by-product). Any suitable deposition method, such as thermal oxidation, chemical vapor deposition (CVD), or the like, may be used to form the dielectric layer. In some embodiments, the boron nitride selectively deposits on the second dielectric capping layer 2012 which contains nitrogen. In some embodiments, the first portion of the dielectric layer 2002A selectively deposits on nitrogen containing materials such as the second dielectric capping layer 2012, and the second portion 2002B selectively deposits on materials that do not contain nitrogen such as the ILD 1100 and the first dielectric capping layers 1312-1332 in one of various embodiments. In some other embodiments, the dielectric layer 2002 may include boron carbide, boron oxide ($B_2O_3$), $C_xF_y$ polymer where x and y are greater than 0, or the like. In some embodiments, the dielectric layer 2002A may be deposited with an inhibitor approach.

Corresponding to operation 1938, the second ILD 1600 is formed over the dielectric layer 2012 as shown in FIGS. 20A-C. In some embodiments, the second ILD 1600 is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. After the second ILD 1600 is formed, a planarization process, such as a CMP process, may be performed to achieve a level upper surface for the second ILD 1600. In some embodiments, the second ILD 1600 may have a thickness in between about 10 and about 50 nanometers, inclusive (e.g., 10, 20, 30, 40, and 50 nanometers).

Figure 21A:
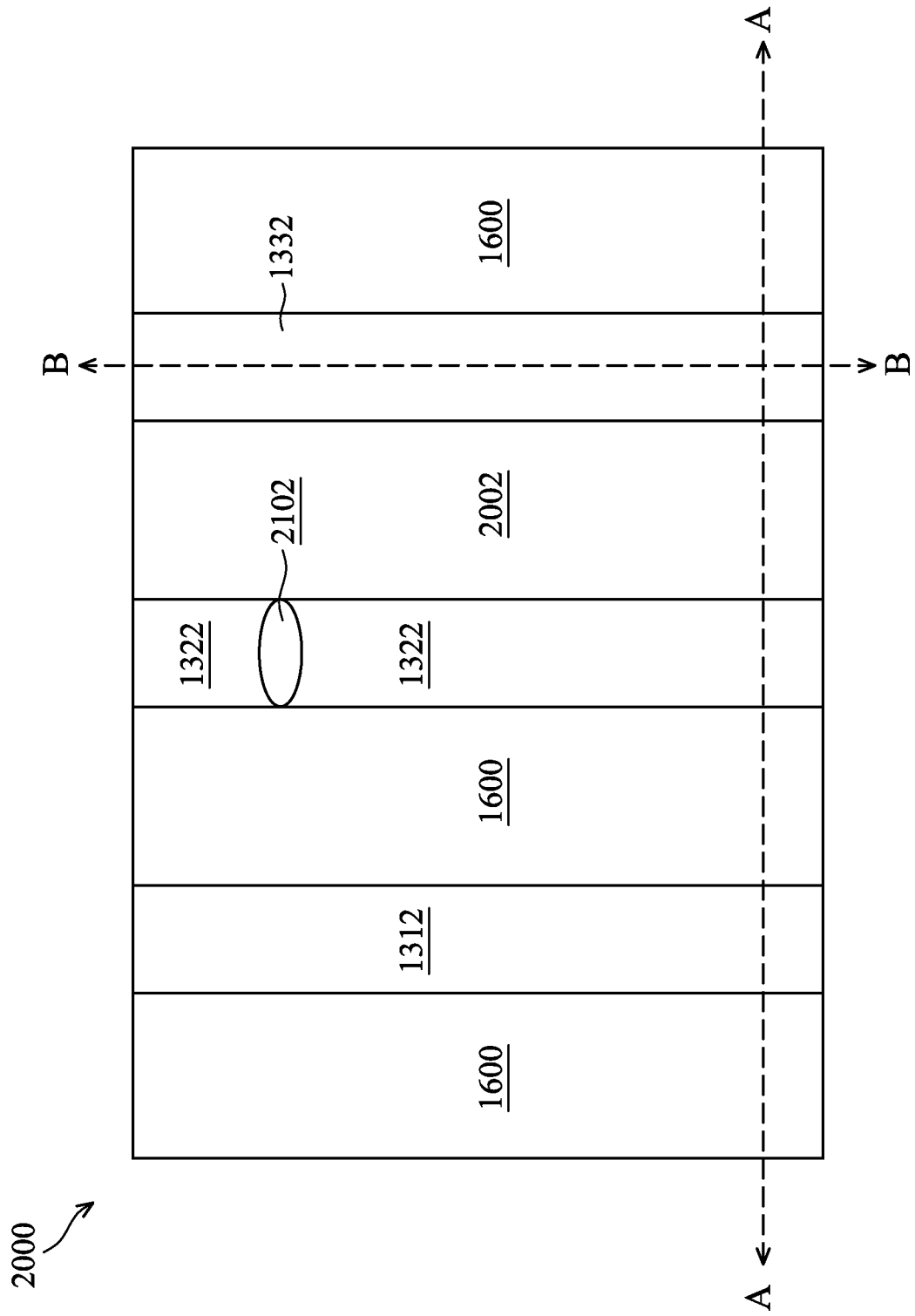
Figure 21B:
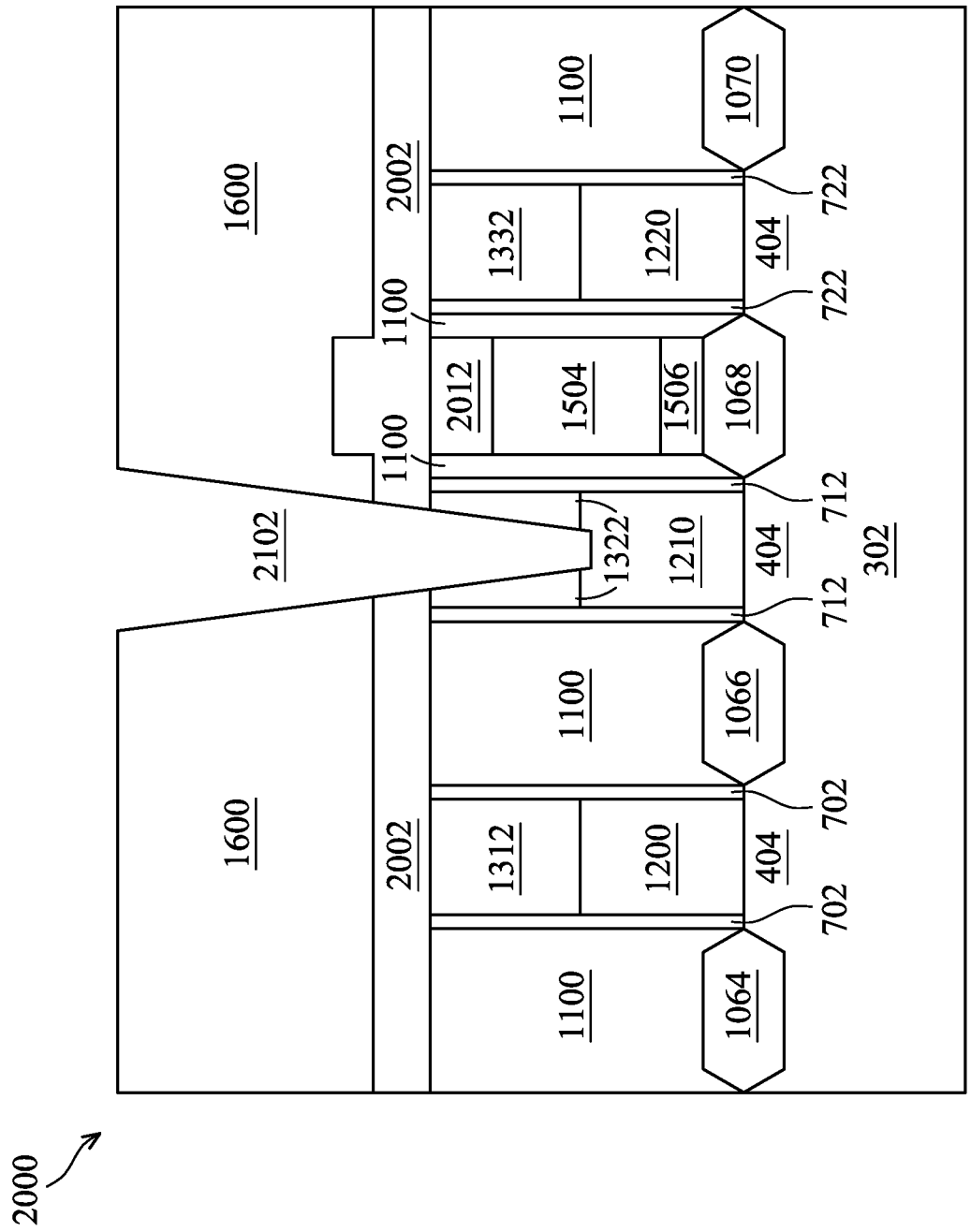
Figure 21C:
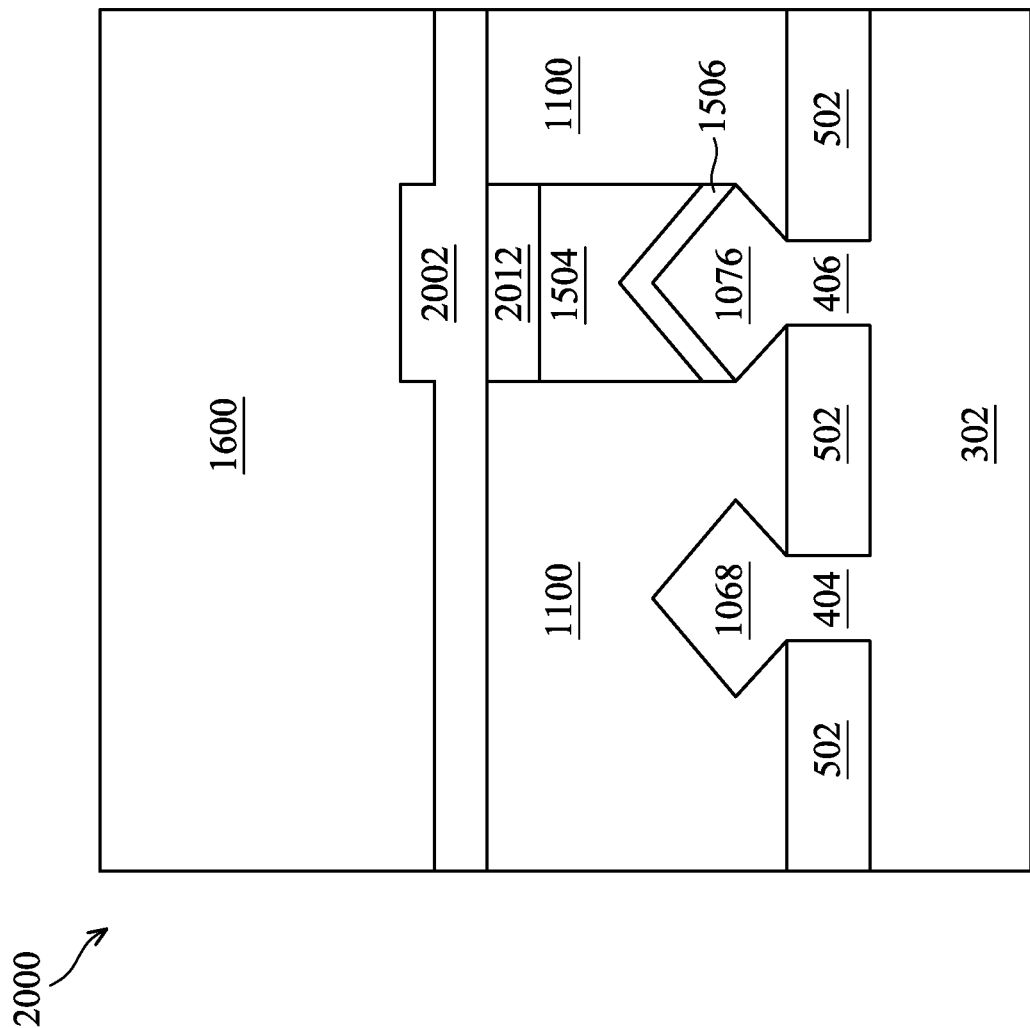

Corresponding to operations 1940-1944 of FIG. 19, FIG. 21A is a top view of the FinFET device 2000 in which a recess 2102 is formed to expose the top surface of the gate structure 1210. The gate spacers 702-722 are not shown in FIG. 21A for the purposes of clarity. FIGS. 21B and 21C illustrate corresponding cross-sectional views of the FinFET device 2000 in FIG. 21A cut along cross-section A-A and cross-section B-B, respectively.

At least one photoresist layer corresponding to operation 1940 (also referred to as a resist layer, photosensitive layer, patterning layer, light sensitive layer, etc.) that is responsive to an exposure process for creating patterns is formed on a top surface of the transistor device. The photoresist layer may be a positive-type or negative-type resist material and may form a multi-layer structure. One example resist material is a chemical amplifier (CA) resist. Then, a photolithography process corresponding to operation 1942 may be applied to the photoresist layer(s). The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the photoresist layer while protecting one or more other portions of the photoresist layer. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Then, the recess 2102 may be formed in the second ILD 1600 and the first dielectric capping layer 1322 through an etching process corresponding to operation 1944, including various dry etching, wet etching, and/or other etching methods (e.g., reactive ion etching). In some embodiments, the recess 2102 may formed to expose the top surface of the gate structure 1210. In some embodiments, the recess 2102 may be formed to form a recess in the gate structure 1210, as shown in FIG. 21B. The recess 2102 may be a trapezoidal shape as shown in FIG. 21B, but the recess 2102 is not limited to a trapezoidal shape. The face of the recess 2102 may be formed in the shape of a triangle, trapezoid, circle, rectangle, or other combination of shapes thereof. In some embodiments, the width of the recess 2102 along cross section A-A may be between about 5 and about 35 nanometers, inclusive (e.g. 5, 10, 15, 20, 25, 30, and 35 nanometers). In such embodiments, the length of the recess 2102 along cross-section B-B may be between about 5 and about 105 nanometers, inclusive (e.g. 5, 15, 25, 35, 45, 55, 65, 75, 85, 95, and 105 nanometers). In some embodiments, the angle of the sidewalls of the recess 2102 may be between about 85 and about 90 degrees, inclusive (e.g. 85, 86, 87, 88, 89, and 90 degrees). The top surface of the gate structure 1210 is shown to be exposed in FIG. 21B, but it is understood that the recess may be formed to expose the top surface of any gate structure. In some embodiments, the recess 2102 may not be perfectly aligned with the gate structure 1210 (not shown). The recess 2102 does not extend the length of cross-section B-B, as shown in FIG. 21A. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$), chlorine-containing gas (e.g., $Cl_2$, and/or $BCl_3$), bromine-containing gas (e.g., HBr), other suitable gases and/or plasmas, or combinations thereof. After the etching process, the remaining photoresist layer(s) are removed by any suitable process, including a photoresist stripping process. It is understood that multiple photoresist layers may be simultaneously or independently removed.

Figure 22A:
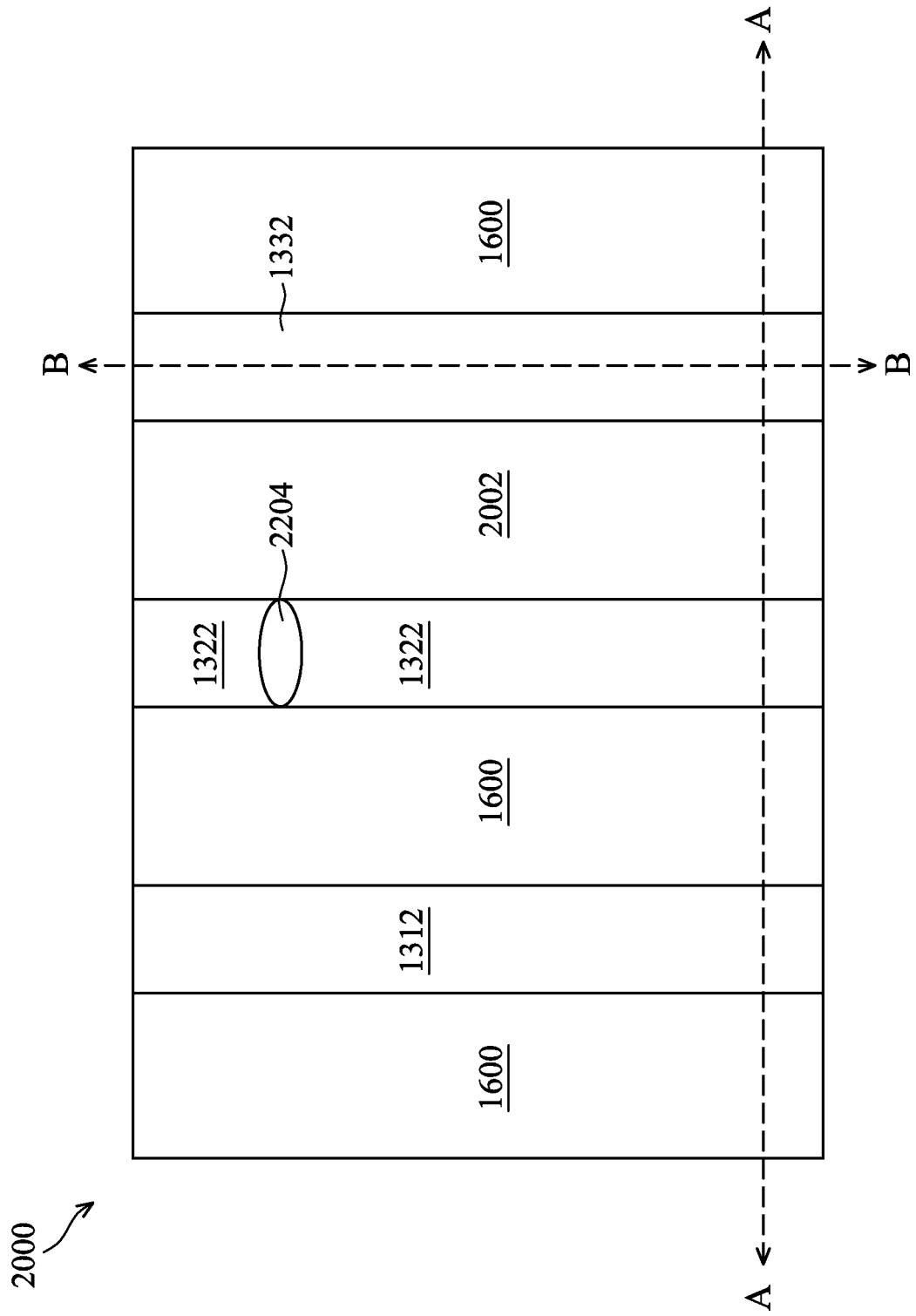
Figure 22B:
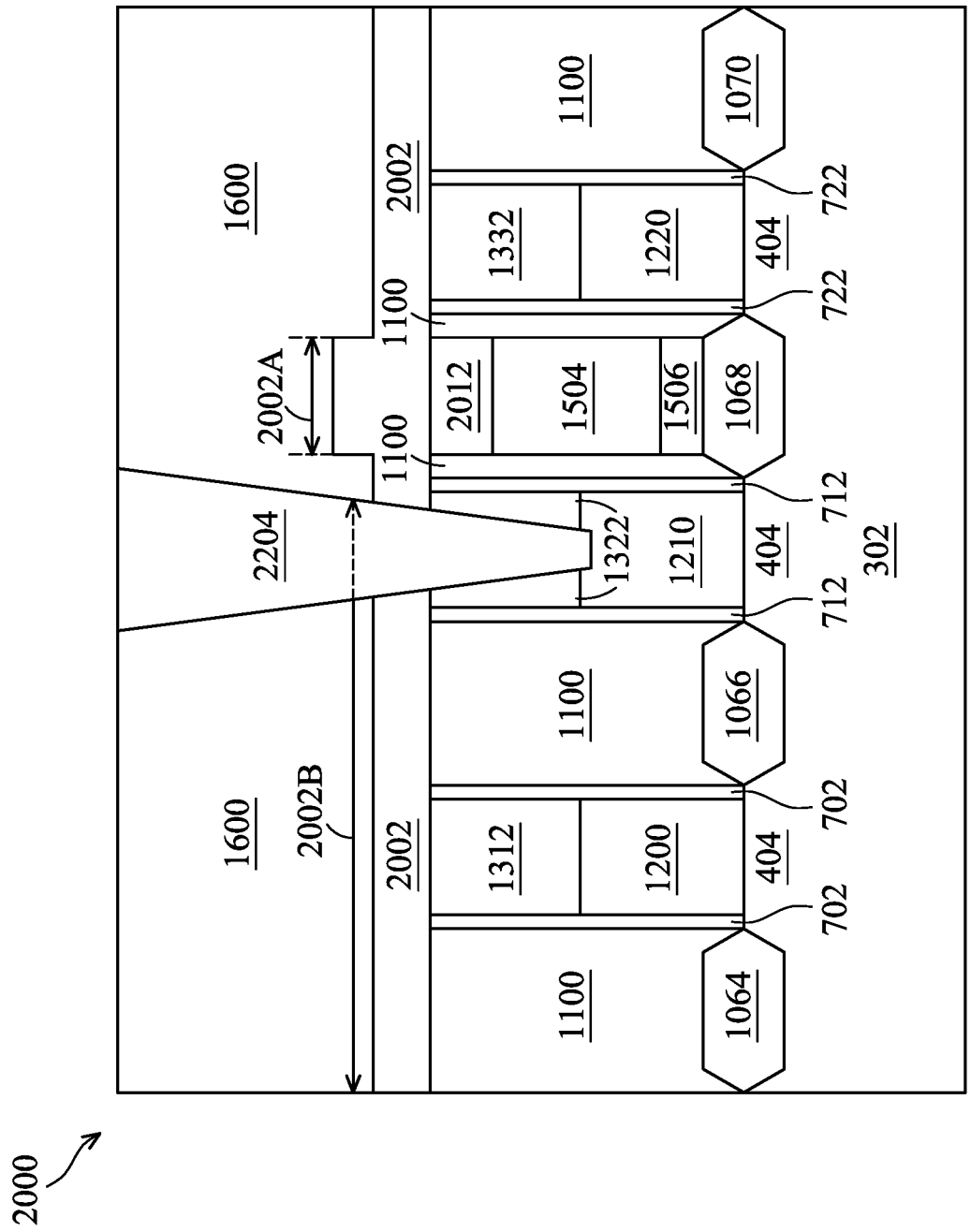
Figure 22C:
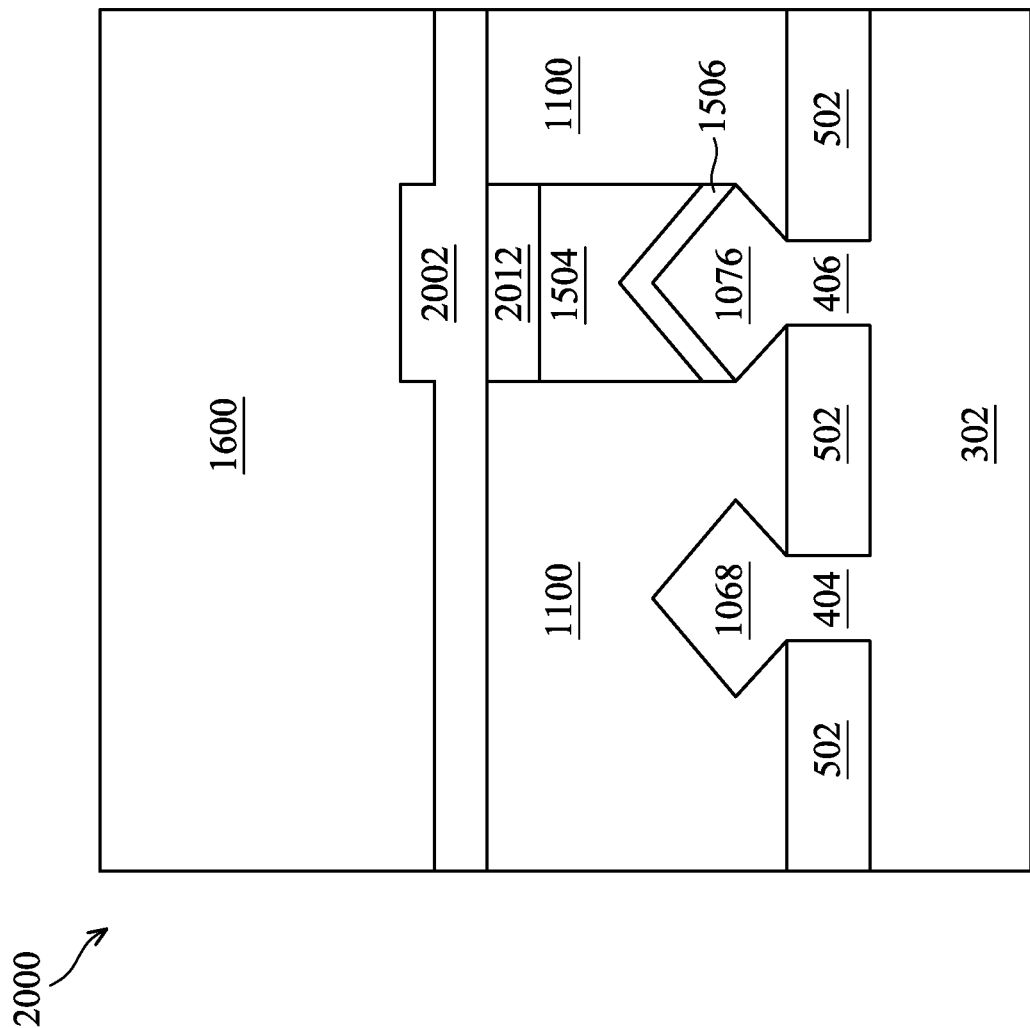
Figure 22D:
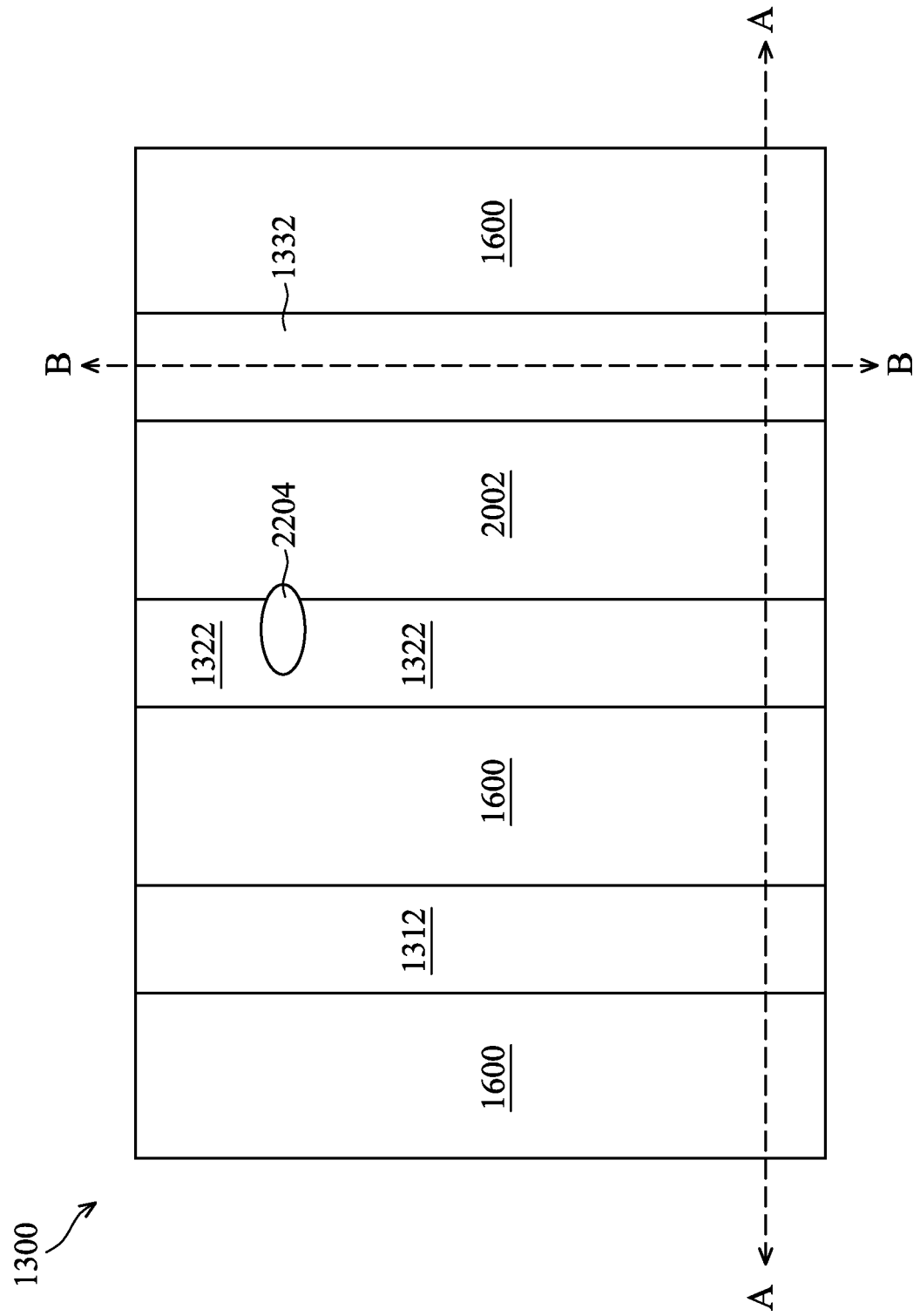
Figure 22E:
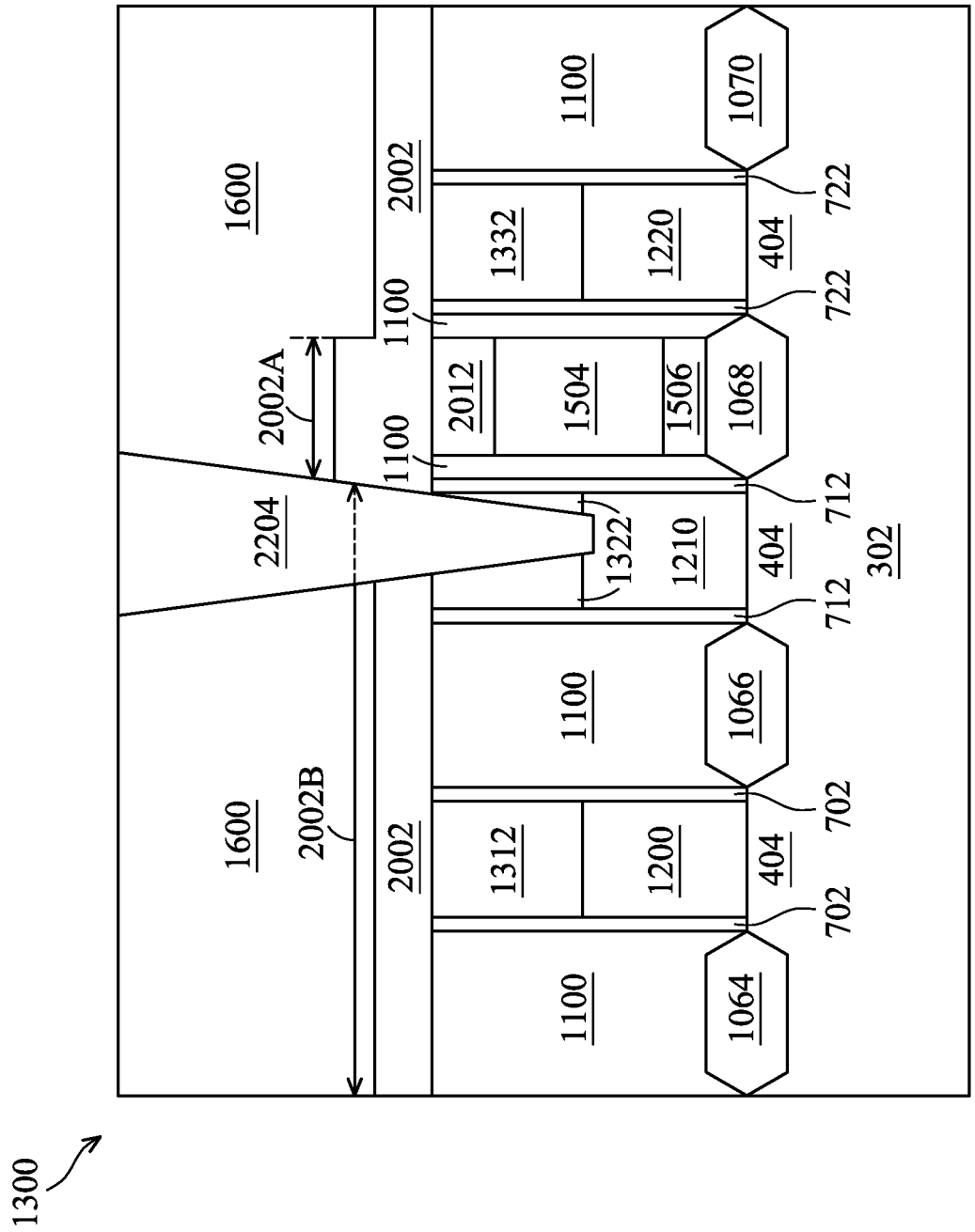

Corresponding to operations 1946 of FIG. 19, FIG. 22A is a top view of the FinFET device 2000 in which a third interconnect structure 2204 is formed to fill the recess 2102 and is electrically coupled to the gate structure 1210. The gate spacers 702-722 are not shown in FIG. 22A for the purposes of clarity. FIGS. 22B and 22C illustrate corresponding cross-sectional views of the FinFET device 2000 in FIG. 22A cut along cross section A-A and cross section B-B, respectively. FIG. 22D is another embodiment of FIGS. 22A-C and also is a top view of a partially formed FinFET device 1300 that includes a third interconnect structure 2204 electrically coupled to the gate structure 1210 that is not perfectly aligned with the gate structure 1210. FIG. 22E illustrates a cross-sectional view of a portion of a partially formed FinFET device 1300 cut along cross-section AA in FIG. 18D.

The third interconnect structure 2204 may be formed by filling the recess 2102 with a metal material, followed by a CMP process to remove any insulation materials which corresponds to operation 1948 in FIG. 19. In some embodiments, the third interconnect structure 2204 will fill the entirety of the recess 2102. The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the third interconnect structure 2204. In some embodiments, the third interconnect structure 2204 does not contain nitrogen. The third interconnect structure 2204 is disposed on the top surface of the gate structure 1210 and is electrically coupled with said surface, as shown in FIG. 22B. The first portion of the dielectric layer 2002A may extend along a lower portion of a sidewall of the third interconnect structure 2204. The third interconnect structure 2204 is disposed next to the first portion of the dielectric layer 2002A and opposite to the stair between the first portion of the dielectric layer 2002A and the second portion 2002B. The third interconnect structure 2204 does not extend along the direction B-B as shown in FIG. 22A. It is understood that a FinFET device may include multiple third interconnect structures or that a third interconnect structure can be electrically coupled to any gate structure. In various embodiments, the third interconnect structure 2204 may be part of a middle-end-of-line (MEOL) interconnection network, where such interconnect structures are sometimes referred to as "VGs." Corresponding to operation 1950 from FIG. 19, one or more metal layers may then be formed over the FinFET device 2000 (not shown).

In some embodiments, the third interconnect structure 2204 has a contact width with the gate structure 1210 along the first cross-section A-A of between about 8 and about 30 nanometers, inclusive (e.g., 8, 15, 20, 25, and 30 nanometers). In some embodiments, the third interconnect structure 2204 has a contact length with gate structure 1210 along the second cross-section B-B of between about 8 and about 100 nanometers, inclusive (e.g., 8, 20, 30, 40, 50, 60, 70, 80, 90, and 100 nanometers). In some embodiments, the third interconnect structure 2204 is at an angle of between about 86 and 89 degrees to the top surface of the gate structure 1210 (i.e., 86, 97, 88, and 89 degrees).

In some embodiments, the third interconnect structure 2204 may not be perfectly aligned with the gate structure 1210, as shown in FIG. 22D-E. In such embodiments, the first portion of the dielectric layer 2002A may contact and extend along a lower portion of a sidewall of the third interconnect structure 2204. The third interconnect structure 2204 is electrically coupled to the gate structure 1210. The third interconnect structure 2204 does not extend along the direction B-B, as shown in FIG. 22D. It is understood that a FinFET may include multiple third interconnect structures that are not perfectly aligned with gate structures or may include a mixture of third interconnect structures aligned and not aligned with gate structures. FIG. 22C illustrates the corresponding cross-sectional view of the partially formed FinFET in FIG. 22D, cut along cross-section B-B in FIG. 22D.

In one aspect of the present disclosure, a semiconductor device is disclosed. The semiconductor device includes a semiconductor channel. The semiconductor device includes an epitaxial structure coupled to the semiconductor channel and a gate structure electrically coupled to the semiconductor channel. The semiconductor device includes a first interconnect structure electrically coupled to the epitaxial structure. The semiconductor device includes a dielectric layer containing nitrogen. The dielectric layer comprises a first portion protruding from a nitrogen-containing dielectric capping layer that overlays either the gate structure or the first interconnect structure.

In another aspect of the present disclosure, a semiconductor device is disclosed. The semiconductor device includes a semiconductor fin extending along a first lateral direction. The semiconductor device includes a gate structure extending along a second lateral direction and straddling the semiconductor fin, the second lateral direction perpendicular to the first lateral direction. The semiconductor device includes an epitaxial structure disposed in the semiconductor fin and next to the gate structure. The semiconductor device includes a first interconnect structure extending along the second lateral direction and disposed above the epitaxial structure. The semiconductor device includes a dielectric layer comprising a first portion and a second portion that form a stair.

In yet another aspect of the present disclosure, a method of fabricating a semiconductor is device is disclosed. The method includes forming a first metal structure overlaid by a dielectric capping layer that contains nitrogen. The method includes forming a second metal structure next to the first metal structure. The method includes growing a dielectric layer comprising a thicker portion that overlays the nitrogen-containing dielectric capping layer and a thinner portion that overlays a surface that contains no nitrogen. The method includes forming an interconnect structure electrically coupled to second metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

As used herein, the terms "about" and "approximately" generally mean plus or minus 10% of the stated value. For example, about 0.5 would include 0.45 and 0.55, about 10 would include 9 to 11, about 1000 would include 900 to 1100. The terms "about" and "approximately" may not be limited to plus or minus 10% of the stated value and may generally mean values known by those with ordinary skill in the art.

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

What is claimed is:

1. A semiconductor device, comprising:
   a semiconductor channel;
   an epitaxial structure coupled to the semiconductor channel;
   a gate structure electrically coupled to the semiconductor channel;
   a first interconnect structure electrically coupled to the epitaxial structure; and
   a dielectric layer containing nitrogen;
   wherein the dielectric layer comprises a first portion protruding from a nitrogen-containing dielectric capping layer that overlays the gate structure, and a second portion, wherein the first portion and the second portion have a first thickness and a second thickness, respectively, and wherein the first thickness is greater than the second thickness.

2. The semiconductor device of claim 1, wherein the dielectric layer is an integrally formed one-piece structure.

3. The semiconductor device of claim 1, wherein the first portion is disposed above the gate structure, the semiconductor device further comprises a second interconnect structure electrically coupled to the first interconnect structure, wherein the first portion of the dielectric layer extends along a lower portion of a sidewall of the second interconnect structure.

4. The semiconductor device of claim 3, wherein a bottom surface of the second interconnect structure is vertically spaced from a top surface of the gate structure, with the nitrogen-containing dielectric capping layer sandwiched between the gate structure and the first portion of the dielectric layer.

5. The semiconductor device of claim 1, wherein a ratio of the first thickness to the second thickness is greater than 2.

6. The semiconductor device of claim 1, wherein the dielectric layer is made of boron nitride.

7. A semiconductor device, comprising:
   a semiconductor channel extending along a first lateral direction;
   an epitaxial structure coupled to an end of the semiconductor channel along the first lateral direction;
   a gate structure extending along a second lateral direction and electrically coupled to the semiconductor channel, the second lateral direction being perpendicular to the first lateral direction;
   a first interconnect structure extending along the second lateral direction and electrically coupled to the epitaxial structure; and
   a dielectric layer comprising a first portion protruding from a dielectric capping layer that overlays the gate structure and a second portion that is disposed above the first interconnect structure;
   wherein the first portion has a first thickness and the second portion has a second thickness, and the first and second thicknesses are different from each other.

8. The semiconductor device of claim 7, wherein the dielectric layer includes nitrogen, and the dielectric capping layer includes nitrogen.

9. The semiconductor device of claim 7, wherein the dielectric layer is made of boron nitride.

10. The semiconductor device of claim 7, wherein a ratio of the first thickness to the second thickness is greater than 2.

11. The semiconductor device of claim 7, wherein the first thickness is greater than the second thickness.

12. The semiconductor device of claim 7, further comprising a second interconnect structure electrically coupled to the first interconnect structure.

13. The semiconductor device of claim 12, wherein the first portion of the dielectric layer extends along a lower portion of a sidewall of the second interconnect structure.

14. The semiconductor device of claim 12, wherein the second interconnect structure extends through the first portion of the dielectric layer.

15. A semiconductor device, comprising:
   a semiconductor channel extending along a first lateral direction;
   an epitaxial structure coupled to an end of the semiconductor channel along the first lateral direction;
   a gate structure extending along a second lateral direction and electrically coupled to the semiconductor channel, the second lateral direction being perpendicular to the first lateral direction;
   a first interconnect structure extending along the second lateral direction and electrically coupled to the epitaxial structure; and
   a dielectric layer including nitrogen, wherein the dielectric layer comprises a first portion protruding from a nitrogen-containing dielectric capping layer that overlays the gate structure and a second portion that is disposed above the first interconnect structure;
   wherein the first portion has a first thickness and the second portion has a second thickness, and the first and second thicknesses are different from each other.

16. The semiconductor device of claim 15, wherein the dielectric layer is made of boron nitride.

17. The semiconductor device of claim 15, wherein a ratio of the first thickness to the second thickness is greater than 2.

18. The semiconductor device of claim 15, further comprising a second interconnect structure electrically coupled to the first interconnect structure.

19. The semiconductor device of claim 15, wherein the second interconnect structure extends through the first portion of the dielectric layer.

20. The semiconductor device of claim 15, wherein the dielectric layer is an integrally formed one-piece structure.

* * * * *